United States Patent
Yamazaki

(10) Patent No.: US 9,362,415 B2
(45) Date of Patent: *Jun. 7, 2016

(54) SEMICONDUCTOR DEVICE COMPRISING A TRANSISTOR COMPRISING AN OXIDE SEMICONDUCTOR LAYER

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 4 days.

This patent is subject to a terminal disclaimer.

(21) Appl. No.: 14/575,011

(22) Filed: Dec. 18, 2014

(65) Prior Publication Data

US 2015/0137120 A1 May 21, 2015

Related U.S. Application Data

(63) Continuation of application No. 14/074,005, filed on Nov. 7, 2013, now Pat. No. 8,921,853.

(30) Foreign Application Priority Data

Nov. 16, 2012 (JP) ................................. 2012-252625

(51) Int. Cl.
| | | |
|---|---|---|
| *H01L 29/00* | (2006.01) | |
| *H01L 29/786* | (2006.01) | |
| *H01L 29/24* | (2006.01) | |
| *H01L 29/66* | (2006.01) | |
| *H01L 27/12* | (2006.01) | |
| *H01L 29/49* | (2006.01) | |
| *H01L 29/417* | (2006.01) | |

(52) U.S. Cl.
CPC ........ *H01L 29/7869* (2013.01); *H01L 27/1225* (2013.01); *H01L 29/247* (2013.01);
(Continued)

(58) Field of Classification Search
CPC .................... H01L 29/78696; H01L 29/4908; H01L 29/78648; H01L 29/41733; H01L 29/78645; H01L 29/7869
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Ngan Ngo
(74) *Attorney, Agent, or Firm* — Robinson Intellectual Property Law Office; Eric J. Robinson

(57) ABSTRACT

Oxide layers which contain at least one metal element that is the same as that contained in an oxide semiconductor layer including a channel are formed in contact with the top surface and the bottom surface of the oxide semiconductor layer, whereby an interface state is not likely to be generated at each of an upper interface and a lower interface of the oxide semiconductor layer. Further, it is preferable that an oxide layer, which is formed using a material and a method similar to those of the oxide layers be formed over the oxide layers Accordingly, the interface state hardly influences the movement of electrons.

24 Claims, 29 Drawing Sheets

(52) U.S. Cl.
CPC ...... *H01L29/41733* (2013.01); *H01L 29/4908* (2013.01); *H01L 29/66757* (2013.01); *H01L 29/66969* (2013.01); *H01L 29/78618* (2013.01); *H01L 29/78645* (2013.01); *H01L 29/78648* (2013.01); *H01L 29/78693* (2013.01); *H01L 29/78696* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,863,611 B2 | 1/2011 | Abe et al. |
| 7,964,871 B2 | 6/2011 | Iwasaki |
| 8,378,351 B2 | 2/2013 | Fukumoto et al. |
| 8,421,083 B2 | 4/2013 | Yamazaki et al. |
| 8,502,221 B2 * | 8/2013 | Yamazaki ................ 257/43 |
| 8,921,853 B2 * | 12/2014 | Yamazaki ................ 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0084280 A1 | 4/2011 | Nakayama et al. |
| 2011/0240991 A1 | 10/2011 | Yamazaki |
| 2013/0009219 A1 | 1/2013 | Yamazaki et al. |
| 2013/0009220 A1 | 1/2013 | Yamazaki et al. |
| 2014/0103339 A1* | 4/2014 | Yamazaki et al. ........... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-222767 A | 11/2011 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350°C", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transitition: The "Blue-Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-in. AMOLED Display With Driver Circuit Using Amorphous In-Ga-Zn-Oxide TFTS", IDW '09 : Proceedings of the 16th International Display Workshops, 2009, pp. 689-692.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transcations on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications",

(56) References Cited

OTHER PUBLICATIONS

SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Diget of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al.,"First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 156, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

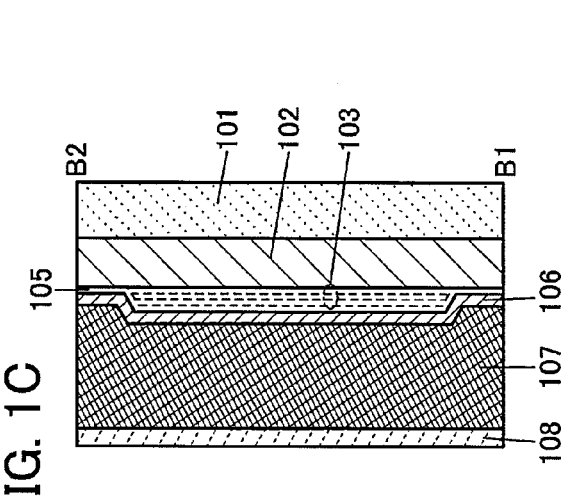
FIG. 1C
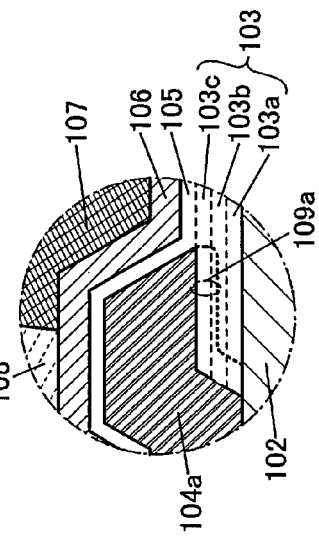
FIG. 1D
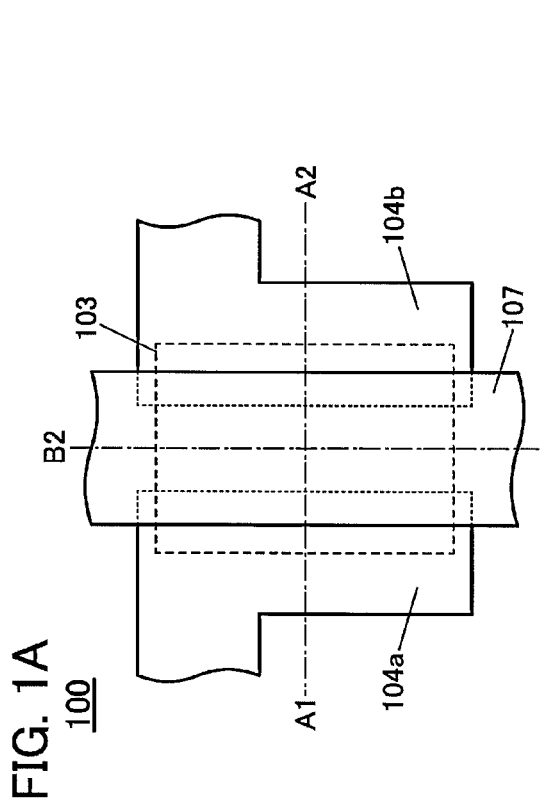
FIG. 1A
FIG. 1B

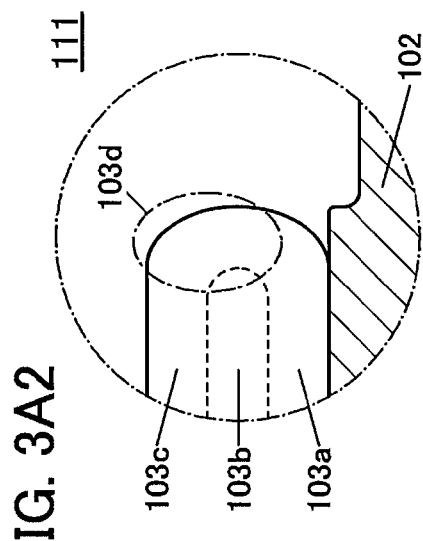
FIG. 3A1
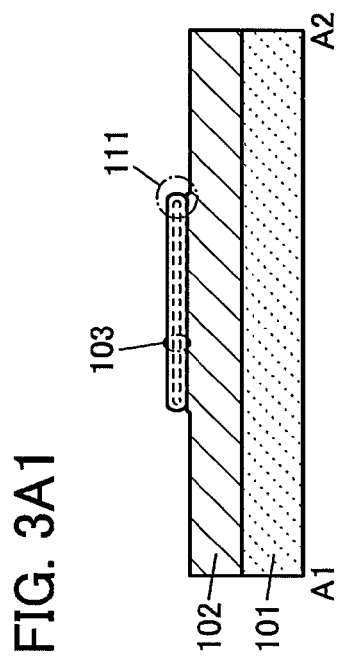
FIG. 3A2
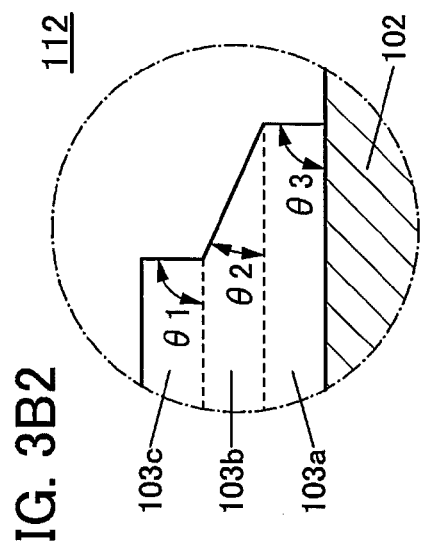
FIG. 3B1
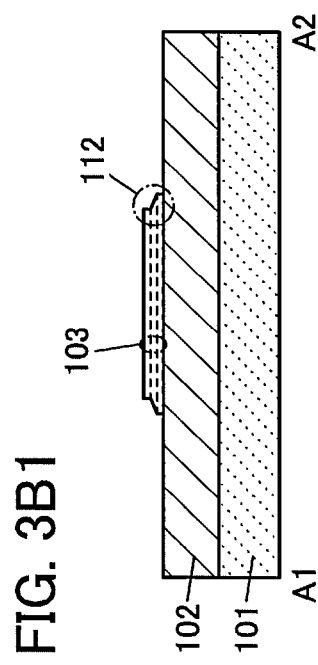
FIG. 3B2

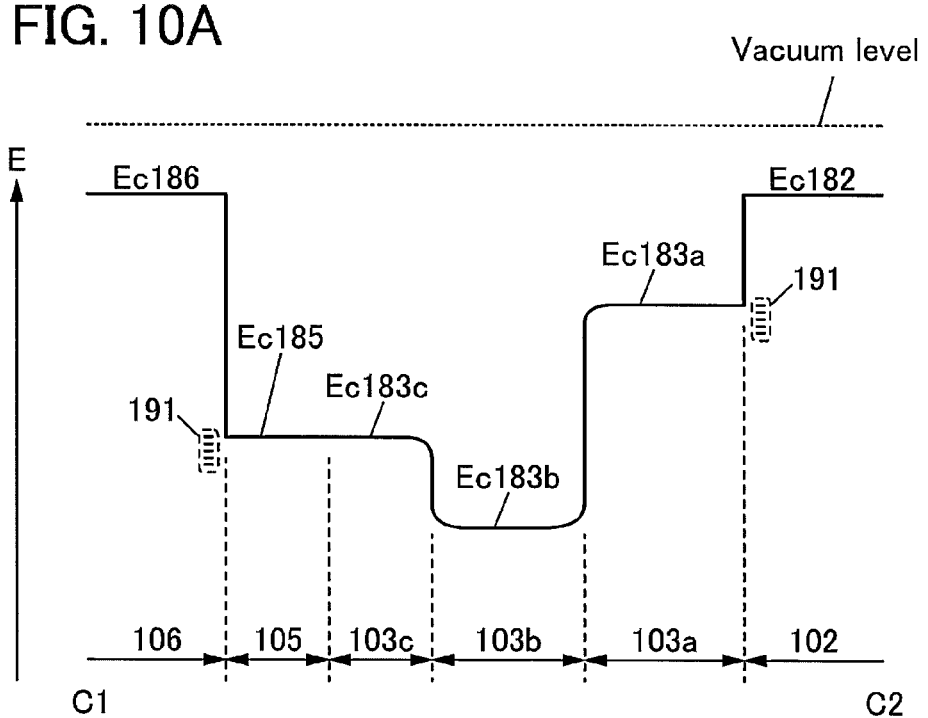
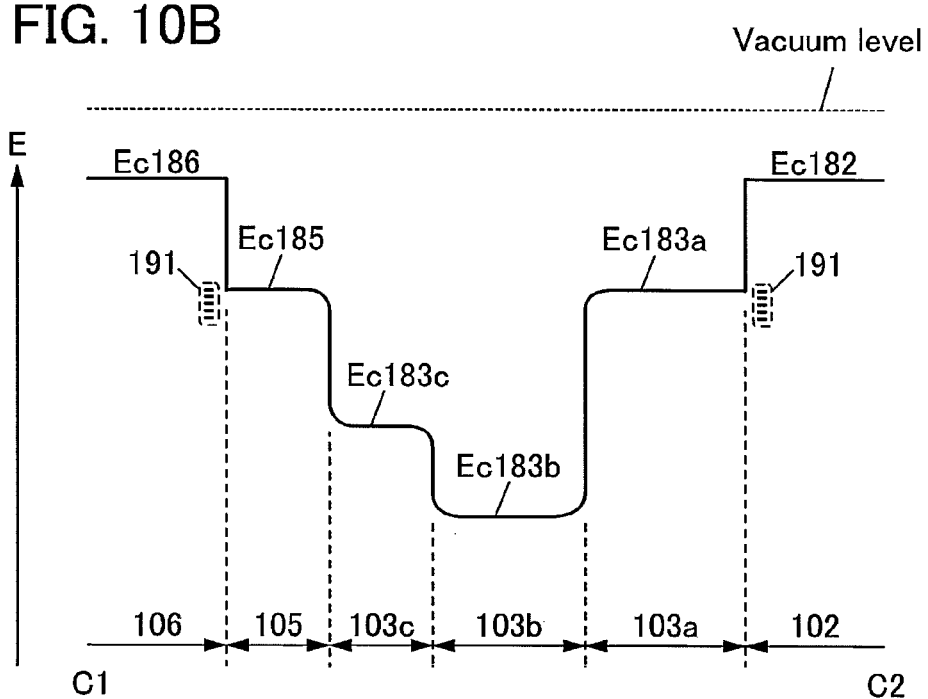

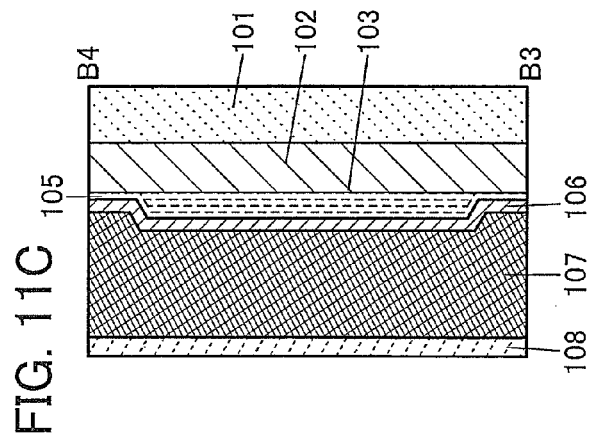
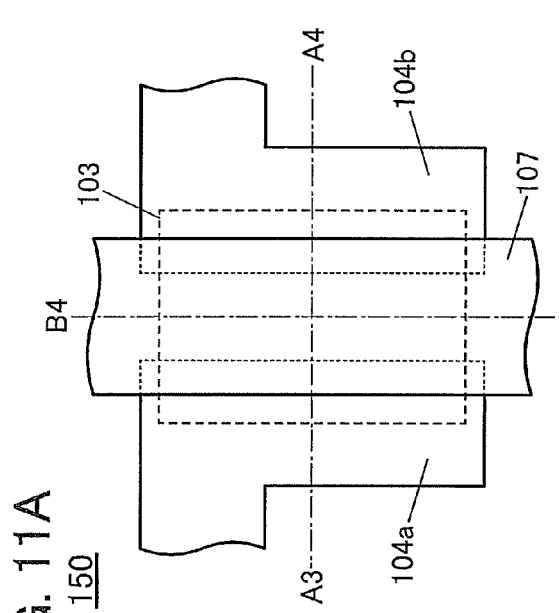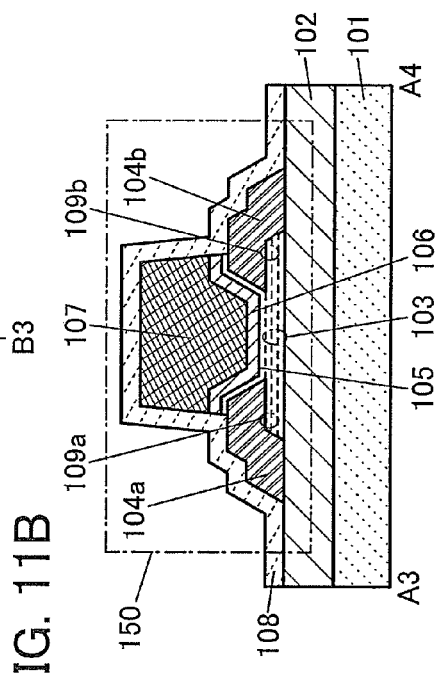
FIG. 11A
FIG. 11B
FIG. 11C

160

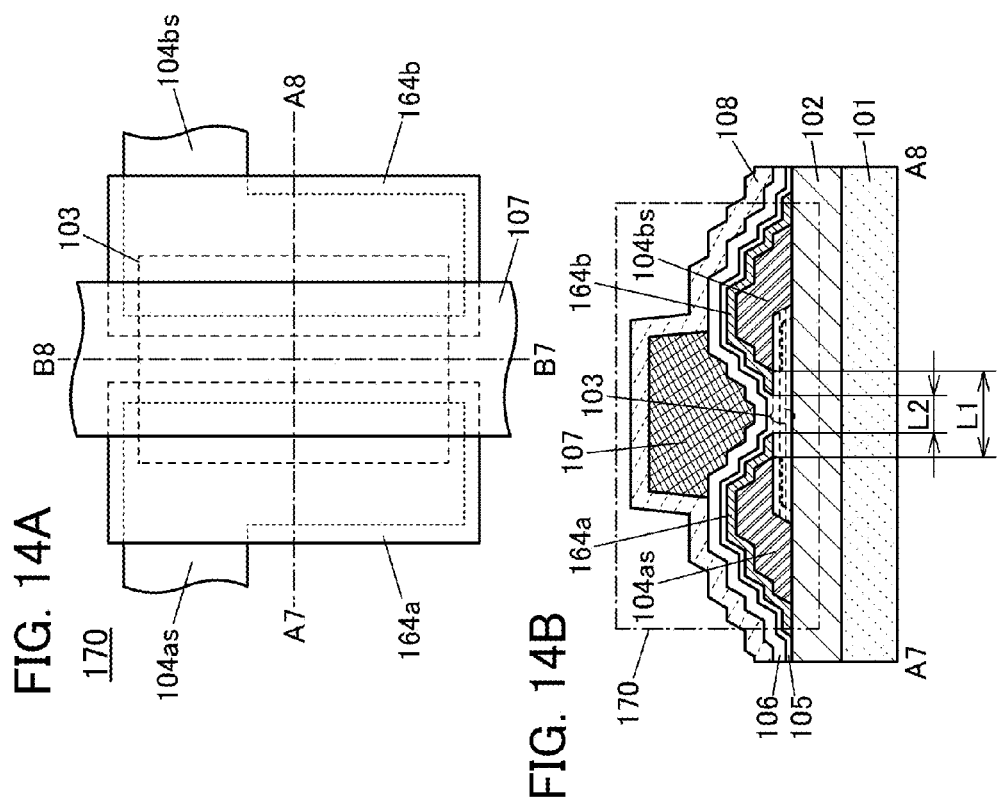

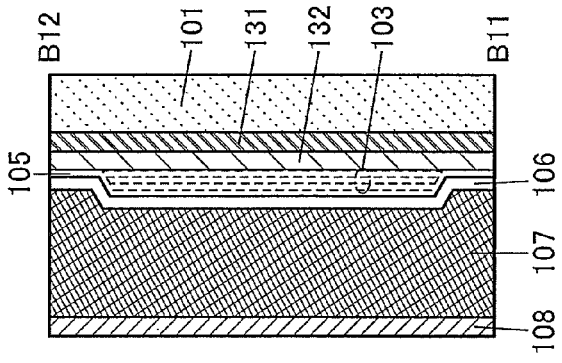
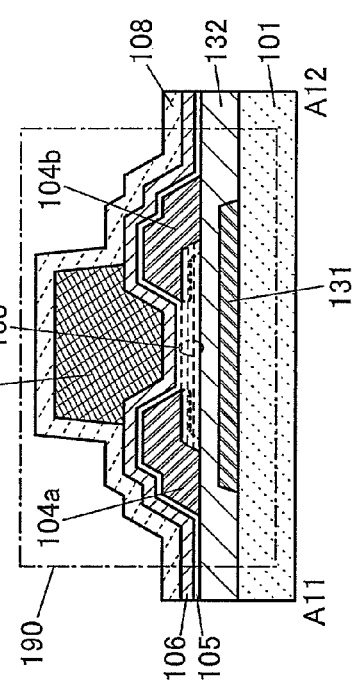
FIG. 16A
FIG. 16B
FIG. 16C

1196

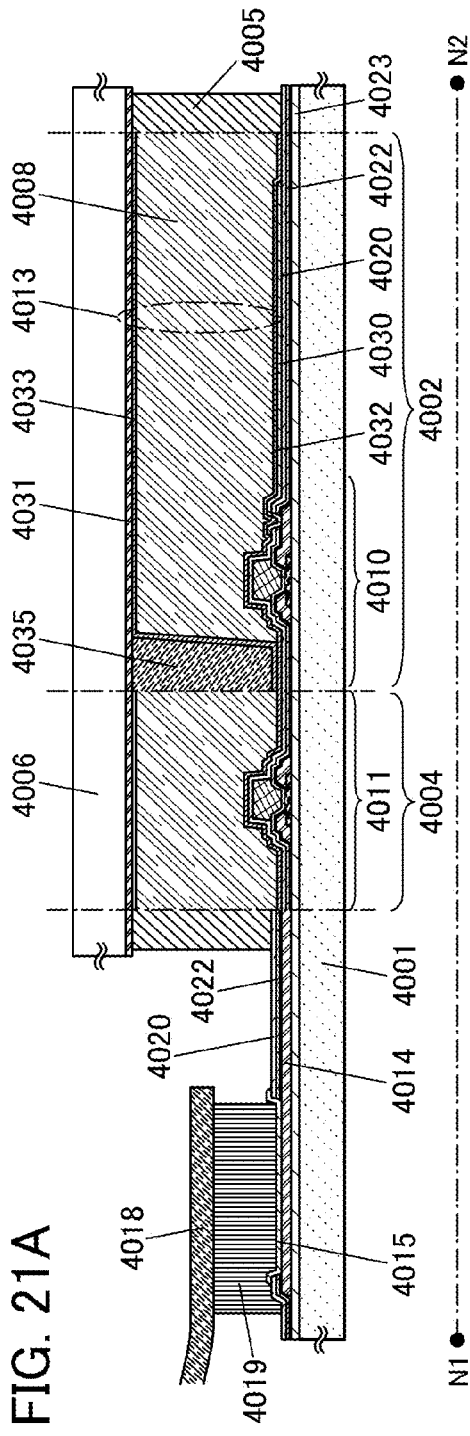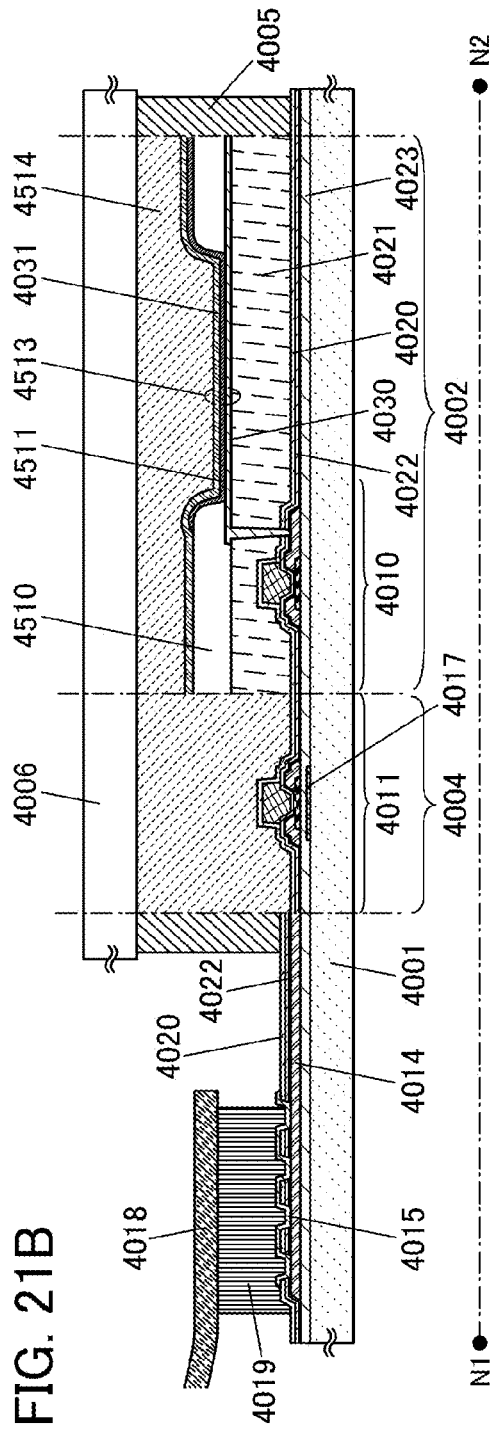

$\Delta Ecs < \Delta Evd$

SEMICONDUCTOR DEVICE COMPRISING A TRANSISTOR COMPRISING AN OXIDE SEMICONDUCTOR LAYER

BACKGROUND OF THE INVENTION

1. Field of the Invention

The present invention relates to a semiconductor device and a method for manufacturing the semiconductor device.

In this specification, a semiconductor device means all types of devices that can function by utilizing semiconductor characteristics, and a transistor, a semiconductor circuit, a memory device, an imaging device, a display device, an electro-optical device, an electronic appliance, and the like are all semiconductor device 2. Description of the Related Art Attention has been focused on a technique for forming a transistor using a semiconductor thin film (also referred to as a thin film transistor (TFT)). The transistor is applied to a wide range of electronic devices such as an integrated circuit (IC) or an image display device. A silicon-based semiconductor material is widely known as a material for a semiconductor thin film applicable to a transistor. As another material, an oxide semiconductor has been attracting attention.

For example, a transistor using an amorphous oxide containing indium (In), gallium (Ga), and zinc (Zn) for a channel formation region of a transistor is disclosed (see Patent Document 1).

Further, it is known that oxygen is released from an oxide semiconductor during a manufacturing process, so that an oxygen vacancy is formed (see Patent Document 2).

REFERENCE

Patent Documents

[Patent Document 1] Japanese Published Patent Application No. 2006-165528
[Patent Document 2] Japanese Published Patent Application No. 2011-222767

SUMMARY OF THE INVENTION

The oxygen vacancies formed in the oxide semiconductor layer generate localized states, which causes a reduction in electrical characteristics of a semiconductor device such as a transistor which includes the oxide semiconductor layer.

Further, an interface state derived from an oxygen vacancy is likely to be generated in the oxide semiconductor layer in the vicinity of an interface between the oxide semiconductor layer and an insulating layer which are stacked. An increase in interface states causes carriers to be scattered or captured, whereby the field-effect mobility of a transistor might be reduced or off-state current of the transistor might be increased. Further, an increase in interface states changes the threshold voltage of the transistor, which causes an increase in electrical characteristic variation. Accordingly, an increase in interface states leads to deterioration of the electrical characteristics of the transistor and a reduction in reliability of the transistor.

An object of one embodiment of the present invention is to provide an oxide semiconductor with a low density of localized states.

An object of one embodiment of the present invention is to provide a semiconductor device having small electrical characteristic variation.

An object of one embodiment of the present invention is to provide a highly reliable semiconductor device which has stable electrical characteristics.

Therefore, an object of an embodiment of the present invention is to provide a semiconductor device which has favorable electric characteristics.

An oxide layer which contains at least one metal element that is the same as that contained in an oxide semiconductor layer is formed in contact with the oxide semiconductor layer in which a channel is formed. An interface state is not likely to be generated at the interface between the oxide layer and the oxide semiconductor layer which are stacked.

Further, when the oxide semiconductor layer in which a channel is formed is provided between two oxide layers, an interface state is not likely to be generated at each of an upper interface and a lower interface of the oxide semiconductor layer. Specifically, oxide layers which contain at least one metal element that is the same as that contained in the oxide semiconductor layer including a channel are formed in contact with the top surface and the bottom surface of the oxide semiconductor layer.

A material which has a smaller electron affinity than the oxide semiconductor layer is used for the oxide layers in contact with the oxide semiconductor layer. With such a structure, electrons which flow in the channel hardly move in the oxide layers in contact with the oxide semiconductor layer and mainly move in the oxide semiconductor layer. Accordingly, even when an interface state exists between the oxide layer and an insulating layer which is formed on the outside of the oxide layer, the state hardly influences the movement of electrons.

That is, although a trap state derived from an impurity or a defect is formed in the vicinity of the interface between the oxide layer and the insulating layer, the oxide semiconductor layer can be separated from the trap state because the oxide layer is provided between the insulating layer and the oxide semiconductor layer.

When an oxide layer is further provided between the insulating layer and the oxide layer in contact with the oxide semiconductor layer, the oxide semiconductor layer can be further separated from the trap state. Note that the oxide layer provided between the insulating layer and the oxide layer in contact with the oxide semiconductor layer preferably contains at least one metal element that is the same as that contained in the oxide layer in contact with the oxide semiconductor layer.

It is preferable that the oxide layer provided between the insulating layer and the oxide layer in contact with the oxide semiconductor layer have a smaller electron affinity than the oxide layer in contact with the oxide semiconductor layer.

One embodiment of the present invention includes an oxide semiconductor layer over a first oxide layer, a second oxide layer over the oxide semiconductor layer, a first electrode and a second electrode in contact with the second oxide layer, a third oxide layer in contact with part of the oxide semiconductor layer and over the first electrode and the second electrode, an insulating layer over the third oxide layer, and a third electrode over the insulating layer.

One of the first electrode and the second electrode can function as a source electrode, and the other of the first electrode and the second electrode can function as a drain electrode. The third electrode can function as a gate electrode.

One embodiment of the present invention includes a stack including a first oxide layer, a second oxide layer, and an oxide semiconductor layer between the first oxide layer and the second oxide layer; a source electrode and a drain electrode; a third oxide layer; a gate insulating layer; and a gate electrode. The source electrode and the drain electrode are in contact with part of the stack, the third oxide layer overlaps with part of the source electrode and part of the drain electrode to be in contact with part of the stack, and the gate electrode overlaps with the oxide semiconductor layer with the gate insulating layer positioned therebetween.

According to one embodiment of the present invention, an oxide semiconductor with a low density of localized states can be provided.

According to one embodiment of the present invention, a semiconductor device having small electrical characteristic variation can be provided.

According to one embodiment of the present invention, a highly reliable semiconductor device which has stable electrical characteristics can be provided.

According to one embodiment of the present invention, a semiconductor device which has favorable electric characteristics can be provided.

BRIEF DESCRIPTION OF THE DRAWINGS

FIGS. 1A to 1D are a top view and cross-sectional views illustrating an example of a semiconductor device.

FIGS. 3A1 to 3B2 illustrate examples of a cross-sectional shape of an edge of an island-shaped stack.

FIGS. 10A and 10B each illustrate an energy band structure of a stack.

FIGS. 11A to 11C are a top view and cross-sectional views illustrating an example of a semiconductor device.

FIGS. 14A to 14C are a top view and cross-sectional views illustrating an example of a semiconductor device.

FIGS. 16A to 16C are a top view and cross-sectional views illustrating an example of a semiconductor device.

FIGS. 21A and 21B each illustrate an example of a display device.

DETAILED DESCRIPTION OF THE INVENTION

Figure 2A:
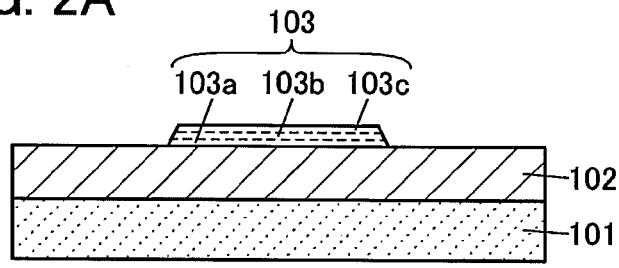
FIGS. 2A to 2E are cross-sectional views illustrating an example of a method for manufacturing a semiconductor device.

Hereinafter, embodiments of the present invention will be described in detail with reference to the accompanying drawings. However, the present invention is not limited to the following description, and it is easily understood by those skilled in the art that modes and details disclosed herein can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like. For example, in the actual manufacturing process, a resist mask or the like might be unintentionally reduced in size by treatment such as etching, which is not illustrated in some cases for easy understanding.

The ordinal numbers such as "first" and "second" in this specification and the like are used for convenience in order to avoid confusion of the components, and do not indicate the order of something, such as the order of steps or the stacking order of layers.

Note that a voltage refers to a potential difference between a certain potential and a reference potential (e.g., a ground potential (GND) or a source potential) in many cases. Accordingly, a voltage can also be called a potential.

Note that in this specification and the like, the term "electrically connected" includes the case where components are connected through an object having any electric function. There is no particular limitation on an object having any electric function as long as electric signals can be transmitted and received between components that are connected through the object. Accordingly, even when the expression "to be electrically connected" is used in this specification, there is a case in which no physical connection is made and a wiring is just extended in an actual circuit.

Further, functions of the source and the drain might be switched depending on operation conditions, e.g., when a transistor having a different polarity is employed or a direction of current flow is changed in circuit operation. Therefore, it is difficult to define which is the source (or the drain). Therefore, the terms "source" and "drain" can be switched in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly also includes the case where the angle is greater than or equal to 85° and less than or equal to 95°.

In this specification, the trigonal and rhombohedral crystal systems are included in the hexagonal crystal system.

(Embodiment 1)

In this embodiment, a transistor 100 is described as an example of a semiconductor device.

[1-1. Structural Example of Semiconductor Device]

FIGS. 1A to 1D illustrate the transistor 100 of one embodiment of a semiconductor device. The transistor 100 is a top-gate transistor. FIG. 1A is a top view of the transistor 100. FIG. 1B is a cross-sectional view of a portion denoted by a dashed dotted line A1-A2 in FIG. 1A and FIG. 1C is a cross-sectional view of a portion denoted by a dashed dotted line B1-B2 in FIG. 1A. FIG. 1D is an enlarged view of a portion 110 in FIG. 1B. Note that some components are not illustrated in FIG. 1A.

The transistor 100 is formed over an insulating layer 102. The insulating layer 102 is formed over a substrate 101. The transistor 100 includes a stack 103 which is formed over the insulating layer 102 and includes a source electrode 104a and a drain electrode 104b which are formed over the stack 103. An oxide layer 105 is formed over the source electrode 104a, the drain electrode 104b, and the stack 103. An insulating layer 106 is formed over the oxide layer 105.

A gate electrode 107 is formed over the insulating layer 106. The gate electrode 107 overlaps with the stack 103 with the insulating layer 106 and the oxide layer 105 provided therebetween.

An insulating layer 108 is formed over the gate electrode 107. The insulating layer 108 covers the gate electrode 107, the insulating layer 106, the oxide layer 105, the source electrode 104a, the drain electrode 104b, and the stack 103.

[1-1-1. Substrate]

Although there is no particular limitation on a substrate which can be used as the substrate 101, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like or a compound semiconductor substrate of silicon germanium or the like may be used as the substrate 101. Alternatively, an SOI substrate, a substrate over which a semiconductor element is provided, or the like can be used.

Note that a flexible substrate may also be used as the substrate 101. In the case where a flexible substrate is used, the transistor, the capacitor, or the like may be directly formed over the flexible substrate, or the transistor, the capacitor, or the like may be formed over a manufacturing substrate, and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

[1-1-2. Base Layer]

The insulating layer 102 functions as a base layer, and can prevent or reduce diffusion of an impurity element from the substrate 101. The insulating layer 102 can be formed with a single layer or a stack of layers using one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, and tantalum oxide. In this specification, oxynitride refers to a material containing a larger quantity of oxygen than that of nitrogen, and nitride oxide refers to a material containing a larger quantity of nitrogen than that of oxygen. Note that content of each element can be measured by Rutherford backscattering spectrometry (RBS) or the like, for example.

The insulating layer 102 can be formed by a sputtering method, a molecular beam epitaxy (MBE) method, a chemical vapor deposition (CVD) method, a pulsed laser deposition (PLD) method, an atomic layer deposition (ALD) method, or the like, as appropriate. The hydrogen content of the insulating layer 102 is preferably less than $5\times10^{19}$ cm$^{-3}$, further preferably less than $5\times10^{18}$ cm$^{-3}$.

The insulating layer 102 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used.

As the silicon oxide layer, a silicon oxide layer having excess oxygen is used. As the silicon nitride layer, a silicon nitride layer from which hydrogen and ammonia are less likely to be released is used. The amount of released hydrogen and ammonia is preferably measured by thermal desorption spectroscopy (TDS) analysis. Further, as the silicon nitride layer, a silicon nitride layer which does not transmit or hardly transmits oxygen is used.

The thickness of the insulating layer 102 may be greater than or equal to 10 nm and less than or equal to 500 nm, preferably greater than or equal to 50 nm and less than or equal to 300 nm.

Note that "excess oxygen" in this specification and the like refers to oxygen which can move in an oxide layer, an oxide semiconductor layer, a silicon oxide layer, a silicon oxynitride layer, and the like by heat treatment; oxygen contained in excess of the stoichiometric composition; or oxygen which has a function of entering oxygen vacancies to reduce the oxygen vacancies.

Further, the silicon oxide layer containing excess oxygen means a silicon oxide layer from which oxygen can be released by heat treatment or the like. An insulating layer containing excess oxygen means an insulating layer from which oxygen is released by heat treatment.

Here, an insulating film from which oxygen is released by heat treatment may release oxygen, the amount of which is higher than or equal to $1\times10^{18}$ atoms/cm$^3$, higher than or equal to 1×10$^{19}$ atoms/cm$^3$, or higher than or equal to 1×10$^{20}$ atoms/cm$^3$ in TDS analysis (converted into the number of oxygen atoms).

Here, a method for measuring the amount of released oxygen using TDS analysis is described.

The total amount of released gas from a measurement sample in TDS is proportional to the integral value of the ion intensity of the released gas. Then, a comparison with a reference sample is made, whereby the total amount of released gas can be calculated.

For example, the number of released oxygen molecules ($N_{O2}$) from a measurement sample can be calculated according to Formula (1) using the TDS results of a silicon wafer containing hydrogen at a predetermined density, which is the reference sample, and the TDS results of the measurement sample. Here, all gases having a mass number of 32 which are obtained in the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

[Formula 1]

$$N_{O2} = \frac{N_{H2}}{S_{H2}} \times S_{O2} \times \alpha \quad (1)$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the measurement sample is analyzed by TDS. α is a coefficient affecting the ion intensity in the TDS analysis. Refer to Japanese Published Patent Application No. H6-275697 for details of Formula (1). Note that the amount of released oxygen was measured with a thermal desorption spectroscopy apparatus produced by ESCO Ltd., EMD-WA1000S/W using a silicon wafer containing hydrogen atoms at 1×10$^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

Further, the layer from which oxygen is released by heat treatment may contain a peroxide radical. Specifically, the spin density attributed to a peroxide radical is 5×10$^{17}$ spins/cm$^3$ or higher. Note that the film containing a peroxide radical may have an asymmetric signal at a g-factor of around 2.01 generated in ESR.

The insulating layer containing excess oxygen may be formed using oxygen-excess silicon oxide (SiO$_x$ (X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by RBS.

Note that the insulating layer 102 is not necessarily provided as long as insulation between the substrate 101 and the stack 103 to be formed later can be ensured.

[1-1-3. Stack]

The stack 103 includes an oxide layer 103a, an oxide semiconductor layer 103b which is formed over the oxide layer 103a, and an oxide layer 103c which is formed over the oxide semiconductor layer 103b. The oxide layer 103a and the oxide layer 103c each may be an oxide layer that exhibits an insulating property or an oxide layer (an oxide semiconductor layer) that exhibits semiconductor characteristics.

The oxide layer 103a, the oxide semiconductor layer 103b, and the oxide layer 103c each contain one or both of In and Ga. Typical examples include an In—Ga oxide (an oxide containing In and Ga), an In—Zn oxide (an oxide containing In and Zn), and an In-M-Zn oxide (an oxide containing In, an element M, and Zn; the element M is one or more kinds of elements selected from Al, Ti, Ga, Y, Zr, La, Ce, Nd and Hf).

The oxide layer 103a and the oxide layer 103c, which are in contact with the oxide semiconductor layer 103b, are each preferably formed using a material containing at least one metal element that is the same as that contained in the oxide semiconductor layer 103b. With the use of such a material, an interface state at interfaces between the oxide semiconductor layer 103b and each of the oxide layers 103a and 103c is less likely to be generated. Accordingly, carriers are not likely to be scattered or captured at the interfaces, which results in an improvement in field-effect mobility of the transistor. Further, threshold-voltage variation of the transistor can be reduced.

The oxide layer 103a, the oxide semiconductor layer 103b, and the oxide layer 103c are formed successively without exposure to the air so as to be kept in an inert gas atmosphere, an oxidation gas atmosphere, or a reduced pressure, whereby interface states between the oxide semiconductor layer 103b and each of the oxide layers 103a and 103c can be less likely to be generated.

The thickness of the oxide layer 103a is greater than or equal to 3 nm and less than or equal to 100 nm, preferably greater than or equal to 3 nm and less than or equal to 50 nm. The thickness of the oxide semiconductor layer 103b is greater than or equal to 3 nm and less than or equal to 200 nm, preferably greater than or equal to 3 nm and less than or equal to 100 nm, further preferably greater than or equal to 3 nm and less than or equal to 50 nm. The thickness of the oxide layer 103c is greater than or equal to 3 nm and less than or equal to 50 nm, preferably greater than or equal to 3 nm and less than or equal to 20 nm.

Note that in the transistor 100 described in this embodiment, the source electrode 104a and the drain electrode 104b are in contact with the oxide layer 103c. In order to reduce contact resistance between the oxide semiconductor layer 103b and each of the source and drain electrodes 104a and 104b, it is preferable that the oxide layer 103c be as thin as possible.

Accordingly, the oxide layer 103a preferably has a larger thickness than the oxide layer 103c. In other words, the oxide layer 103c preferably has a smaller thickness than the oxide layer 103a.

When each of the oxide semiconductor layer 103b and the oxide layer 103a is an In-M-Zn oxide and the oxide layer 103a and the oxide semiconductor layer 103b contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide layer 103a and the oxide semiconductor layer 103b in which $y_1/x_1$ is 1.5 times or more as large as $y_2/x_2$ are selected. Still further preferably, the oxide layer 103a and the oxide semiconductor layer 103b in which $y_1/x_1$ is twice or more as large as $y_2/x_2$ are selected. Still further preferably, the oxide layer 103a and the oxide semiconductor layer 103b in which $y_1/x_1$ is three times or more as large as $y_2/x_2$ are selected. At this time, $y_1$ is preferably greater than or equal to $x_1$ in the oxide semiconductor layer 103b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the oxide layer 103a has the above structure, the oxide layer 103a can be a layer in which oxygen vacancies are less likely to occur than in the oxide semiconductor layer 103b.

Further alternatively, when each of the oxide semiconductor layer 103b and the oxide layer 103c is an In-M-Zn oxide and the oxide semiconductor layer 103b and the oxide layer 103c contain In, M, and Zn at an atomic ratio of $x_2:y_2:z_2$ and an atomic ratio of $x_3:y_3:z_3$ respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor layer 103b and the oxide layer 103c in which $y_3/x_3$ is 1.5 times or more as large as $y_2/x_2$ are selected. Still further preferably, the oxide semiconductor layer 103b and the oxide layer 103c in which $y_3/x_3$ is twice or more as large as $y_2/x_2$ are selected. Still further preferably, the oxide semiconductor layer 103b and the oxide layer 103c in which $y_3/x_3$ is three times or more as large as $y_2/x_2$ are selected. In the oxide semiconductor layer 103b at this time, $y_2$ is preferably larger than or equal to $x_2$ because the transistor can have stable electrical characteristics. However, when $y_2$ is three times or more as large as $x_2$, the field-effect mobility of the transistor is reduced; accordingly, $y_2$ is preferably smaller than three times $x_2$. When the oxide layer 103c has the above structure, the oxide layer 103c can be a layer in which oxygen vacancies are less likely to occur than in the oxide semiconductor layer 103b.

When an In-M-Zn oxide is used as the oxide layer 103a, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. When an In-M-Zn oxide is used as the oxide semiconductor layer 103b, the atomic ratio between In and M is preferably as follows: the atomic percentage of In is greater than or equal to 25 atomic % and the atomic percentage of M is less than 75 atomic %; further preferably, the atomic percentage of In is greater than or equal to 34 atomic % and the atomic percentage of M is less than 66 atomic %. When an In-M-Zn oxide is used as the oxide layer 103c, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

For example, an In—Ga oxide which is formed using a target having an atomic ratio of In:Ga=1:9, 7:93, or the like, or an In—Ga—Zn oxide which is formed using a target having an atomic ratio of In:Ga:Zn=1:3:2, 1:6:4, 1:9:6, or the like can be used as each of the oxide layer 103a and the oxide layer 103c containing In or Ga, and an In—Ga—Zn oxide which is formed using a target having an atomic ratio of In:Ga:Zn=1:1:1 or 3:1:2 can be used as the oxide semiconductor layer 103b. In each of the oxide layer 103a, the oxide layer 103c, and the oxide semiconductor layer 103b, the proportions of the atoms in the atomic ratio vary within a range of ±20% as an error.

In order to give stable electrical characteristics to the transistor including the stack 103, it is preferable that oxygen vacancies and the impurity concentration in the oxide semiconductor layer 103b be reduced so that the oxide semiconductor layer 103b can be regarded as an intrinsic or substantially intrinsic semiconductor layer. Further, it is preferable that the channel formation region of the oxide semiconductor layer 103b be regarded as an intrinsic or substantially intrinsic semiconductor layer. Specifically, the carrier density of the oxide semiconductor layer 103b is set to be lower than $1\times10^{17}/cm^3$, lower than $1\times10^{15}/cm^3$, or lower than $1\times10^{13}/cm^3$.

In the oxide semiconductor layer 103b, hydrogen, nitrogen, carbon, silicon, and metal elements other than main components serve as impurities. In order to reduce the concentration of impurities in the oxide semiconductor layer 103b, it is preferable to also reduce the concentration of impurities in the oxide layer 103a and the oxide layer 103c which are close to the oxide semiconductor layer 103b to a value almost equal to that in the oxide semiconductor layer 103b.

Particularly when silicon is contained in the oxide semiconductor layer 103b at a high concentration, an impurity state due to silicon is formed in the oxide semiconductor layer 103b. In some cases, the impurity state becomes a trap, which degrades electrical characteristics of the transistor. In order to make the deterioration of the electrical characteristics of the transistor small, the concentration of silicon in the oxide semiconductor layer 103b can be set to be lower than $1\times10^{19}$ atoms/cm$^3$, preferably lower than $5\times10^{18}$ atoms/cm$^3$, further preferably lower than $1\times10^{18}$ atoms/cm$^3$. Moreover, the concentrations of silicon at the interface between the oxide layer 103a and the oxide semiconductor layer 103b and the interface between the oxide semiconductor layer 103b and the oxide layer 103c are each set to be lower than $1\times10^{19}$ atoms/cm$^3$, preferably lower than $5\times10^{18}$ atoms/cm$^3$, further preferably lower than $1\times10^{18}$ atoms/cm$^3$.

Further, hydrogen and nitrogen in the oxide semiconductor layer 103b form donor levels, which increase carrier density. In order to make the oxide semiconductor layer 103b intrinsic or substantially intrinsic, the concentration of hydrogen in the oxide semiconductor layer 103b, which is measured by SIMS, is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor layer 103b, which is measured by SIMS, is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Note that when silicon and carbon are contained in the oxide semiconductor layer 103b at a high concentration, the crystallinity of the oxide semiconductor layer 103b is lowered in some cases. In order not to lower the crystallinity of the oxide semiconductor layer 103b, the concentration of silicon in the oxide semiconductor layer 103b can be set to be lower than $1\times10^{19}$ atoms/cm$^3$, preferably lower than $5\times10^{18}$ atoms/ cm³, further preferably lower than 1×10¹⁸ atoms/cm³. Moreover, in order not to lower the crystallinity of the oxide semiconductor layer 103b, the concentration of carbon in the oxide semiconductor layer 103b is set to be lower than 1×10¹⁹ atoms/cm³, preferably lower than 5×10¹⁸ atoms/cm³, further preferably lower than 1×10¹⁸ atoms/cm³.

Here, a structure of an oxide semiconductor film is described.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO₄ crystal is analyzed by an out-of-plane method, a peak appears frequently when the diffraction angle (2θ) is around 31°. This peak is derived from the (009) plane of the InGaZnO₄ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO₄ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO₄, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an InGaZnO₄ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Next, the crystallinity of each of the oxide layer 103a, the oxide semiconductor layer 103b, and the oxide layer 103c, which are included in the stack 103, is described.

The oxide layer 103a, the oxide semiconductor layer 103b, and the oxide layer 103c in the stack 103 may be amorphous or crystalline. Here, "crystalline" includes "microcrystalline", "polycrystalline", "single crystalline" and the like.

It is preferable that at least the oxide semiconductor layer 103b in the stack 103 be crystalline. It is particularly preferable that at least the oxide semiconductor layer 103b be a c-axis aligned crystalline oxide semiconductor (CAAC-OS) film.

In order that oxide semiconductor layer 103b is the CAAC-OS, the surface where the oxide semiconductor layer 103b is formed is preferably amorphous. When the surface where the oxide semiconductor layer 103b is formed is crystalline, crystallinity of the oxide semiconductor layer 103b is easily disordered and the CAAC-OS film is not easily formed.

A surface where the oxide semiconductor layer 103b is formed may have a crystalline structure similar to that of a CAAC-OS. In the case where the surface where the oxide semiconductor layer 103b is formed has a structure similar to that of the CAAC-OS, the oxide semiconductor layer 103b easily becomes the CAAC-OS.

Accordingly, in order that the oxide semiconductor layer 103b is a CAAC-OS, it is preferable that the oxide layer 103a serving as a base be amorphous or have a crystalline structure similar to that of a CAAC-OS.

In addition, when the oxide semiconductor layer 103b is the CAAC-OS, the oxide layer 103c formed over the oxide semiconductor layer 103b tends to have a crystalline structure similar to that of the CAAC-OS. Note that the oxide layer 103c is not necessarily crystalline structure but may be amorphous.

In the transistor including the stack 103, the oxide semiconductor layer 103b is a layer in which a channel is formed; thus, it is preferable that the oxide semiconductor layer 103b have high crystallinity so that the transistor can have stable electric characteristics.

[1-1-4. Source Electrode and Drain Electrode]

The source electrode 104a and the drain electrode 104b are formed over the stack 103 to be in contact with part of the stack 103. For a conductive material for forming the source electrode 104a and the drain electrode 104b, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The source electrode 104a and the drain electrode 104b can also be formed using a conductive material containing oxygen, such as indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

The source electrode 104a and the drain electrode 104b may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

A material which is capable of removing oxygen from part of the stack 103 to generate oxygen vacancies is preferably used for regions of the source and drain electrodes 104a and 104b which are in contact with at least the stack 103. The carrier concentration of the regions of the stack 103 in which oxygen vacancies are generated is increased, so that the regions become n-type regions ($n^+$ layers). Accordingly, the regions can function as a source region 109a and a drain region 109b. Examples of the material which is capable of removing oxygen from the stack 103 to form oxygen vacancies include tungsten and titanium.

Depending on the materials and thickness of the stack 103, all the regions of the stack 103 that overlap with the source electrode 104a and the drain electrode 104b serve as the source region 109a and the drain region 109b in some cases.

Formation of the source region 109a and the drain region 109b in the stack 103 makes it possible to reduce contact resistance between the stack 103 and each of the source and drain electrodes 104a and 104b. Accordingly, the electrical characteristics of the transistor, such as the field-effect mobility and the threshold voltage, can be favorable.

Note that the source electrode 104a and the drain electrode 104b each have a thickness of greater than or equal to 10 nm and less than or equal to 500 nm, preferably greater than or equal to 50 nm and less than or equal to 300 nm.

[1-1-5. Oxide Layer in Contact with Stack and Gate Insulating Layer]

The oxide layer 105, which is formed in contact with the source electrode 104a, the drain electrode 104b, and part of the stack 103, is formed using a material and a method similar to those of the stack 103. It is particularly preferable that the oxide layer 105 be formed using a material similar to that of the oxide layer 103c or a material which contains at least one metal element that is the same as that contained in the oxide layer 103c. When such a material is used, no interface state or few interface states exist between the oxide layer 105 and the oxide layer 103c.

Further, when the oxide layer 105 is provided over the source electrode 104a and the drain electrode 104b, impurities such as water which enter the transistor from the outside are difficult to reach the stack 103. Furthermore, when the oxide layer 105 is provided over the source electrode 104a and the drain electrode 104b, even if the source electrode 104a and the drain electrode 104b contain a metal element which is easily diffused, such as Cu, diffusion of the element can be prevented.

In the portion denoted by the dashed dotted line B1-B2 in FIG. 1A, the surface and side surface of the stack 103 are covered with the oxide layer 105 (see FIG. 1C).

The insulating layer 106 functions as a gate insulating layer. The insulating layer 106 formed over the oxide layer 105 is formed with a single layer or a stack of layers using a material(s) containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The thickness of the insulating layer 106 is greater than or equal to 1 nm and less than or equal to 100 nm, preferably greater than or equal to 10 nm and less than or equal to 50 nm. The insulating layer 106 can be formed by a sputtering method, a CVD method, an MBE method, an ALD method, or a PLD method.

The insulating layer 106 may be, for example, a multilayer film including a silicon nitride as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is less than or equal to $3 \times 10^{17}$ spins/cm$^3$, preferably less than or equal to $5 \times 10^{16}$ spins/cm$^3$ is used. As the silicon oxide layer, a silicon oxide layer containing excess oxygen is preferably used. As the silicon nitride layer, a silicon nitride layer from which hydrogen and ammonia are less likely to be released is used. The amount of released hydrogen or ammonia may be measured by TDS.

Note that when the gate insulating layer is thin, gate leakage due to a tunneling effect or the like might becomes a problem. In order to solve the problem of gate leakage, the above high-k material is preferably used for the gate insulating layer. By using a high-k material for the gate insulating layer, the thickness thereof can be increased for suppression of gate leakage with favorable electric characteristics of the gate insulating layer maintained. Note that a stacked-layer structure of a layer containing a high-k material and a layer containing any of silicon oxide, silicon nitride, silicon oxynitride, silicon nitride oxide, aluminum oxide, or the like may be employed.

Note that the oxide layer 105 can be regarded as part of the gate insulating layer. The oxide layer 105 and the insulating layer 106 are stacked, whereby withstand voltage between the gate electrode 107 and each of the source electrode 104a and the drain electrode 104b can be improved. Accordingly, a highly reliable semiconductor device can be obtained.

[1-1-6. Gate Electrode]

For a conductive material for forming the gate electrode 107, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The gate electrode 107 can be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

Further, the gate electrode 107 may have a single-layer structure or a stacked-layer of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

Further, an In—Ga—Zn-based oxynitride semiconductor layer, an In—Sn-based oxynitride semiconductor layer, an In—Ga-based oxynitride semiconductor layer, an In—Zn-based oxynitride semiconductor layer, a Sn-based oxynitride semiconductor layer, an In-based oxynitride semiconductor layer, a layer of metal nitride (such as InN or ZnN), or the like may be provided between the gate electrode 107 and the insulating layer 106. These layers each have a work function of 5 eV or higher and the electron affinity of each of these layers is larger than that of an oxide semiconductor; thus, the threshold voltage of the transistor including an oxide semiconductor in a semiconductor layer in which a channel is formed can be shifted in a positive direction. Accordingly, what is called a normally-off switching element can be obtained. For example, in the case where an In—Ga—Zn-based oxynitride semiconductor layer is provided between the gate electrode 107 and the insulating layer 106, an In—Ga—Zn-based oxynitride semiconductor layer having a higher nitrogen concentration than at least the oxide semiconductor layer 103b, specifically, an In—Ga—Zn-based oxynitride semiconductor film having a nitrogen concentration of 7 at. % or higher is used.

Note that the thickness of the gate electrode 107 may be greater than or equal to 10 nm and less than or equal to 500 nm, preferably greater than or equal to 50 nm and less than or equal to 300 nm.

[1-1-7. Protective Insulating Layer]

The insulating layer 108 functions as a protective insulating layer, and can prevent or reduce diffusion of an impurity element from the outside. The insulating layer 108 can be formed using a material and a method similar to those of the insulating layer 102. The insulating layer 108 may be, for example, a multilayer film including a silicon oxide layer as a first layer and a silicon nitride layer as a second layer. The silicon oxide layer may be a silicon oxide layer containing excess oxygen.

In the case where at least one of the insulating layer 102, the insulating layer 106, and the insulating layer 108 includes an insulating layer containing excess oxygen, oxygen vacancies of the oxide semiconductor layer 103b can be reduced owing to the excess oxygen.

Note that the thickness of the insulating layer 108 may be greater than or equal to 10 nm and less than or equal to 300 nm, preferably greater than or equal to 30 nm and less than or equal to 200 nm.

[1-2. Example of Method for Manufacturing Semiconductor Device]

An example of a method for manufacturing the transistor 100 is described using cross-sectional views illustrated in FIGS. 2A to 2E, as an example of a method for manufacturing a semiconductor device.

[1-2-1. Formation of Base Layer]

The insulating layer 102 serving as a base layer is formed over the substrate 101. Here, a glass substrate is used as the substrate 101. Next, an example in which the insulating layer 102 has a stacked-layer structure of a silicon nitride layer, a first silicon oxide layer, and a second silicon oxide layer is described.

First, a silicon nitride layer is formed over the substrate 101. The silicon nitride layer is preferably formed by a plasma CVD method, which is a kind of CVD method. Specifically, the silicon nitride layer may be formed by supplying high-frequency power under the following conditions: the substrate temperature is higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of the ammonia gas facilitates decomposition of the deposition gas containing silicon and the nitrogen gas. This is because an ammonia gas is dissociated by plasma energy or heat energy, and energy generated by the dissociation contributes to decomposition of a molecular bond of the deposition gas containing silicon and a molecular bond of the nitrogen gas.

Through the above method, the silicon nitride layer from which the hydrogen gas and the ammonia gas are less likely to be released can be formed. Further, owing to the low hydrogen content, a dense silicon nitride layer through which hydrogen, water, and oxygen do not permeate or hardly permeate can be formed.

Next, a first silicon oxide layer is formed. The first silicon oxide layer is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidation gas are used; and the pressure is set to be higher than or equal to 100 Pa and lower than or equal to 250 Pa, preferably higher than or equal to 100 Pa and lower than or equal to 200 Pa.

According to the above-described method, the gas decomposition efficiency in plasma is enhanced, oxygen radicals are increased, and oxidation of the gas is promoted; as a result, the first silicon oxide layer can contain excess oxygen.

Then, a second silicon oxide layer is formed. The second silicon oxide layer is preferably formed by a plasma CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidizing gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

Note that when the flow rate of the oxidizing gas is 100 times as high as that of the deposition gas containing silicon, the hydrogen content and dangling bonds in the second silicon oxide layer can be reduced.

In such a manner, the second silicon oxide layer whose defect density is lower than the first silicon oxide layer is formed. In other words, the second silicon oxide layer can have a density of a spin corresponding to a signal with a g factor of 2.001 in ESR less than or equal to $3\times10^{17}$ spins/cm$^3$, or less than or equal to $5\times10^{16}$ spins/cm$^3$.

After the silicon nitride layer is formed, treatment for adding oxygen to the silicon nitride layer may be performed. Further, after the first silicon oxide layer is formed, treatment for adding oxygen to the first silicon oxide layer may be performed. Furthermore, after the second silicon oxide layer is formed, treatment for adding oxygen to the second silicon oxide layer may be performed. The treatment for adding oxygen can be performed with an ion doping apparatus or a plasma treatment apparatus. As the ion doping apparatus, an ion doping apparatus with a mass separation function may be used. As a gas for adding oxygen, an oxygen gas of $^{16}O_2$, $^{18}O_2$, or the like, a nitrous oxide gas, an ozone gas, or the like can be used.

[1-2-2. Formation of Stack]

Next, the stack 103 including the oxide layer 103a, the oxide semiconductor layer 103b, and the oxide layer 103c is formed over the insulating layer 102. The stack 103 can be formed by a sputtering method, a coating method, a pulsed laser deposition method, a laser ablation method, or the like.

In the case where the oxide layer 103a, the oxide semiconductor layer 103b, and the oxide layer 103c containing In or Ga are formed by a sputtering method, an RF power supply device, an AC power supply device, a DC power supply device, or the like can be used as appropriate as a power supply device for generating plasma.

As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas. A gas having a low impurity concentration is used as the sputtering gas. Specifically, a sputtering gas whose dew point is −40° C. or lower, preferably −60° C. or lower is used.

A target is selected as appropriate in accordance with the compositions of the oxide layer 103a, the oxide semiconductor layer 103b, and the oxide layer 103c which are to be formed.

Note that heating during the formation of the stack 103 may be performed at a substrate temperature of higher than or equal to 100° C. and lower than or equal to 500° C., preferably higher than or equal to 170° C. and lower than or equal to 350° C.

In this embodiment, the oxide layer 103a, the oxide semiconductor layer 103b which is crystalline, and the oxide layer 103c are formed by a sputtering method. First, a 20-nm-thick In—Ga—Zn oxide layer is formed as the oxide layer 103a over the insulating layer 102, using a target having an atomic ratio of In:Ga:Zn=1:3:2. Then, a 15-nm-thick In—Ga—Zn oxide layer is formed as the oxide semiconductor layer 103b over the oxide layer 103a, using a target having an atomic ratio of In:Ga:Zn=1:1:1. After that, a 5-nm-thick In—Ga—Zn oxide layer is formed as the oxide layer 103c over the oxide semiconductor layer 103b, using a target having an atomic ratio of In:Ga:Zn=1:3:2.

Further, it is preferable that the oxide semiconductor layer 103b which is crystalline be a CAAC-OS. Four examples of a method for forming a CAAC-OS are described.

The first method is to form an oxide semiconductor at a temperature higher than or equal to 100° C. and lower than or equal to 500° C., whereby crystal parts in which the c-axes are aligned in the direction parallel to a normal vector of a surface on which the oxide semiconductor is formed or a normal vector of a surface of the oxide semiconductor are formed in the oxide semiconductor.

The second method is to form an oxide semiconductor with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor are formed in the oxide semiconductor.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

The fourth method is to form an oxide semiconductor which includes crystal parts in which the c-axes are aligned in a direction parallel to a normal vector of a surface on which the oxide semiconductor is formed or a normal vector of a surface of the oxide semiconductor, with the use of a target including a polycrystalline oxide semiconductor with high alignment.

Here, a model of crystal growth of a CAAC-OS using the fourth method is described with reference to FIGS. 4A and 4B, FIGS. 5A and 5B, and FIGS. 6A and 6B.

Figure 4A:
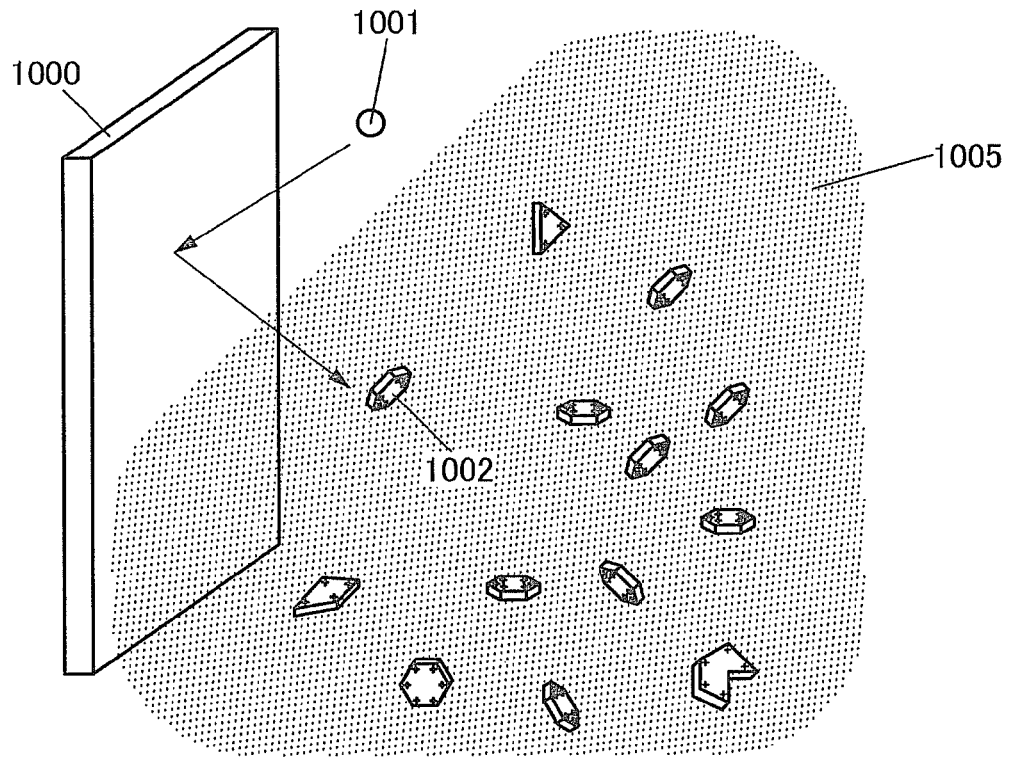
FIGS. 4A and 4B illustrate a situation where a sputtered particle is separated from a target.
Figure 4B:
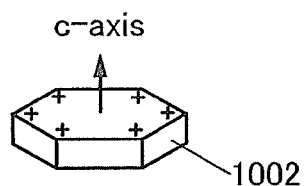

FIG. 4A is a schematic diagram illustrating a state in which an ion 1001 collides with a target 1000 containing a polycrystalline oxide semiconductor having high alignment to separate sputtered particles 1002 with crystallinity from the sputtering target 1000. A crystal grain has a cleavage plane parallel to a surface of the target 1000. The crystal grain has a portion with a weak interatomic bond. When the ion 1001 collides with the crystal grain, an interatomic bond of the portion where an interatomic bond is weak is cut. Accordingly, the sputtered particle 1002 is cut along the cleavage plane and the portion where an interatomic bond is weak and separated in a flat-plate (or pellet) form. For example, the c-axis of the sputtered particle 1002 is oriented in a direction perpendicular to a flat plane of the sputtered particle 1002 (see FIG. 4B). The equivalent circle diameter of a crystal grain of the oxide semiconductor included in the target 1000 is preferably less than or equal to 1 μm. Note that the equivalent circle diameter of a flat plane of the sputtered particle 1002 is greater than or equal to 1/3000 and less than or equal to 1/20, preferably greater than or equal to 1/1000 and less than or equal to 1/30 of an average grain size of the crystal grains. Here, the term "equivalent circle diameter on a plane" refers to the diameter of a perfect circle having the same area as the plane.

Alternatively, when part of the crystal grain is separated as a particle from a cleavage plane and exposed to plasma 1005, cutting of a bond starts at the portion where an interatomic bond is weak, so that a plurality of sputtered particles 1002 are generated.

With the use of an oxygen cation as the ion 1001, plasma damage at the film formation can be alleviated. Thus, when the ion 1001 collides with the surface of the target 1000, a lowering in crystallinity of the target 1000 can be suppressed or a change of the target 1000 into an amorphous state can be suppressed.

Figure 5A:
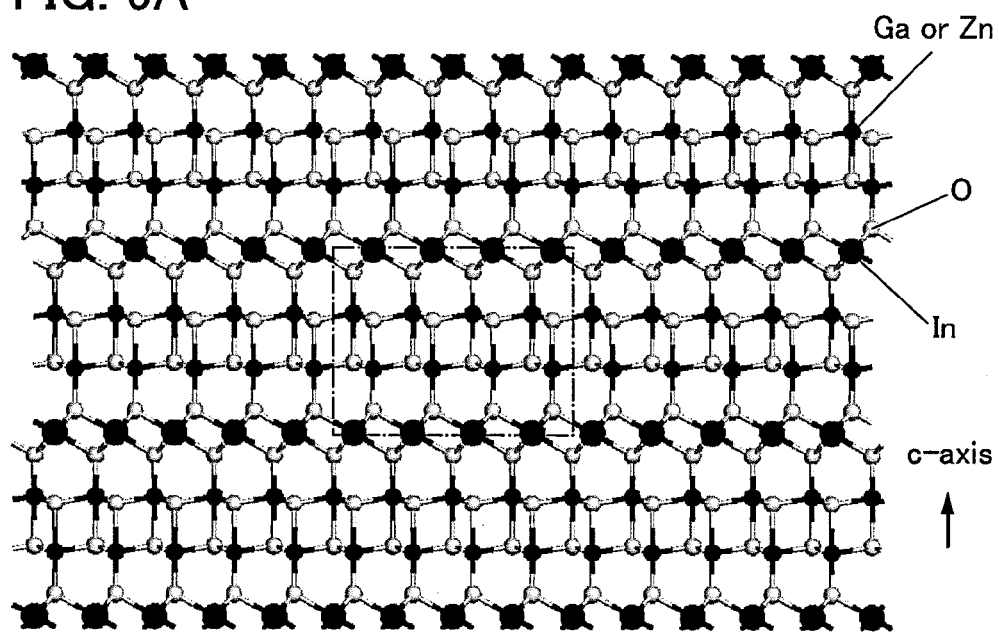
FIGS. 5A and 5B illustrate an example of a crystal structure of an In—Ga—Zn oxide.
Figure 5B:
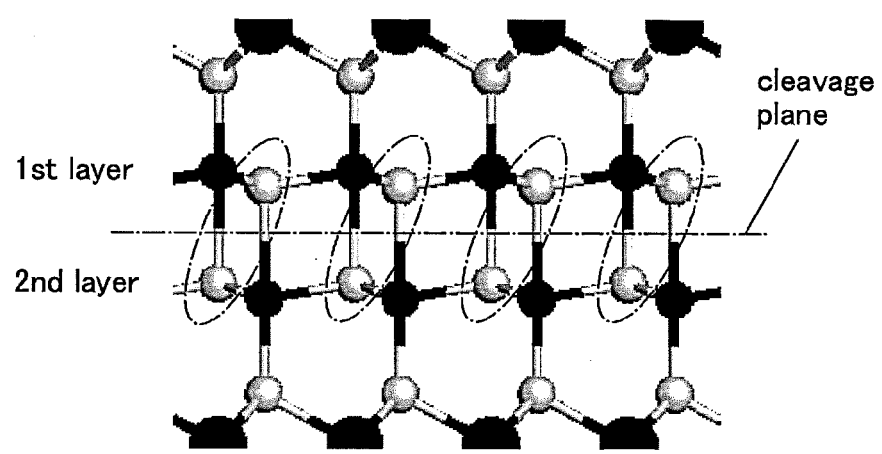

FIG. 5A illustrates a crystal structure of an In—Ga—Zn oxide viewed from a direction parallel to an a-b plane of the crystal as an example of the target 1000 containing a polycrystalline oxide semiconductor with high alignment. FIG. 5B illustrates an enlarged view of a portion surrounded by a dashed dotted line in FIG. 5A.

For example, in a crystal grain of an In—Ga—Zn oxide, a cleavage plane is a plane between a first layer and a second layer as illustrated in FIG. 5B. The first layer includes a gallium atom and/or zinc atom and an oxygen atom, and the second layer includes a gallium atom and/or zinc atom and an oxygen atom. This is because oxygen atoms having negative charge in the first layer and oxygen atoms having negative charge in the second layer are close to each other (see surrounded portions in FIG. 5B). In this manner, the cleavage plane is a plane parallel to an a-b plane. Further, the crystal of the In—Ga—Zn oxide shown in FIGS. 5A and 5B is a hexagonal crystal; thus the flat-plate-like particle is likely to have a hexagonal prism shape with a regular hexagonal plane whose internal angle is 120°.

It is preferable that sputtered particles 1002 be positively charged. Note that it is preferable that corner portions of the sputtered particles 1002 have charges with the same polarity because interaction between the sputtered particles occurs (the sputtered particles repel with each other) so that the shapes of the sputtered particles maintain (see FIG. 4B). For example, the sputtered particles 1002 may be positively charged. There is no particular limitation on a timing of when the sputtered particle 1002 is positively charged, but it is preferably positively charged by receiving an electric charge when an ion 1001 collides. Alternatively, in the case where the plasma 1005 is generated, the sputtered particle 1002 is preferably exposed to the plasma 1005 to be positively charged. Further alternatively, the ion 1001 which is an oxygen cation is preferably bonded to a side surface, a top surface, or a bottom surface of the sputtered particle 1002, whereby the sputtered particle 1002 is positively charged.

A situation where a sputtered particle is deposited on a deposition surface is described with reference to FIGS. 6A and 6B. Note that in FIGS. 6A and 6B, sputtered particles which have been already deposited are shown by dashed lines.

Figure 6A:
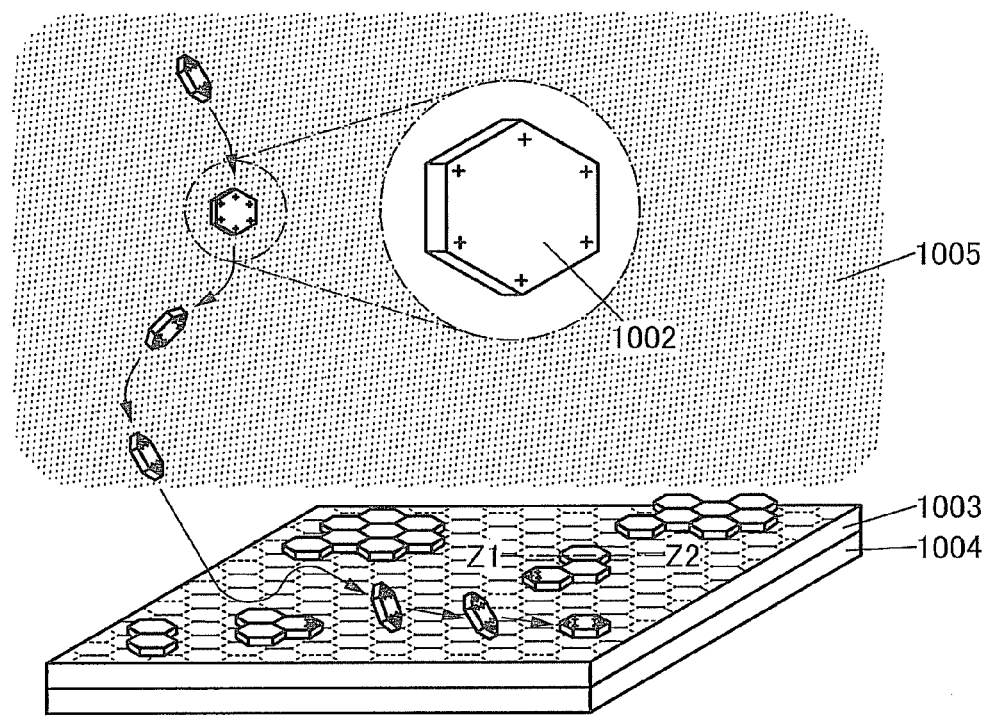
FIGS. 6A and 6B illustrates a situation where a sputtered particle reaches a deposition surface and is deposited.

FIG. 6A illustrates an oxide semiconductor layer 1003 which is formed by deposition of the sputtering particles 1002 on an amorphous film 1004. As shown in FIG. 6A, the sputtered particle 1002 is exposed to the plasma 1005 to be positively charged, and accordingly the sputtered particle 1002 is deposited on a region where other sputtered particles 1002 have not been deposited yet. This is because the sputtered particles 1002 that are positively charged repel each other. The sputtering particles can be deposited in the above manner on an insulating surface.

Figure 6B:
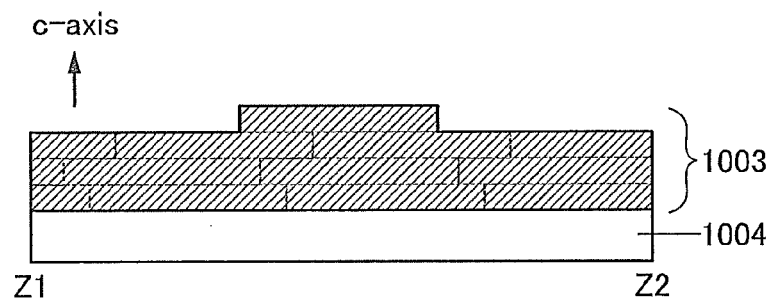

FIG. 6B is a cross-sectional view taken along a dashed dotted line Z1-Z2 in FIG. 6A. The oxide semiconductor layer 1003 is formed in such a manner that the plate-like sputtered particles 1002 whose c-axis direction is perpendicular to their flat planes are deposited orderly. Accordingly, the oxide semiconductor layer 1003 is a CAAC-OS whose c-axes are aligned in a direction perpendicular to a surface on which the layer is formed. According to the above model, a CAAC-OS film having high crystallinity can be formed even on an insulating surface, an amorphous film, or an amorphous insulating film.

In a transistor in which a CAAC-OS is used for a semiconductor layer including a channel, electrical characteristics variation due to irradiation with visible light or ultraviolet light is small. Thus, the transistor in which a CAAC-OS is used for the oxide semiconductor layer including the channel has high reliability.

For the deposition of the CAAC-OS, the following conditions are preferably used.

By reducing the amount of impurities entering the CAAC-OS during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of the impurities in a sputtering gas may be reduced. Specifically, a sputtering gas whose dew point is −40° C. or lower, preferably −60° C. or lower is used.

By increasing the heating temperature of the surface where the CAAC-OS is formed (for example, the substrate heating temperature) during the deposition, migration of a sputtered particle is likely to occur after the sputtered particle reaches the surface where the CAAC-OS is formed. Specifically, the temperature of the surface where the CAAC-OS is formed during the deposition is higher than or equal to 100° C. and lower than or equal to 740° C., preferably higher than or equal to 150° C. and lower than or equal to 500° C.

Further, it is preferable that the proportion of oxygen in the sputtering gas be increased and the power be optimized in order to reduce plasma damage at the time of deposition. The proportion of oxygen in the sputtering gas is higher than or equal to 30 vol % and lower than or equal to 100 vol %.

As an example of the sputtering target, an In—Ga—Zn-based metal oxide target is described below.

The In—Ga—Zn-based metal oxide target which is polycrystalline is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

An oxide semiconductor layer which is formed by a sputtering method contains hydrogen, water, a compound having a hydroxyl group, or the like in some cases. Hydrogen, water, and the like easily form a donor level and thus serve as impurities in the oxide semiconductor. Therefore, in the formation of an oxide semiconductor layer by a sputtering method, the hydrogen concentration of the oxide semiconductor layer is preferably reduced as much as possible.

Moreover, when the leakage rate of the treatment chamber of the sputtering apparatus is set to lower than or equal to $1 \times 10^{-10}$ Pa·m$^3$/second at the formation of the oxide semiconductor layer, entry of impurities such as an alkali metal or hydride into the oxide semiconductor layer that is being formed by a sputtering method can be reduced. Further, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, entry of alkali metal, hydrogen atoms, hydrogen molecules, water, a hydroxyl group, hydride, and the like into the oxide semiconductor layer can be suppressed. In addition, when the target is used, the concentration of alkali metal such as lithium, sodium, or potassium in the oxide semiconductor layer can be reduced. The silicon concentration of the target is preferably lower than or equal to $1 \times 10^{18}$ atoms/cm$^3$.

In order that impurities such as water and hydrogen in the stack 103 are further reduced (dehydration or dehydrogenation are performed) to highly purify the stack 103, the stack 103 is preferably subjected to heat treatment. For example, the stack 103 is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere containing an oxidation gas such as oxygen, ozone, or nitrogen oxide at 10 ppm or higher. The inert gas atmosphere refers to an atmosphere containing the oxidation gas at lower than 10 ppm and is filled with nitrogen or a rare gas.

The heat treatment may be performed at a temperature higher than or equal to 250° C. and lower than or equal to 650° C., preferably higher than or equal to 300° C. and lower than or equal to 500° C. The treatment time is 3 minutes to 24 hours. Heat treatment for over 24 hours is not preferable because the productivity is reduced.

There is no particular limitation on a heating apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the heat treatment, impurities such as hydrogen (water, a compound having a hydroxyl group) can be released from the stack 103. Thus, the impurities in the stack 103 can be reduced, so that the stack 103 can be highly purified. Further, in particular, hydrogen serving as an unstable carrier source can be detached from the stack 103; therefore, the negative shift of the threshold voltage of the transistor can be prevented. As a result, the reliability of the transistor can be improved.

By heat treatment performed in an atmosphere containing an oxidation gas, oxygen vacancies in the oxide layer 103a, the oxide semiconductor layer 103b, and the oxide layer 103c can be reduced at the same time as the release of the impurities. The heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate detached oxygen.

After the stack 103 is formed by a sputtering method, a resist mask is formed over the stack 103 and the stack 103 is etched into a desired shape using the resist mask, so that the island-shape stack 103 is formed (see FIG. 2A). The resist mask can be formed by a photolithography method, a printing method, an inkjet method, or the like as appropriate. Formation of the resist mask by an inkjet method needs no photomask; thus, manufacturing cost can be reduced.

Note that the etching of the stack 103 may be performed by either one or both of a dry etching method and a wet etching method. In the case where the stack 103 is etched by a wet etching method, a solution obtained by mixing phosphoric acid, acetic acid, and nitric acid, a solution containing oxalic acid, a solution containing phosphoric acid, or the like can be used as the etchant. Alternatively, ITO-07N (produced by KANTO CHEMICAL CO., INC.) may be used.

A chlorine-based gas typified by chlorine ($Cl_2$), boron trichloride ($BCl_3$), silicon tetrachloride ($SiCl_4$), carbon tetrachloride ($CCl_4$), or the like can be used as an etching as for the dry etching of the stack 103. As a plasma source in the case where the etching of the stack 103 is performed by a dry etching method, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

To etch the stack 103, dry etching treatment is performed using chlorine ($Cl_2$) and boron trichloride ($BCl_3$) using as an etching gas in this embodiment.

Note that part of the insulating layer 102 which does not overlap with the island-shaped stack 103 might be etched depending on the etching conditions. Further, a cross-sectional shape of an edge of the island-shaped stack 103 can be changed by changing the etching conditions.

Here, an example of the cross-sectional shape of the edge of the island-shaped stack 103 is described. FIGS. 3A1 to 3B2 are cross-sectional views each illustrating an example of the shape of the edge in a cross section of the island-shaped stack 103.

FIG. 3A1 illustrates a structural example in which the side surface of the stack 103 has a curved surface. FIG. 3A2 is an enlarged view of a portion 111 in FIG. 3A1. In the island-shaped stack 103 illustrated in FIGS. 3A1 and 3A2, an oxide layer 103d is formed on the side surface of the stack 103, and the edge of the stack 103 in the cross-sectional shape has a curved surface.

The oxide layer 103d can be formed in such a manner that the etching for forming the island-shaped stack 103 is performed by dry etching under optimal conditions. Part of the oxide layer 103a which is etched by the dry etching treatment is reattached, whereby the oxide layer 103d is formed. By forming the oxide layer 103d on the side surface of the island-shaped stack 103, the density of localized states generated at the side surface can be reduced. Therefore, favorable electric characteristics of the transistor can be obtained.

FIG. 3B1 illustrates a structural example in which the edge of the island-shaped stack 103 has a plurality of tapered angles. FIG. 3B2 is an enlarged view of a portion 112 in FIG. 3B1.

The cross-sectional shape of FIGS. 3B1 and 3B2 can be obtained by performing the etching for forming the island-shaped stack 103 by a wet etching method under etching conditions in accordance with the structure of the stack 103.

For example, in the case where an In—Ga—Zn oxide is etched using a solution containing phosphoric acid, as the Ga content of the In—Ga—Zn oxide is increased, the etching rate is increased.

In the case where the oxide layer 103a and the oxide layer 103c of the stack 103 are each an In—Ga—Zn oxide which is formed using a target having an atomic ratio of In:Ga:Zn=1:3:2 and the oxide semiconductor layer 103b of the stack 103 is an In—Ga—Zn oxide which is formed using a target having an atomic ratio of In:Ga:Zn=1:1:1, when the etching for forming the island-shaped stack 103 is performed by a wet etching using a solution containing phosphoric acid, the cross-sectional shape of the edge in FIGS. 3B1 and 3B2 can be obtained.

Note that a taper angle $\theta 1$, a taper angle $\theta 2$, and a taper angle $\theta 3$ in FIG. 3B2 are each less than 90°, preferably less than or equal to 80°. Further, it is preferable that the taper angle $\theta 1$ and the taper angle $\theta 3$ be greater than or equal to 45° and less than or equal to 80°, and the taper angle $\theta 2$ be greater than or equal to 30° and less than or equal to 70°. Furthermore, the taper angle $\theta 1$ may be substantially the same as the taper angle $\theta 3$ or may be greater than the taper angle $\theta 2$.

Note that the "taper angle" refers to an inclination angle formed by a side surface and a bottom surface of a layer having a taper shape when the layer is seen from the direction perpendicular to the cross section of the layer (i.e., the plane perpendicular to the surface of the substrate). A taper angle smaller than 90° is called forward tapered angle and a taper angle of larger than or equal to 90° is called inverse tapered angle.

When the edge of the island-shaped stack 103 has a tapered shape, coverage with a layer covering the island-shaped stack 103 can be improved. Further, when the edge of the island-shaped stack 103 has a plurality of tapered shapes having different angles, the coverage with a layer covering the island-shaped stack 103 can be further improved.

After the etching treatment, the resist mask is removed. Note that the above heat treatment may be performed after the stack 103 is processed into an island shape.

The oxide semiconductor has a band gap of 2 eV or more; therefore, a transistor including an oxide semiconductor in a semiconductor layer in which a channel is formed has extremely small leakage current (also referred to as an extremely small off-state current) when the transistor is off. Specifically, in a transistor whose channel length is 3 μm and channel width is 10 μm, the off-state current can be lower than $1 \times 10^{-20}$ A, preferably lower than $1 \times 10^{-22}$ A, further preferably lower than $1 \times 10^{-24}$ A. That is, the on/off ratio can be greater than or equal to 20 digits and less than or equal to 150 digits.

[1-2-3. Formation of Source Electrode and Drain Electrode]

Next, a 100-nm-thick conductive layer to be the source electrode 104a and the drain electrode 104b is formed over the island-shaped stack 103, and a resist mask is formed over the conductive layer. The resist mask can be formed by a photolithography method, a printing method, an inkjet method, or the like as appropriate. Formation of the resist mask by an inkjet method needs no photomask; thus, manufacturing cost can be reduced. Here, a tungsten layer is formed as the conductive layer by a sputtering method.

Figure 2B:
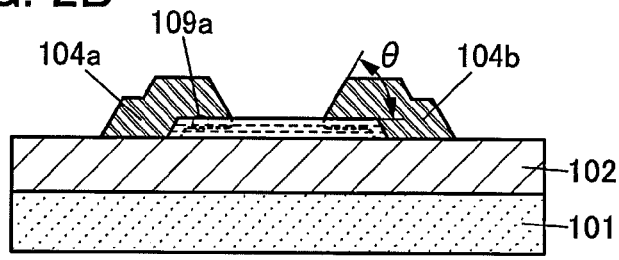
Figure 2C:
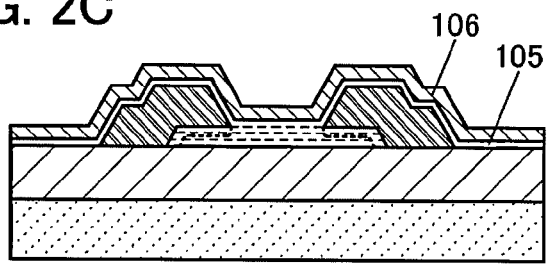

Then, part of the conductive layer is selectively etched using the resist mask, so that the source electrode 104a and the drain electrode 104b (including other electrodes and wirings formed in the same layer) are formed (see FIG. 2B). The etching of the conductive layer may be performed by either one or both of a dry etching method and a wet etching method. After that, the resist mask is removed.

It is preferable that the source electrode 104a and the drain electrode 104b (including other electrodes and wirings formed in the same layer) each have an edge having a tapered shaped. Specifically, the edge has a taper angle θ of 80° or less, preferably 60° or less, further preferably 45° or less.

When the cross-section of each of the edges of the source electrode 104a and the drain electrode 104b (including other electrodes and wirings formed in the same layer) has a step-like shape including a plurality of steps, the coverage of a layer covering the source electrode 104a and the drain electrode 104b can be improved. The above is not limited to the source electrode 104a and the drain electrode 104b, and by providing a forward taper shape or a step-like shape for a cross section of the edge of each layer, a phenomenon in that a layer formed to cover the edge is separated (disconnection) at the edge can be prevented, so that the coverage becomes favorable.

[1-2-4. Formation of Oxide Layer in Contact with Stack and Formation of Gate Insulating Layer]

Next, the oxide layer 105 is formed in contact with the source electrode 104a, the drain electrode 104b, and part of the stack 103, and then the insulating layer 106 is formed over the oxide layer 105.

In a manner similar to the case of the oxide layer 103c, a 5-nm-thick In—Ga—Zn oxide layer having an atomic ratio of In:Ga:Zn=1:3:2 is formed as the oxide layer 105. As the insulating layer 106, a 20-nm-thick silicon oxynitride layer is formed by a plasma CVD method (see FIG. 2C).

[1-2-5. Formation of Gate Electrode]

Next, a conductive layer to be the gate electrode 107 is formed. Here, the conductive layer is a stack of tantalum nitride and tungsten. Specifically, a 30-nm-thick tantalum nitride layer is formed over the insulating layer 106 by a sputtering method and a 135-nm-thick tungsten layer is formed over the tantalum nitride layer by a sputtering method.

Figure 2D:
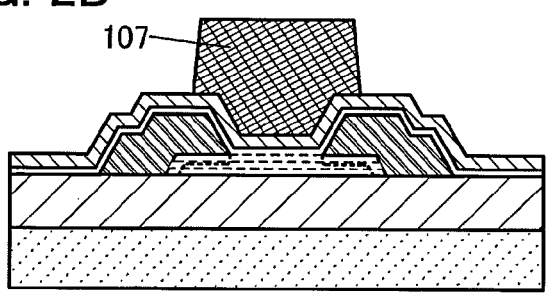
Figure 2E:
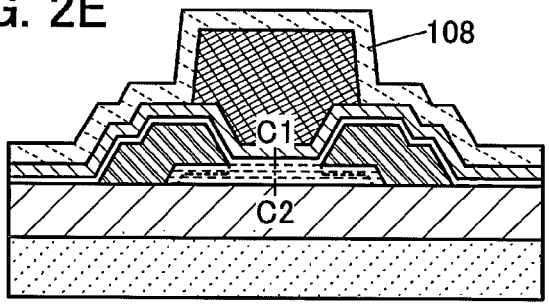

Then, part of the conductive layer is selectively etched using a resist mask, so that the gate electrode 107 (including other electrodes and wirings formed in the same layer) is formed (see FIG. 2D). The etching of the conductive layer may be performed by either one or both of a dry etching method and a wet etching method. After that, the resist mask is removed.

[1-2-6. Formation of Protective Insulating Layer]

Next, the insulating layer 108 serving as a protective insulating film which covers the gate electrode 107, the source electrode 104a, the drain electrode 104b, and the stack 103 is formed. Here, a 50-nm-thick silicon nitride layer is formed by a plasma CVD method.

After the insulating layer 108 is formed, treatment for adding oxygen to the insulating layer 108 may be performed. The treatment for adding oxygen can be performed with an ion doping apparatus or a plasma treatment apparatus.

Next, heat treatment is preferably performed. The heat treatment can be performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidation gas at 10 ppm or more, preferably 1% or more or 10% or more, or under reduced pressure. Alternatively, the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate detached oxygen. By the heat treatment, excess oxygen is released from at least any one of the insulating layer 102, the insulating layer 106, and the insulating layer 108; thus, oxygen vacancies in the stack 103 can be reduced. Note that in the stack 103, an oxygen vacancy captures an adjacent oxygen atom, so that the oxygen vacancy seems to move. Therefore, excess oxygen can reach the oxide semiconductor layer 103b through the oxide layer 103a, the oxide layer 103c, the oxide layer 105, or the like.

In the above manner, the transistor can be manufactured.

[1-3. Physical Property Analysis of Stack]

Here, results of physical property analysis of the stack described in this embodiment are described.

[1-3-1. Silicon Concentration of Stack]

First, the silicon concentration of each of the layers included in the stack 103 is described with reference to FIG. 7.

Here, the oxide layer 103a is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a sputtering gas, the pressure was set to 0.4 Pa, the substrate temperature was set to 200° C., and a DC power of 0.5 kW was applied.

The oxide semiconductor layer 103b is an oxide semiconductor layer formed by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a sputtering gas, the pressure was set to 0.4 Pa, the substrate temperature was set to 300° C., and a DC power of 0.5 kW was applied.

The oxide layer 103c is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a sputtering gas, the pressure was set to 0.4 Pa, the substrate temperature was set to 200° C., and a DC power of 0.5 kW was applied.

The stack 103 is provided over a silicon wafer, and a sample not subjected to heat treatment and a sample subjected to heat treatment at 450° C. for two hours are prepared. The secondary ion intensities of In, Ga, and Zn in a depth direction, and the Si concentration (atoms/cm$^3$) in a depth direction of the samples measured by ToF-SIMS (Time-of-flight secondary ion mass spectrometry) are shown. The stack 103 includes the oxide layer 103a having a thickness of 10 nm, the oxide semiconductor layer 103b having a thickness of 10 nm over the oxide layer 103a, and the oxide layer 103c having a thickness of 10 nm over the oxide semiconductor layer 103b.

Figure 7:
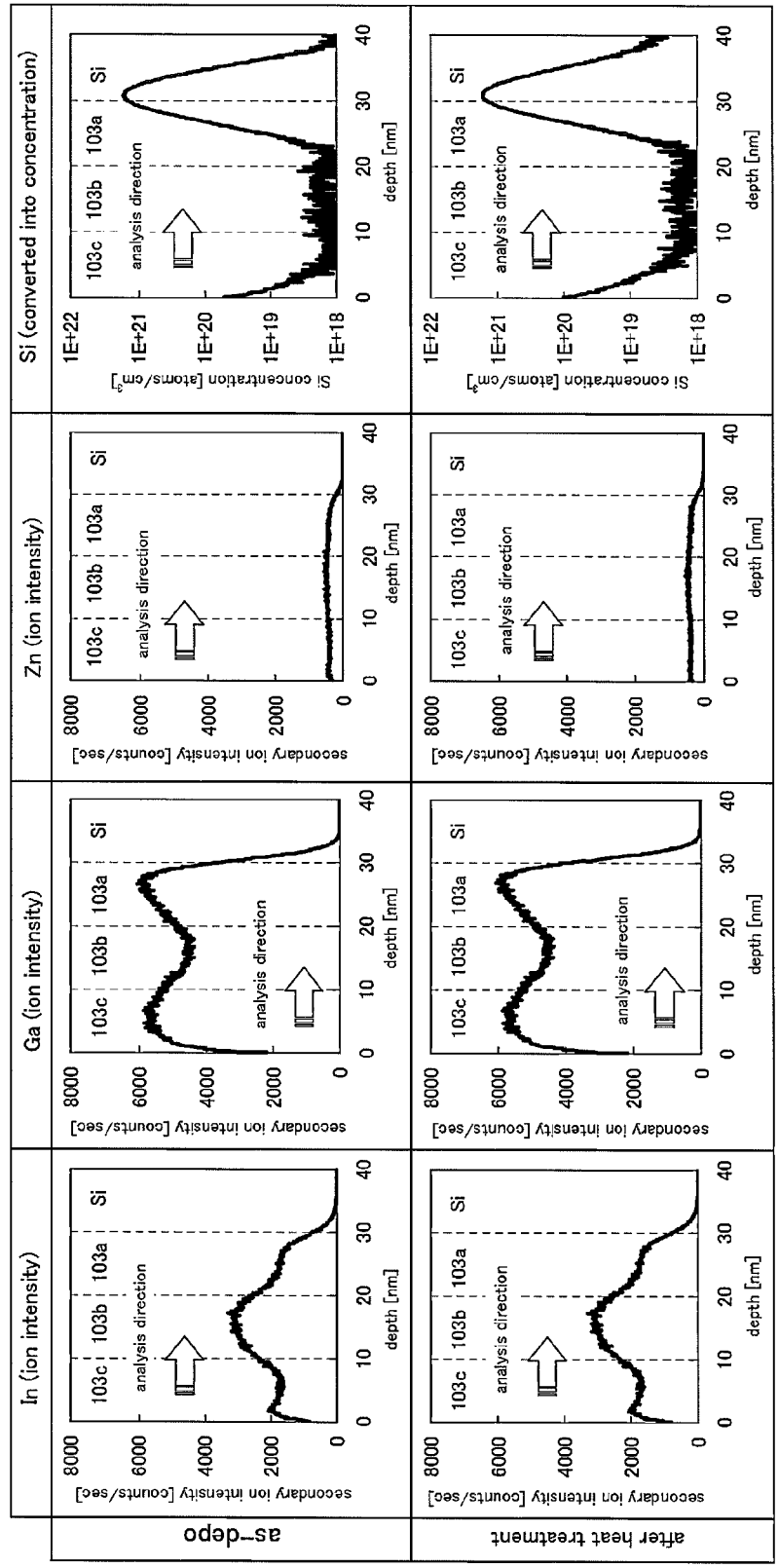
FIG. 7 shows ToF-SIMS analysis results of a stack.

FIG. 7 shows that the compositions of the layers included in the stack 103 are changed depending on the compositions of the respective targets used at the time of the deposition. Note that the compositions of the layers cannot be simply compared using FIG. 7.

FIG. 7 indicates that the interface between the silicon wafer and the oxide layer 103a of the stack 103 and the top surface of the oxide layer 103c have high Si concentrations. Moreover, FIG. 7 shows that the concentration of Si in the oxide semiconductor layer 103b is about $1\times10^{18}$ atoms/cm$^3$, which is the lower limit of detection in ToF-SIMS. This is probably because, owing to the existence of the oxide layers 103a and 103c, the oxide semiconductor layer 103b is not influenced by silicon due to the silicon wafer or the surface contamination.

Further, comparison of the sample subjected to the heat treatment with an as-deposited sample (the sample not subjected to heat treatment, referred to as "as-depo" in FIG. 7) indicates that silicon is not likely to be diffused through the heat treatment though entry of silicon occurs at the time of deposition.

Since the oxide semiconductor layer 103b is provided between the oxide layer 103a and the oxide layer 103c so as not to be in direct contact with the insulating layer containing silicon, silicon in the insulating layer can be prevented from entering the oxide semiconductor layer 103b.

[1-3-2. CPM Measurement of Localized State]

Next, results of measurement of the density of localized states of the stack 103 by a constant photocurrent method (CPM) are described. By reducing the density of the localized states of the stack 103, the transistor including the stack 103 can have stable electrical characteristics.

In order that the transistor has high field-effect mobility and stable electrical characteristics, the absorption coefficient due to localized states of the stack 103 measured by CPM is preferably lower than $1\times10^{-3}$ cm$^{-1}$, further preferably lower than $3\times10^{-4}$ cm$^{-1}$.

A sample on which CPM measurement was performed is described below.

The oxide layer 103a is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

The oxide semiconductor layer 103b is an oxide semiconductor layer formed by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

The oxide layer 103c is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

Here, in order to improve the accuracy of the CPM measurement, the stack 103 needs to have a certain thickness. Specifically, the thicknesses of the oxide layer 103a, the oxide semiconductor layer 103b, and the oxide layer 103c which are included in the stack 103 were set to 30 nm, 100 nm, and 30 nm, respectively.

In the CPM measurement, the amount of light with which a surface of the sample between terminals is irradiated is adjusted so that a photocurrent value is kept constant in the state where voltage is applied between a first electrode and a second electrode provided in contact with the stack 103 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

Figure 8A:
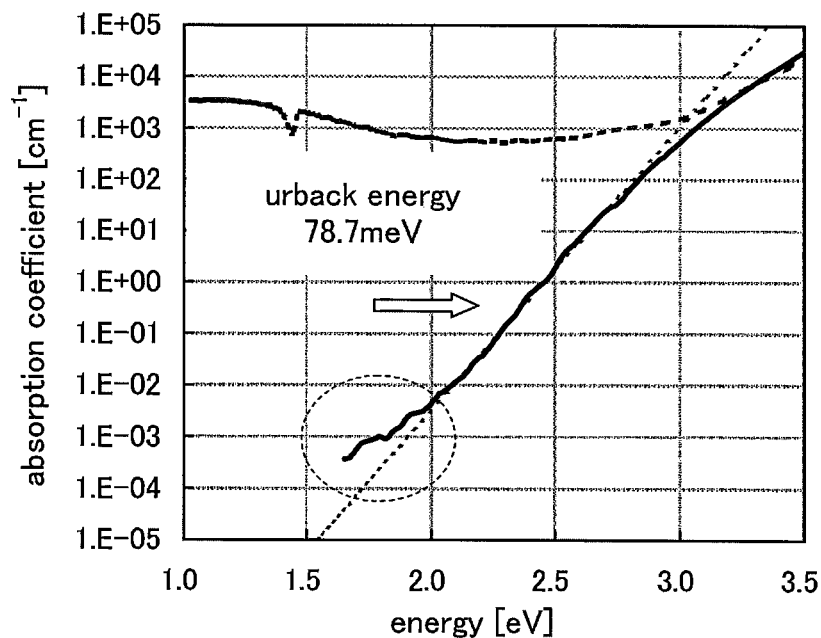
FIGS. 8A and 8B each show CPM measurement results of a stack.
Figure 8B:
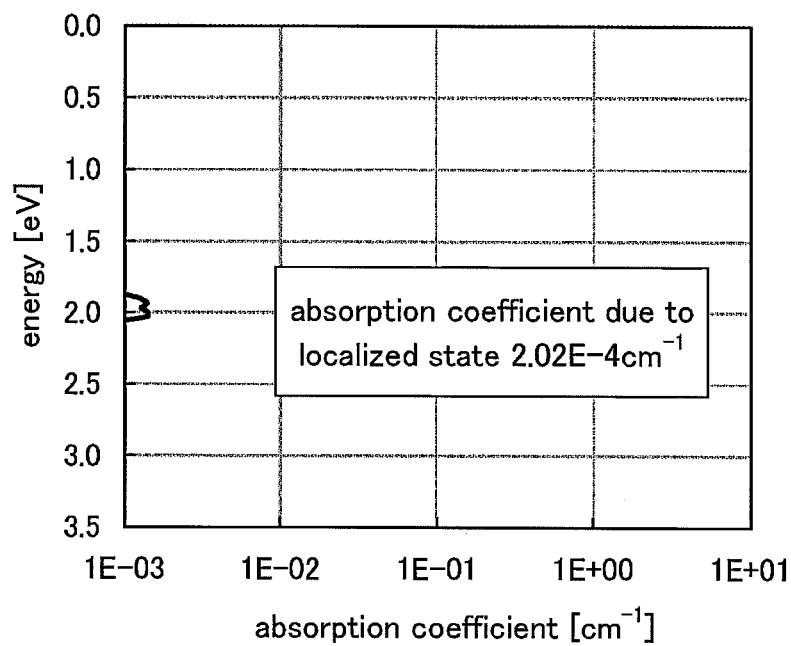

FIG. 8A shows results of fitting the absorption coefficient (dotted line) measured using a spectrophotometer and the absorption coefficient (solid line) measured by CPM in the range of energy higher than or equal to the energy gap of each layer in the stack 103. Note that the Urbach energy obtained based on the absorption coefficient measured by CPM was 78.7 meV. The integral value of the absorption coefficient in the energy range was derived in such a manner that a background (thin dotted line) was subtracted from the absorption coefficient measured by CPM in the energy range shown with a dashed line circle in FIG. 8A (see FIG. 8B). As a result, the absorption coefficient due to the localized states of this sample was found to be $2.02\times10^{-4}$ cm$^{-1}$.

The localized states obtained here are probably due to an impurity or a defect. From the above, the stack 103 has an extremely low density of states due to an impurity or a defect. That is, the transistor including the stack 103 has high field-effect mobility and stable electrical characteristics.

[1-3-3. Energy Band Structure of Stack]

Figure 9A:
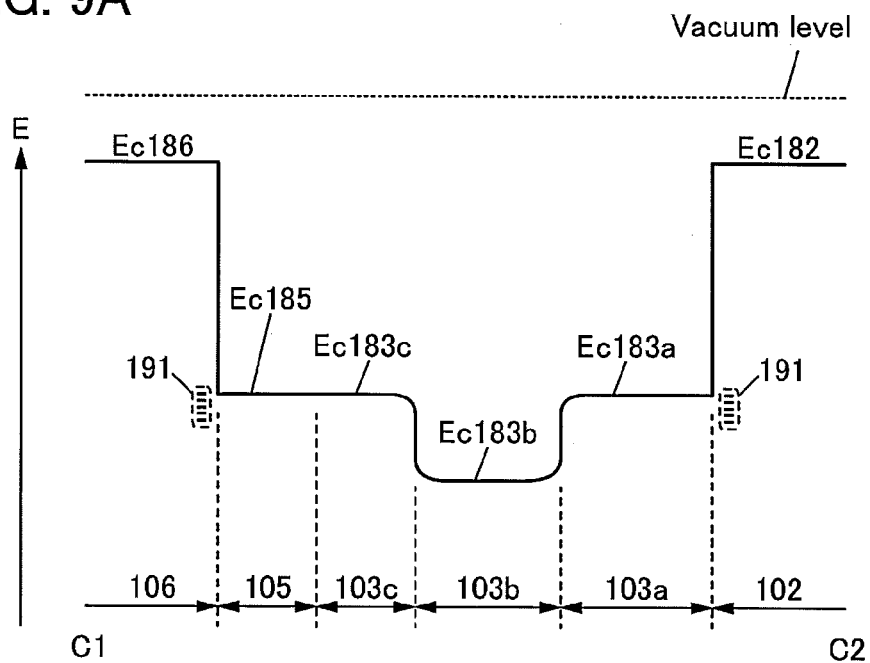
FIGS. 9A and 9B each illustrate an energy band structure of a stack.
Figure 9B:
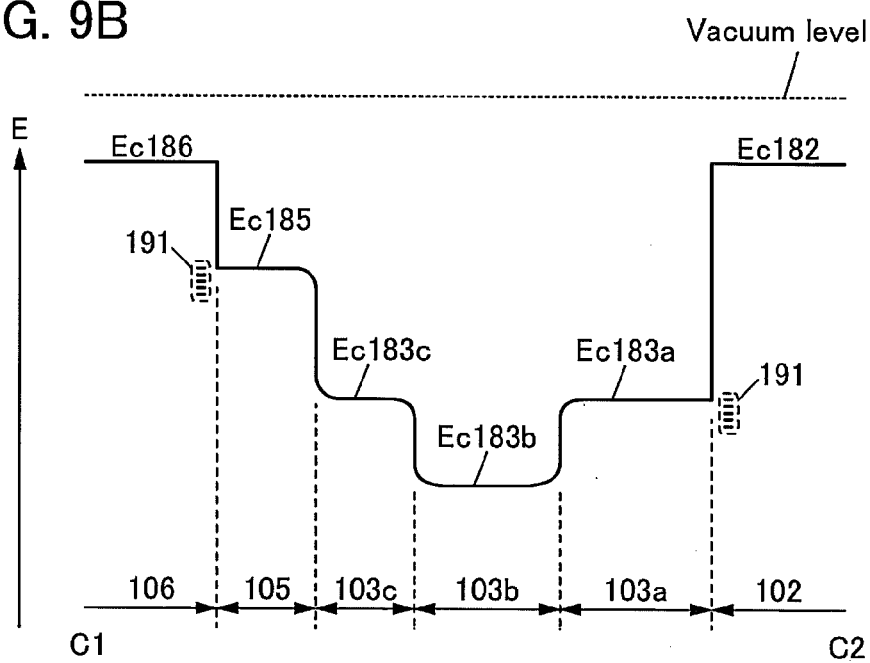

A function and an effect of the stack 103 in this embodiment are described using energy band structure diagrams of FIGS. 9A and 9B. FIGS. 9A and 9B each illustrate the energy band structure of a portion along a dashed dotted line C1-C2 in FIG. 2E. FIGS. 9A and 9B each illustrate the energy band structure of a channel formation region of the transistor 100.

In FIGS. 9A and 9B, Ec182, Ec183a, Ec183b, Ec183c, Ec185, and Ec186 are the energies of bottoms of the conduction band in the insulating layer 102, the oxide layer 103a, the oxide semiconductor layer 103b, the oxide layer 103c, the oxide layer 105, and the insulating layer 106, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON SAS.). Further, the difference in energy between the vacuum level and the top of the valence band can be measured using an ultraviolet photoelectron spectroscopy (UPS) device (VersaProbe manufactured by ULVAC-PHI, Inc.).

Since the insulating layer 102 and the insulating layer 106 are insulators, Ec182 and Ec186 are closer to the vacuum level (have a smaller electron affinity) than Ec183a, Ec183b, Ec183c, and Ec185.

Further, Ec183a is closer to the vacuum level than Ec183b. Specifically, Ec183a is located closer to the vacuum level than Ec183b by 0.05 eV or more, 0.07 eV or more, 0.1 eV or more, or 0.15 eV or more and 2 eV or less, 1 eV or less, 0.5 eV or less, or 0.4 eV or less.

Further, Ec183c is closer to the vacuum level than Ec183b. Specifically, Ec183c is located closer to the vacuum level than Ec183b by 0.05 eV or more, 0.07 eV or more, 0.1 eV or more, or 0.15 eV or more and 2 eV or less, 1 eV or less, 0.5 eV or less, or 0.4 eV or less.

The oxide layer 105 and the oxide layer 103c are formed using the same material in this embodiment; therefore, Ec185 and Ec183c are at the same level. The energy of the bottom of the conduction band continuously changes between the oxide layer 103a and the oxide semiconductor layer 103b, between the oxide semiconductor layer 103b and the oxide layer 103c, and between the oxide semiconductor layer 103b and the oxide layer 103d. That is, no interface state or few interface states exist at these interfaces.

Accordingly, electrons transfer mainly through the oxide semiconductor layer 103b in the stack 103 having the above energy band structure. Therefore, even when an interface state exists at an interface with the insulating film that is the outside of the stack 103, the interface state hardly influences the transfer of the electrons. In addition, since no interface state or few interface states exist between the layers included in the stack 103, the transfer of electrons is not interrupted in the region. Accordingly, the oxide semiconductor layer 103b of the stack 103 has high electron mobility.

Note that although the trap states 191 due to impurities or defects might be formed in the vicinity of the interface between the oxide layer 103a and the insulating layer 102 and in the vicinity of the interface between the oxide layer 105 and the insulating layer 106 as illustrated in FIG. 9A, the oxide semiconductor layer 103b can be separated from the trap states owing to the existence of the oxide layer 103a, the oxide layer 103c, and the oxide layer 105.

Meanwhile, as described above, in order to reduce contact resistance between the oxide semiconductor layer 103b and each of the source and drain electrodes 104a and 104b in the regions where the source and drain electrodes 104a and 104b overlap with the stack 103, it is preferable that the oxide layer 103c be as thin as possible. However, when the oxide layer 103c is thin, there is a problem in that the oxide semiconductor layer 103b in the channel formation region is easily influenced by trap states 191 on the insulating layer 106 side.

Thus, in this embodiment, the oxide layer 105 is provided between the oxide layer 103c and the insulating layer 106. By providing the oxide layer 105 between the oxide layer 103c and the insulating layer 106, the oxide semiconductor layer 103b in the channel formation region can be separated from the trap states 191 on the insulating layer 106 side; therefore, the oxide semiconductor layer 103b is not likely to be influenced by the trap states 191.

However, in the case where an energy difference between Ec183a or Ec183c and Ec183b is small, electrons in the oxide semiconductor layer 103b might reach the trap state by passing over the energy gap. Since the electron is trapped at the trap state, a negative fixed charge is generated at the interface with the insulating film, causing the threshold voltage of the transistor to be shifted in the positive direction.

Therefore, each of the energy differences between Ec183a and Ec183b and between Ec183c and Ec183b is preferably set to be larger than or equal to 0.1 eV, further preferably larger than or equal to 0.15 eV, in which case a change in the threshold voltage of the transistor can be reduced and the transistor can have favorable electrical characteristics.

The oxide layer 103c and the oxide layer 105 are formed using an In—Ga—Zn oxide having an atomic ratio of In:Ga:Zn=1:3:2 in this embodiment; however, as the oxide layer 105, a material whose energy of the conduction band is closer the vacuum level than that of the conduction band in the oxide semiconductor layer 103c may be used (see FIG. 9B).

Specifically, in the case where an In—Ga—Zn oxide having an atomic ratio of In:Ga:Zn=1:3:2 is used as the oxide layer 103c, for example, an In—Ga—Zn oxide having an atomic ratio of In:Ga:Zn=1:6:4 or 1:9:4 may be used as the oxide layer 105.

In other words, in the case where the oxide layer 105 and the oxide layer 103c are each formed using an In-M-Zn oxide, the atomic ratio of the element M to In of the oxide layer 105 may be larger that of the oxide layer 103c.

Note that a band gap of each of the oxide layer 103a, the oxide layer 103c, and the oxide layer 105 is preferably wider than that of the oxide semiconductor layer 103b.

FIG. 9B illustrates an energy band structure diagram in the case where the oxide layer 105 is formed using an In—Ga—Zn oxide having an atomic ratio of In:Ga:Zn=1:6:4. With the energy band structure illustrated in FIG. 9B, the transistor can have more favorable electrical characteristics.

FIG. 10A illustrates an energy band structure diagram in the case where the oxide layer 103a is formed using an In—Ga—Zn oxide which is formed using a target having an atomic ratio of In:Ga:Zn=1:6:4, the oxide semiconductor layer 103b is formed using an In—Ga—Zn oxide which is formed using a target having an atomic ratio of In:Ga:Zn=1:1:1, and the oxide layer 103c and the oxide layer 105 are each formed using an In—Ga—Zn oxide which is formed using a target having an atomic ratio of In:Ga:Zn=1:3:2.

FIG. 10B illustrates an energy band structure diagram in the case where the oxide layer 103a is formed using an In—Ga—Zn oxide which is formed using a target having an atomic ratio of In:Ga:Zn=1:6:4, the oxide semiconductor layer 103b is formed using an In—Ga—Zn oxide which is formed using a target having an atomic ratio of In:Ga:Zn=1:1:1, the oxide layer 103c is formed using an In—Ga—Zn oxide which is formed using target having an atomic ratio of In:Ga:Zn=1:3:2, and the oxide layer 105 is formed using an In—Ga—Zn oxide which is formed using having an atomic ratio of In:Ga:Zn=1:6:4.

This embodiment can be implemented in appropriate combination with the structures described in the other embodiments.

(Embodiment 2)

In this embodiment, a transistor 150 which has a different structure from the transistor 100 described in the above embodiment is described.

[2-1. Structural Example of Semiconductor Device]

FIGS. 11A to 11C illustrate the transistor 150 of one embodiment of a semiconductor device. FIG. 11A is a top view of the transistor 150. FIG. 11B is a cross-sectional view of a portion denoted by a dashed dotted line A3-A4 in FIG. 11A and FIG. 11C is a cross-sectional view of a portion denoted by a dashed dotted line B3-B4 in FIG. 11A.

The transistor 150 is a top-gate transistor. The transistor 150 has substantially the same structure as the transistor 100 except the shapes of the insulating layer 106 and the oxide layer 105 in a cross-sectional structure.

The transistor 150 has a structure in which part of the insulating layer 106 and part of the oxide layer 105 which do not overlap with the gate electrode 107 are removed. Such a structure can prevent an increase in leakage current between adjacent wirings even when oxygen vacancies are unintentionally formed in the oxide layer 105; accordingly, the reliability of the semiconductor device can be increased.

[2-2. Example of Method for Manufacturing Semiconductor Device]

The selective removal of the insulating layer 106 and the oxide layer 105 may be performed using the gate electrode 107 as a mask after formation of the gate electrode 107. Part of the insulating layer 106 and part of oxide layer 105 can be selectively removed by a dry etching method or a wet etching method using the gate electrode 107 as a mask.

Note that the etching of the insulating layer 106 and the oxide layer 105 may be performed successively after the conductive layer to be the gate electrode 107 is etched before the resist mask for forming the gate electrode 107 is removed.

This embodiment can be implemented in appropriate combination with the structures described in the other embodiments.

(Embodiment 3)

In this embodiment, a transistor 160 which has a different structure from the transistor described in the above embodiment is described.

[3-1. Structural Example of Semiconductor Device]

Figure 12A:
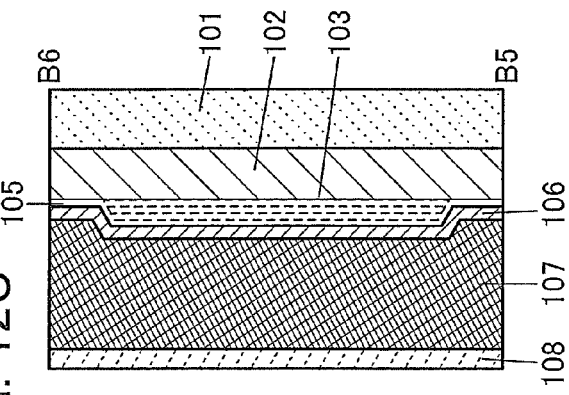
FIGS. 12A to 12C are a top view and cross-sectional views illustrating an example of a semiconductor device.
Figure 12C:
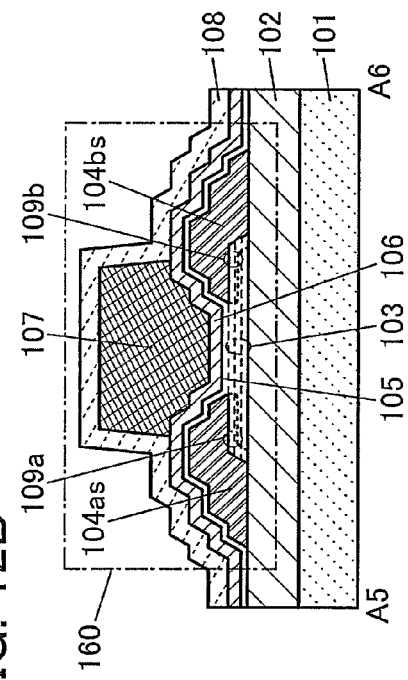
Figure 12B:
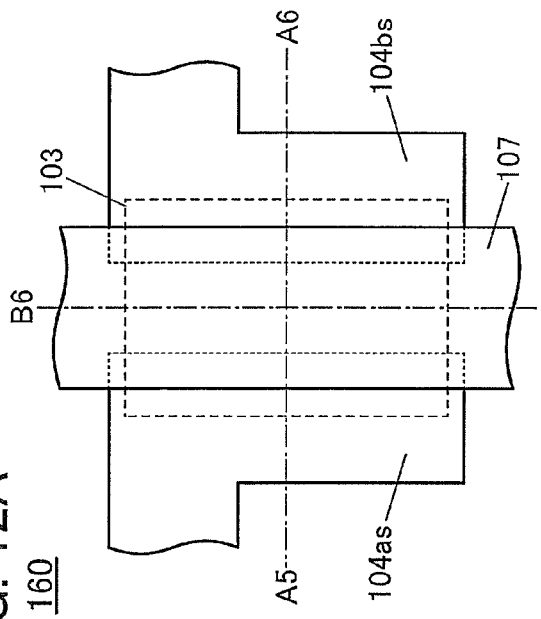

FIGS. 12A to 12C illustrate the transistor 160 of one embodiment of the present invention. FIG. 12A is a top view of the transistor 160. FIG. 12B is a cross-sectional view of a portion denoted by a dashed dotted line A5-A6 in FIG. 12A, and FIG. 12C is a cross-sectional view of a portion denoted by a dashed dotted line B5-B6 in FIG. 12A.

The transistor 160 is a top-gate transistor. The transistor 160 has substantially the same structure as the transistor 100 except the cross-sectional shapes of a source electrode and a drain electrode.

The edges of a source electrode 104*as* and a drain electrode 104*bs* in the transistor 160 each have a step-like shape. The step-like edges of the source electrode 104*as* and the drain electrode 104*bs* can lead to an improvement in coverage with a layer to be formed over the source electrode 104*as* and the drain electrode 104*bs*. Accordingly, the reliability of the semiconductor device can be improved.

Although FIGS. 12A to 12C illustrate the case where the edges of the source electrode 104*as* and the drain electrode 104*bs* each have two steps, each of the edges may have three or more steps.

[3-2. Example of Method for Manufacturing Semiconductor Device]

Next, an example of a method for manufacturing the transistor 160 is described with reference to cross-sectional views illustrated in FIGS. 13A to 13D. The transistor 160 can be manufactured by a method similar to that of the transistor 100; therefore, different steps from those of the transistor 100 are described in this embodiment.

Figure 13A:
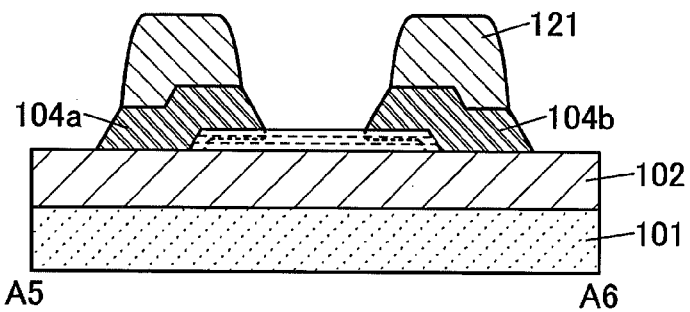
FIGS. 13A to 13D are cross-sectional views illustrating an example of a method for manufacturing a semiconductor device.
Figure 13B:
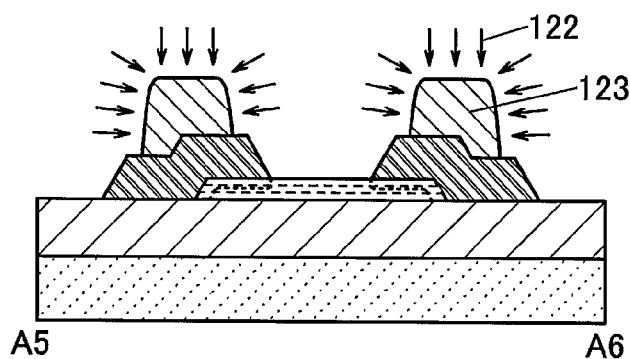
Figure 13C:
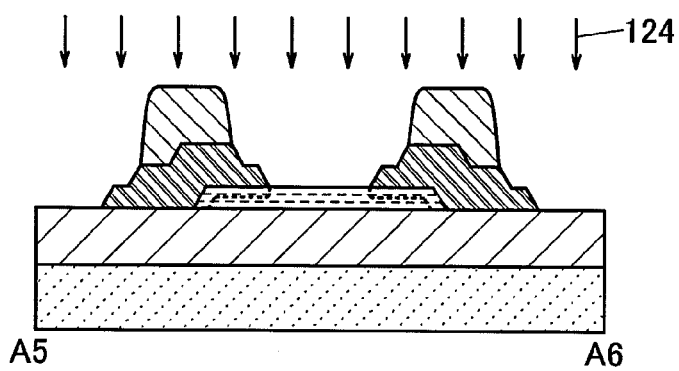
Figure 13D:
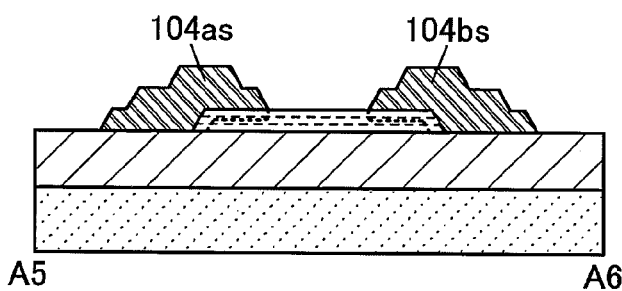

FIG. 13A is a cross-sectional view showing the state after the source electrode 104*a* and the drain electrode 104*b* are formed in a manner similar to that of the transistor 100 before a resist mask 121 is removed. After that, the resist mask 121 is reduced by oxygen plasma 122 or the like to form a resist mask 123. By the reduction of the resist mask 121, part of surfaces of the source electrode 104*a* and the drain electrode 104*b* is exposed (see FIG. 13B).

Next, part of the source electrode 104*a* and part of the drain electrode 104*b* which are not covered with the resist mask 123 are etched. The etching is preferably performed by an anisotropy dry etching method. As an etching gas 124, a gas similar to that described in the above embodiment can be used. A depth of the etching is preferably greater than or equal to 20% and less than or equal to 80%, further preferably greater than or equal to 40% and less than or equal to 60% of the thickness of the source electrode 104*a* and the drain electrode 104*b* (see FIG. 13C).

After that, the resist mask 123 is removed. In this manner, the source electrode 104*as* and the drain electrode 104*bs* having the step-like edges can be formed (see FIG. 13D).

Note that by using the above method repeatedly, the number of steps included in the edges of the source electrode 104*as* and the drain electrode 104*bs* can be increased.

This embodiment can be implemented in appropriate combination with the structures described in the other embodiments.

(Embodiment 4)

In this embodiment, a transistor 170 which has a different structure from the transistor described in the above embodiment is described.

[4-1. Structural Example of Semiconductor Device]

FIGS. 14A to 14C illustrate the transistor 170 of one embodiment of the present invention. FIG. 14A is a top view of the transistor 170. FIG. 14B is a cross-sectional view of a portion denoted by a dashed dotted line A7-A8 in FIG. 14A, and FIG. 14C is a cross-sectional view of a portion denoted by a dashed dotted line B7-B8 in FIG. 14A.

The transistor 170 is a top gate transistor. The transistor 170 is substantially the same structure as the transistor 160 except that a source electrode 164*a* is formed over the source electrode 104*as* and a drain electrode 164*b* is formed over the drain electrode 104*bs*.

As described in the above embodiment, when a material which enables oxygen vacancies to be generated in the stack 103 is used for the source electrode 104*a* (the source electrode 104*as*) and the drain electrode 104*b* (the drain electrode 104*bs*), an oxygen vacancy is generated in the vicinity of regions of the stack 103 in contact with the source electrode 104*a* (the source electrode 104*as*) and the drain electrode 104*b* (the drain electrode 104*bs*), so that the regions become n-type to serve as a source and a drain of the transistor.

However, in the case of forming a transistor with an extremely short channel length, the n-type region which is formed by the generation of the oxygen vacancies sometimes extends in the channel length direction of the transistor. In this case, the following phenomena and the like occur as for the electrical characteristics of the transistor: the threshold voltage is changed; the source and the drain are brought into conduction so that on/off state of the transistor cannot be controlled. Accordingly, when a transistor with an extremely short channel length is formed, it is not preferable that the conductive material which is easily bonded to oxygen be used for a source electrode and a drain electrode.

For this reason, a distance between the source electrode 104*as* and the drain electrode 104*bs* illustrated as L1 in FIG. 14B is 0.8 μm or longer, preferably, 1.0 μm or longer. When L1 is shorter than 0.8 μm, it is possible that an adverse effect of oxygen vacancies generated in the channel formation region cannot be prevented and electrical characteristics of the transistor are degraded. Note that L1 can be regarded as the shortest distance between the edge of the source electrode 104*as* (the source electrode 104*a*) and the edge of the drain electrode 104*bs* (the drain electrode 104*b*) which are in contact with the stack 103 and face each other.

Thus, in the transistor 170, the source electrode 164*a* is formed to be in contact with the source electrode 104*a* and the stack 103, using a conductive material which is not likely to be bonded to oxygen. Further, the drain electrode 104*bs* is formed to be in contact with the drain electrode 104*b* and the stack 103, using the conductive material which is not likely to be bonded to oxygen.

The source electrode 164*a* extends beyond the edge of the source electrode 104*as* in contact with the stack 103 in a direction of L1, and the drain electrode 164*b* extends beyond the edge of the drain electrode 104*bs* in contact with the stack 103 in the direction of L1.

The extended portion of the source electrode 164*a* and the extended portion of the drain electrode 164*b* are in contact with the stack 103. In the transistor 170 illustrated in FIGS. 14A to 14C, a distance between an end portion of the extended portion of the source electrode 164*a*, the end portion being in contact with the stack 103 and an end portion of the extended portion of the drain electrode 164*b*, the end portion being in contact with the stack 103 corresponds to the channel length. The channel length is illustrated as L2 in FIG. 14B.

As the conductive material which is not likely to be bonded to oxygen and is used to form the source electrode 164*a* and the drain electrode 164*b*, for example, a conductive nitride such as tantalum nitride or titanium nitride, or ruthenium is preferably used. Note that the conductive material which is not likely to be bonded to oxygen includes, in its category, a material to which oxygen is not easily diffused. The thickness of the conductive material is preferably greater than or equal to 5 nm and less than or equal to 500 nm, further preferably greater than or equal to 10 nm and less than or equal to 300 nm, still further preferably greater than or equal to 10 nm and less than or equal to 100 nm.

By the use of the above conductive material which is not likely to be bonded to oxygen for the source electrode 164*a* and the drain electrode 164b, generation of oxygen vacancies in the channel formation region of the stack 103 can be suppressed, so that change of the channel formation region into an n-type can be prevented. Accordingly, even a transistor with an extremely short channel length can have favorable electrical characteristics. That is, L2 can be smaller than L1; for example, even when L2 is 30 nm or shorter, the transistor can show favorable electrical characteristics.

Note that conductive nitride such as tantalum nitride or titanium nitride might occlude hydrogen. Therefore, when conductive nitride is provided in contact with the stack 103, the hydrogen concentration of the stack 103 can be reduced.

[4-2. Example of Method for Manufacturing Semiconductor Device]

Next, an example of a method for manufacturing the transistor 170 is described. The transistor 170 can be manufactured by a method similar to that of the transistor 100, the transistor 160, or the like; therefore, different steps from those of the other transistors are described in this embodiment.

After formation up to the source electrode 104a (the source electrode 164a) and the drain electrode 104b (the drain electrode 164b) is performed in a manner similar to those of the other transistors, a 20-nm-thick tantalum nitride layer is formed by a sputtering method.

After that, a resist mask is formed over the tantalum nitride layer by a photolithography method or the like and part of the tantalum nitride layer is selectively etched, so that the source electrode 164a and the drain electrode 164b are formed. Note that the etching of the tantalum nitride may be performed by either one or both of a dry etching method or a wet etching method. After the etching, the resist mask is removed.

Note that when a transistor having an extremely short channel length is formed, the source electrode 164a and the drain electrode 164b may be formed in such a manner that a resist mask is formed by a method suitable for thin line processing, such as an electron beam exposure, and then etching treatment is performed. Note that by the use of a positive type resist for the resist masks, the exposed region can be minimized and throughput can be thus improved. In the above manner, a transistor having a channel length of 30 nm or less can be formed.

This embodiment can be implemented in appropriate combination with the structures described in the other embodiments.

(Embodiment 5)

In this embodiment, a transistor 180 which has a different structure from the transistor described in the above embodiment is described.

[5-1. Structural Example of Semiconductor Device]

Figure 15C:
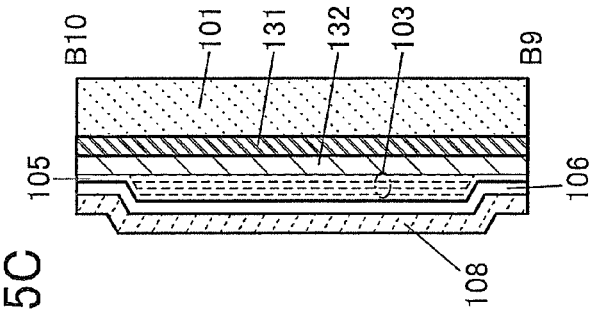
FIGS. 15A to 15C are a top view and cross-sectional views illustrating an example of a semiconductor device.
Figure 15A:
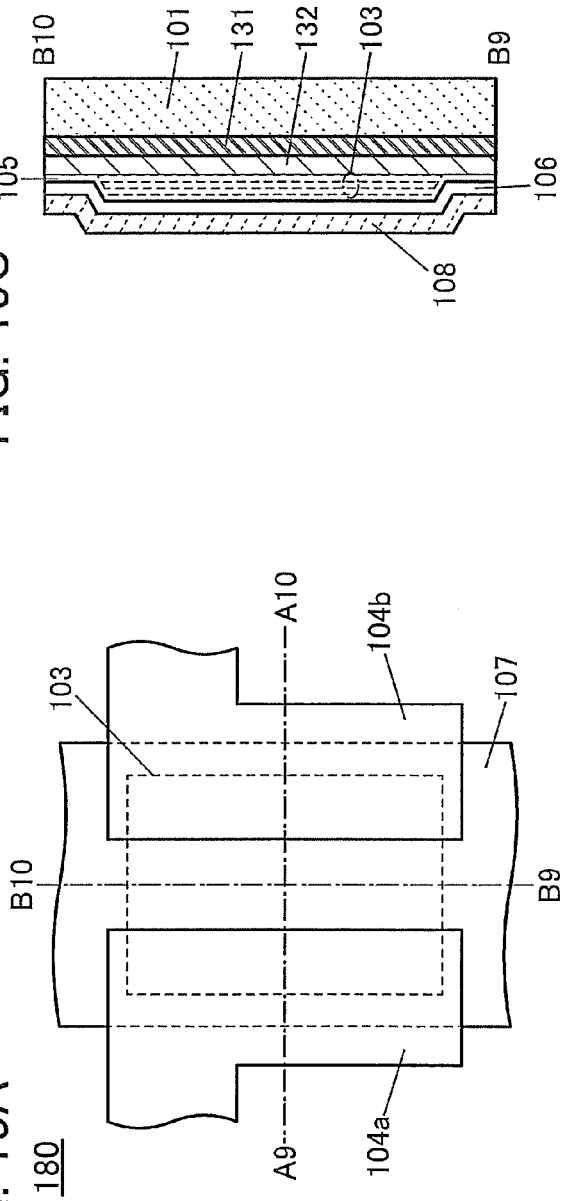
Figure 15B:
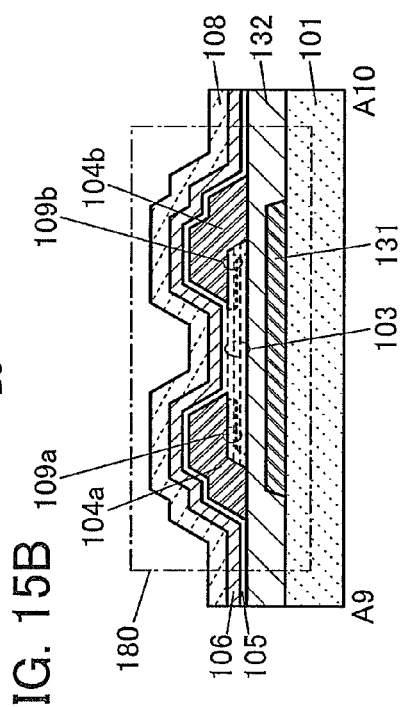

FIGS. 15A to 15C illustrate the transistor 180 of one embodiment of the present invention. FIG. 15A is a top view of the transistor 180. FIG. 15B is a cross-sectional view of a portion denoted by a dashed dotted line A9-A10 in FIG. 15A, and FIG. 15C is a cross-sectional view denoted by a dashed dotted line B9-B10 in FIG. 15A. Note that for portions having the same structures as those of the above transistors, the descriptions of other embodiments are used; therefore, descriptions of the portions are omitted in this embodiment.

The transistor 180 is a bottom-gate transistor. The transistor 180 includes a gate electrode 131 formed over the substrate 101 and an insulating layer 132 formed over the gate electrode 131. Further, the transistor 180 includes the stack 103 formed over the insulating layer 132 and the source and drain electrodes 104a and 104b formed over the stack 103. Furthermore, the transistor 180 includes the oxide layer 105 formed over the source electrode 104a, the drain electrode 104b, and the stack 103; the insulating layer 106 formed over the oxide layer 105; and the insulating layer 108 formed over the insulating layer 106. Note that an insulating layer serving as a base layer may be formed between the substrate 101 and the gate electrode 131.

[5-2. Example of Method for Manufacturing Semiconductor Device]

Next, an example of a method for manufacturing the transistor 180 is described. Note that steps after formation of the stack 103 can be performed in a manner similar to those described in the other embodiments except that the gate electrode 107 is not formed; therefore, description of the steps are omitted in this embodiment.

[5-2-1. Formation of Gate Electrode]

First, the gate electrode 131 is formed over the substrate 101. The gate electrode 131 can be formed using the same material and method as those of the gate electrode 107.

[5-2-2. Formation of Gate Insulating Layer]

Then, the insulating layer 132 is formed over the gate electrode 131. The insulating layer 132 can be formed using the same method and material as those of the insulating layer 102 or the insulating layer 106 described in the above embodiment. Note that to reduce surface roughness of the insulating layer 132, planarization treatment may be performed on the surface of the insulating layer 132. As the planarization treatment, etching treatment or the like can be employed instead of polishing treatment such as chemical mechanical polishing (hereinafter, also referred to as CMP treatment). CMP treatment and etching treatment may be performed in combination.

After the insulating layer 132 is formed, treatment for adding oxygen to the insulating layer 132 may be performed. The treatment for adding oxygen can be performed with an ion doping apparatus or a plasma treatment apparatus. As the ion doping apparatus, an ion doping apparatus with a mass separation function may be used. As a gas for adding oxygen, an oxygen gas of $^{16}O_2$, $^{18}O_2$, or the like, a nitrous oxide gas, an ozone gas, or the like can be used.

[5-2-3. Manufacturing Steps after Formation of Stack]

Sequentially, the stack 103 is formed over the insulating layer 132. As described above, manufacturing steps after the formation of the stack 103 can be performed in a manner similar to that described in the above embodiments except that the gate electrode 107 is not formed. Accordingly, the description in the other embodiments can be referred to for description of the manufacturing steps after the formation of the stack 103; therefore, the description of the manufacturing steps after the formation of the stack 103 is not made in this embodiment.

This embodiment can be implemented in appropriate combination with the structures described in the other embodiments.

(Embodiment 6)

In this embodiment, a transistor 190 which has a different structure from the transistor described in the above embodiment is described.

[6-1. Structural Example of Semiconductor Device]

FIGS. 16A to 16C illustrate the transistor 190 of one embodiment of the present invention. FIG. 16A is a top view of the transistor 190. FIG. 16B is a cross-sectional view of a portion denoted by a dashed dotted line A11-A12 in FIG. 16A, and FIG. 16C is a cross-sectional view denoted by a dashed dotted line B11-B12 in FIG. 16A. Note that for portions having the same structures as those of the above transistors, the descriptions of other embodiments are used; therefore, descriptions of the portions are omitted in this embodiment.

The transistor 190 described in this embodiment has a structure of a combination of the top-gate transistor 100 and the bottom-gate transistor 180. Specifically, the gate electrode 131 is formed over the substrate 101, the insulating layer 132 is formed over the gate electrode 131, and the transistor 100 is formed over the insulating layer 132.

In the transistor 190, the gate electrode 107 can be referred to as a first gate electrode, and the gate electrode 131 can be referred to as a second gate electrode. Further, the insulating layer 106 can be referred to as a first gate insulating layer, and the insulating layer 132 can be referred to as a second gate insulating layer.

In the transistor 190, one of the first gate electrode and the second gate electrode can function as a gate electrode, and the other thereof can function as a back gate electrode.

In general, the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Further, the gate electrode and the back gate electrode are formed using a conductive layer and thus have a function of preventing an electric field generated in the outside of the transistor from influencing the semiconductor layer in which the channel is formed (in particular, a function of preventing static electricity). That is, the variation in the electric characteristics of the transistor due to the influence of external electric field such as static electricity can be prevented. Further, when the back gate electrode is provided, the amount of change in the threshold voltage of the transistor before and after BT test can be reduced.

When the back gate electrode is formed using a light-blocking conductive layer, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

This embodiment can be implemented in appropriate combination with the structures described in the other embodiments.

(Embodiment 7)

In this embodiment, a semiconductor device including the transistor described in the above embodiment is described as an example.

[7-1. Microcomputer]

[7-1-1. Block Diagram of Microcomputer]

The transistor described above can be applied to microcomputers (hereinafter referred to as micro control units (MCUs)) which are mounted on variety of electronic appliances. A structural example of an MCU to which the above-described transistor is applicable is described with reference to FIG. 17.

Figure 17:
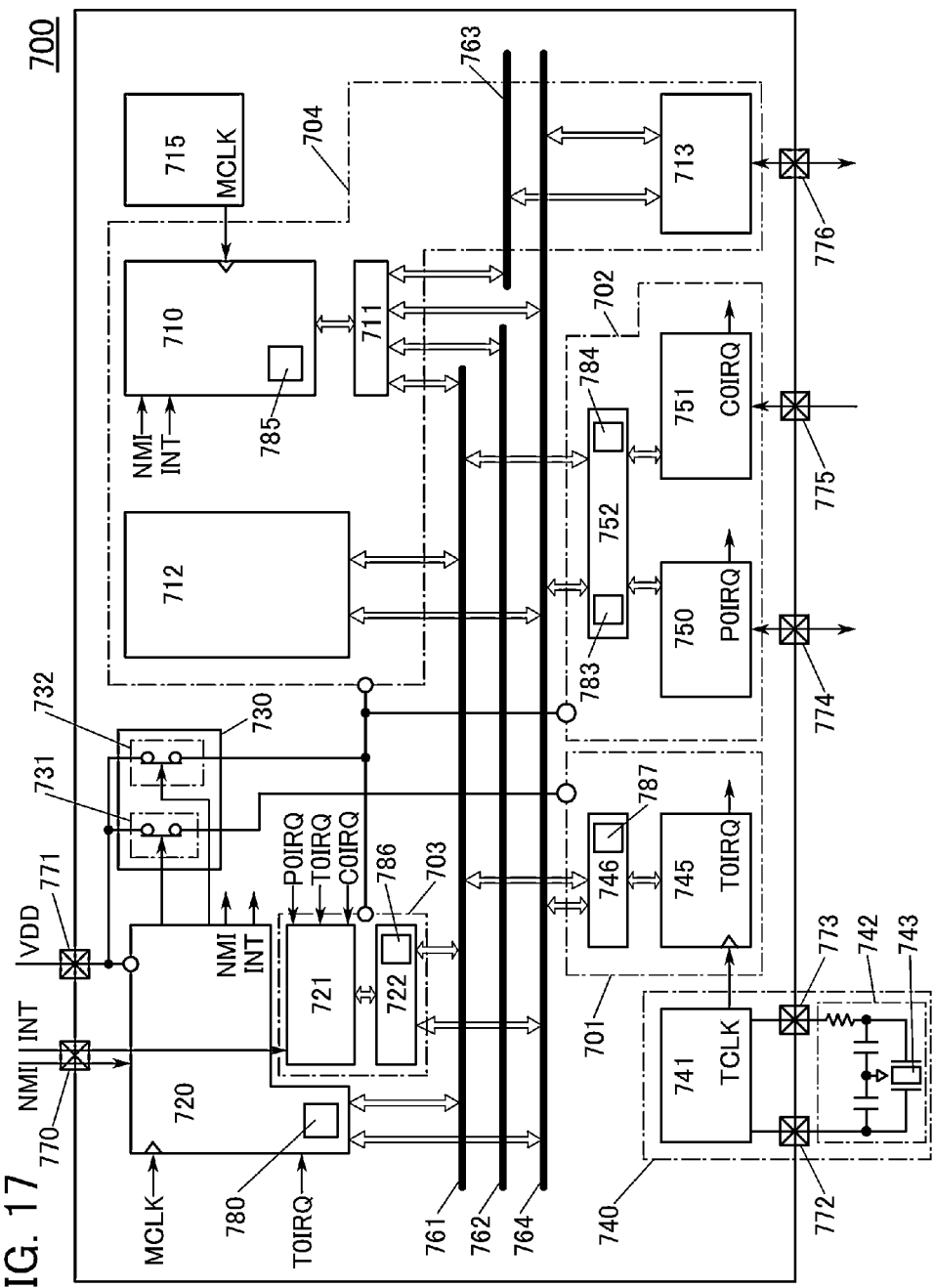
FIG. 17 is a block diagram illustrating a structural example of a MCU.

FIG. 17 is a block diagram of an MCU 700. The MCU 700 includes a CPU 710, a bus bridge 711, a RAM (random access memory) 712, a memory interface 713, a controller 720, an interrupt controller 721, an I/O interface (input-output interface) 722, and a power gate unit 730.

The MCU 700 further includes a crystal oscillation circuit 741, a timer circuit 745, an I/O interface 746, an I/O port 750, a comparator 751, an I/O interface 752, a bus line 761, a bus line 762, a bus line 763, and a data bus line 764. Further, the MCU 700 includes at least connection terminals 770 to 776 as portions for connection to an external device. Note that each of the connection terminals 770 to 776 represents one terminal or a terminal group including plural terminals. An oscillation unit 742 including a quartz crystal unit 743 is connected to the MCU 700 through the connection terminal 772 and the connection terminal 773.

The CPU 710 includes a register 785 and is connected to the bus lines 761 to 763 and the data bus line 764 through the bus bridge 711.

The RAM 712 is a memory device functioning as a main memory of the CPU 710 and is a nonvolatile random access memory. The RAM 712 is a device that stores an instruction to be executed by the CPU 710, data necessary for execution of the instruction, and data processed by the CPU 710. Under the instruction by the CPU 710, data is written into and read out from the RAM 712.

In the MCU 700 in a low power consumption mode, supply of power to the RAM 712 is blocked. Thus, the RAM 712 is made up of a nonvolatile memory that can store data when no power is supplied.

The memory interface 713 is an input-output interface with an external memory device. Under the instruction of the CPU 710, data is written into and read out from the external memory connected to the connection terminal 776 via the memory interface 713.

A clock generation circuit 715 is a circuit that generates a clock signal MCLK (hereinafter, also simply referred to as "MCLK") to be used in the CPU 710, and includes an RC oscillator and the like. MCLK is also output to the controller 720 and the interrupt controller 721.

The controller 720 is a circuit that controls the entire MCU 700, and controls, for example, a bus and a memory map; a power source of the MCU 700; the clock generation circuit 715; and the crystal oscillation circuit 741.

The connection terminal 770 is a terminal for inputting an external interrupt signal. A non-maskable interrupt signal NMI is input to the controller 720 through the connection terminal 770. As soon as the non-maskable interrupt signal NMI is input to the controller 720, the controller 720 outputs the non-maskable interrupt signal NMI to the CPU 710, so that the CPU 710 executes interrupt processing.

The interrupt signal INT is input to the interrupt controller 721 through the connection terminal 770. Interrupt signals (TOIRQ, POIRQ, and COIRQ) from the peripheral circuits (745, 750, and 751) are input to the interrupt controller 721 without going through the buses (761 to 764).

The interrupt controller 721 has a function of setting priorities to interrupt requests. When the interrupt controller 721 detects the interrupt signal, the interrupt controller 721 determines if the interrupt request is valid or not. If the interrupt request is valid, the interrupt controller 721 outputs an internal interrupt signal INT into the controller 720.

The interrupt controller 721 is connected to the bus line 761 and the data bus line 764 through an I/O interface 722.

When the interrupt signal INT is input, the controller 720 outputs the interrupt signal INT to the CPU 710 and makes the CPU 710 execute interrupt processing.

The interrupt signal TOIRQ is directly input to the controller 720 without going through the interrupt controller 721 in some cases. When the controller 720 receives the interrupt signal TOIRQ, the controller 720 outputs the non-maskable interrupt signal NMI to the CPU 710, so that the CPU 710 executes interrupt processing.

A register 780 of the controller 720 is provided in the controller 720. A register 786 of the interrupt controller 721 is provided in the I/O interface 722.

Then, peripheral circuits included in the MCU 700 will be described. The MCU 700 includes the timer circuit 745, the I/O port 750, and the comparator 751 as peripheral circuits. The circuits are examples of the peripheral circuits, and a circuit needed for an electronic appliance using the MCU 700 can be provided as appropriate.

The timer circuit 745 has a function of measuring time in response to a clock signal TCLK (hereinafter, also simply referred to as "TCLK") output from a clock generation circuit 740. The clock generation circuit 715 outputs the interrupt signal TOIRQ to the controller 720 and the interrupt controller 721 at predetermined intervals. The timer circuit 745 is connected to the bus line 761 and the data bus line 764 through the I/O interface 746.

TCLK is a clock signal of which frequency is lower than that of MCLK. For example, the frequency of MCLK is about several megahertz (MHz) (e.g., 8 MHz) and the frequency of MCLK is about several tens of kilohertz (kHz) (e.g., 32 kHz). The clock generation circuit 740 includes the crystal oscillation circuit 741 incorporated in the MCU 700 and the oscillation unit 742 which is connected to the connection terminal 772 and the connection terminal 773. The quartz crystal unit 743 is used as a resonator unit of the oscillation unit 742. In addition, the clock generation circuit 740 is made up of a CR oscillator and the like, and thereby, all modules in the clock generation circuit 740 can be incorporated in the MCU 700.

The I/O port 750 is an interface that inputs and outputs information to and from an external device which is connected to the I/O port 750 through the connection terminal 774 and is an input-output interface of a digital signal. The I/O port 750 outputs the interrupt signal POIRQ to the interrupt controller 721 in accordance with an input digital signal.

The comparator 751 is a peripheral circuit that processes an analog signal inputted from the connection terminal 775. The comparator 751 compares a potential (or current) of the analog signal inputted from the connection terminal 775 with a potential (or current) of a reference signal and generates a digital signal of which the level is 0 or 1. Further, the comparator 751 generates the interrupt signal COIRQ when the level of the digital signal is 1. The interrupt signal COIRQ is output to the interrupt controller 721.

The I/O port 750 and the comparator 751 are connected to the bus line 761 and the data bus line 764 through the I/O interface 752 common to the both. Here, one I/O interface 752 is used because the I/O interfaces of the I/O port 750 and the comparator 751 can share a circuit; however, the I/O port 750 and the comparator 751 can have an I/O interface different from each other.

In addition, a register of each peripheral circuit is placed in the input/output interface corresponding to the peripheral circuit. A register 787 of the timer circuit 745 is placed in the I/O interface 746, and a register 783 of the I/O port 750 and a register 784 of the comparator 751 are placed in the I/O interface 752.

The MCU 700 includes the power gate unit 730 that can stop power supply to the internal circuits. Power is supplied only to a circuit necessary for operation by the power gate unit 730, so that power consumption of the whole MCU 700 can be lowered.

As illustrated in FIG. 17, circuits in a unit 701, a unit 702, a unit 703, and a unit 704 in the MCU 700 which are surrounded by dashed lines are connected to the connection terminal 771 through the power gate unit 730. The connection terminal 771 is a power source terminal for supplying a high power supply potential VDD (hereinafter, also simply referred to as VDD).

In this embodiment, the unit 701 includes the timer circuit 745, and the I/O interface 746. The unit 702 includes the I/O port 750, the comparator 751, and the I/O interface 752. The unit 703 includes the interrupt controller 721, and the I/O interface 722. The unit 704 includes the CPU 710, the RAM 712, the bus bridge 711, and the memory interface 713.

The power gate unit 730 is controlled by the controller 720. The power gate unit 730 includes a switch circuit 731 and a switch circuit 732 for blocking supply of VDD to the units 701 to 704.

The switching of the switch circuits 731 and 732 is controlled by the controller 720. Specifically, the controller 720 outputs a signal to turn off one or both of the switch circuits included in the power gate unit 730, depending on the request by the CPU 710 (power supply stop). In addition, the controller 720 outputs a signal to turn on the switch circuit included in the power gate unit 730 with, as a trigger, the non-maskable interrupt signal NMI or the interrupt signal TOIRQ from the timer circuit 745 (start of power supply).

FIG. 17 illustrates a structure where two switch circuits (the switch circuits 731 and 732) are provided in the power gate unit 730; however, the structure is not limited thereto. Switch circuits may be provided as much as needed to block supply of power.

In this embodiment, the switch circuit 731 is provided to individually control supply of power to the unit 701 and the switch circuit 732 is provided to individually control supply of power to the units 702 to 704. However, the embodiment of the present invention is not limited to such a power supply path. For example, another switch circuit which is not the switch circuit 732 may be provided to individually control supply of power to the RAM 712. Further, a plurality of switch circuits may be provided for one circuit.

In addition, VDD is constantly supplied from the connection terminal 771 to the controller 720 without going through the power gate unit 730. In order to reduce noise, a power supply potential from an external power supply circuit, which is different from the power supply circuit for VDD, is given to each of the oscillation circuit of the clock generation circuit 715 and the crystal oscillation circuit 741.

Table 1 shows roles of the blocks.

TABLE 1

| Block name | Role |
| --- | --- |
| CPU 710 | Executing instruction |
| Clock generation circuit 715 | Generating clock signal MCLK |
| Crystal oscillation circuit 741 | Generating clock signal TCLK |
| Controller 720 | Performing control processing of the whole MCU 700 |
| Interrupt controller 721 | Setting priorities to interrupt request |
| I/O interface 746 | Inputting or outputting data |
| I/O interface 752 | Inputting or outputting data |
| I/O port 750 | An interface for connecting external device |
| Timer circuit 745 | Generating interrupt signal in accordance with timer operation |
| Comparator 751 | Comparing input signal and reference signal in potential (or current) |
| RAM 712 | A memory device functioning as main memory of CPU 710 |
| Memory interface 713 | An input-output interface with external memory device |

By provision of the controller 720, the power gate unit 730, and the like, the MCU 700 can operate in three kinds of operation modes. The first operation mode is a normal operation mode where all circuits included in the MCU 700 are active. Here, the first operation mode is referred to as "Active mode".

The second and third operation modes are low power consumption modes where some of the circuits are active. In the second operation mode, the controller 720, the timer circuit 745, and circuits (the crystal oscillation circuit 741 and the I/O interface 746) associated thereto are active. In the other of the third operation mode, the controller 720 alone is active. Here, the second operation mode is referred to as "the Noff1 mode" and the third operation mode is referred to as "the Noff2 mode".

Table 2 below shows a relation between each operation mode and active circuits. In Table 2, ON is given to circuits that are active. As shown in Table 1, the controller 720 and some of the peripheral circuits (circuits necessary for timer operation) alone operate in the Noff1 mode and the controller 720 alone operates in the Noff2 mode.

TABLE 2

|  | Active | Noff1 | Noff2 |
| --- | --- | --- | --- |
| CPU 710 | ON | — | — |
| Bus bridge 711 | ON | — | — |
| RAM 712 | ON | — | — |
| Memory interface 713 | ON | — | — |
| Clock generation circuit 715 | ON | — | — |
| Crystal oscillation circuit 741 | ON | ON | — |
| Contoller 720 | ON | ON | ON |
| Interrupt controller 721 | ON | — | — |
| I/O interface 722 | ON | — | — |
| Timer circuit 745 | ON | ON | — |
| I/O interface 746 | ON | ON | — |

Note that power is constantly supplied to the oscillator of the clock generation circuit 715 and the crystal oscillation circuit 741 regardless of the operation modes. In order to bring the clock generation circuit 715 and the crystal oscillation circuit 741 into non-Active modes, an enable signal is inputted from the controller 720 or an external circuit to stop oscillation of the clock generation circuit 715 and the crystal oscillation circuit 741.

In addition, in Noff1 and Noff2 modes, power supply is stopped by the power gate unit 730, so that the I/O port 750 and the I/O interface 752 are non-active, but power is supplied to parts of the I/O port 750 and the I/O interface 752 in order to allow the external device connected to the connection terminal 774 to operate normally. Specifically, power is supplied to an output buffer of the I/O port 750 and the register 786 of the I/O port 750. In the Noff1 and Noff2 modes, actual functions of the I/O port 750, that is, functions of data transmission between the I/O interface 752 and the external device and generation of an interrupt signal, are stopped. In addition, a communication function of the I/O interface 752 is also stopped similarly.

Note that in this specification, the phrase "a circuit is non-active" includes a state where major functions in Active mode (normal operation mode) are stopped and an operation state with power consumption lower than that of Active mode, as well as a state that a circuit is stopped by blocking supply of power.

Further, in order that the MCU 700 can return from the Noff1 or Noff2 mode to Active mode more rapidly, the registers 784 to 787 each have a backup storage portion for saving data at the time of power supply stop. In other words, the registers 784 to 787 each include a volatile data storage portion (also simply referred to as volatile memory unit) and a nonvolatile data storage portion (also simply referred to as nonvolatile memory unit). In Active mode, by accessing the volatile memory units of the registers 784 to 787, data is written and read out.

Note that since power is always supplied to the controller 720, the register 780 of the controller 720 is not provided with a nonvolatile memory unit. In addition, as described above, even in the Noff1 or Noff2 mode, the register 783 operates so that the output buffer of the I/O port 750 functions. Since power is always supplied to the register 783, the register 783 is not provided with a nonvolatile memory unit.

A volatile memory unit includes one or more of volatile memory elements. A nonvolatile memory unit includes one or more of nonvolatile memory elements. Note that the volatile memory element shows access speed higher than that of the nonvolatile memory element.

A semiconductor material used for a transistor included in the volatile memory element is not particularly limited. However, the semiconductor material preferably has a band gap width different from that of a semiconductor material used for a transistor included in the nonvolatile memory element to be described later. As such a semiconductor material, silicon, germanium, silicon germanium, gallium arsenide, or the like can be used, and a single crystal semiconductor is preferably used. In order to increase the speed of processing data, it is preferable to use, for example, a transistor with high switching speed, such as a transistor formed using single crystal silicon.

The nonvolatile memory element is electrically connected to a node holding electric charge corresponding to data of the volatile memory element and is used for storing data from the volatile memory element in a period during which power is not supplied. Accordingly, the nonvolatile memory element has a longer data retention time than at least the volatile memory element to which power is not supplied.

In the shift from Active mode to Noff1 or Noff2 mode, prior to power supply stop, data stored in the volatile memories of the registers 784 to 787 are written into the nonvolatile memories, so that data in the volatile memories are reset to initial values; as a result, supply of power is blocked.

In the return from Noff1 or Noff2 mode to Active mode, when power is supplied again to the registers 784 to 787, data in the volatile memories are reset to initial values. Then, data in the nonvolatile memories are written into the volatile memories.

Accordingly, even in the low power consumption mode, data needed for processing of the MCU 700 are stored in the registers 784 to 787, and thus, the MCU 700 can return from the low power consumption mode to Active mode immediately.

[7-1-2. Structural Example of Register]

Figure 18:
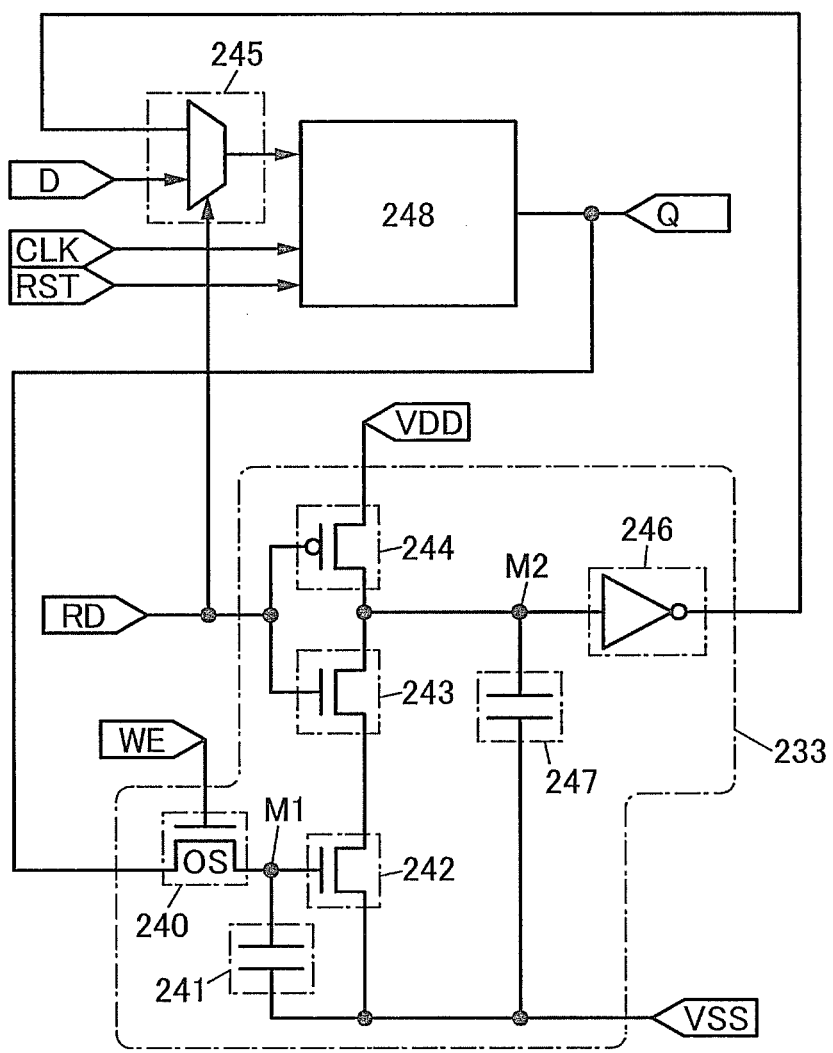
FIG. 18 is a circuit diagram illustrating an example of a register including a nonvolatile memory unit.

FIG. 18 shows a register 1196 as one example of a circuit structure that can be used for the registers 784 to 787. The circuit structure includes a volatile memory unit and a nonvolatile memory unit and can store 1-bit data.

The register 1196 illustrated in FIG. 18 includes a flip-flop 248 which is a volatile memory unit, a nonvolatile memory unit 233, and a selector 245.

The flip-flop 248 is supplied with a reset signal RST, a clock signal CLK, and a data signal D. The flip-flop 248 has a function of holding data of a data signal D that is input in accordance with the clock signal CLK and outputting a high-level potential H or a low-level potential L as a data signal Q in accordance with the data signal D.

The nonvolatile memory unit 233 is supplied with a write control signal WE, a read control signal RD, and a data signal D.

The nonvolatile memory unit 233 has a function of storing data of an input data signal D in accordance with the write control signal WE and outputting the stored data as the data signal D in accordance with the read control signal RD.

The selector 245 selects the data signal D or the data signal output from the nonvolatile memory unit 233 and inputs the selected signal to the flip-flop 248 in accordance with the read control signal RD.

Further, as illustrated in FIG. 18, a transistor 240 and a capacitor 241 are provided in the nonvolatile memory unit 233.

The transistor 240 is an n-channel transistor. One of a source and a drain of the transistor 240 is electrically connected to an output terminal of the flip-flop 248.

The transistor 240 has a function of controlling holding a data signal output from the flip-flop 248 in accordance with the write control signal WE.

The transistor 240 preferably has extremely low off-state current. For example, a transistor which includes an oxide semiconductor for a semiconductor layer where a channel is formed is used as the transistor 240. Specifically, any of transistors described as the transistor 100, the transistor 150, the transistor 160, the transistor 170, the transistor 180, and the transistor 190 in the above embodiments can be used.

One of a pair of electrodes of the capacitor 241 and the other of the source and the drain of the transistor 240 are connected to a node M1. A low power source potential VSS is applied to the other of the pair of electrodes of the capacitor 241. The capacitor 241 has a function of holding electric charge based on data of the stored data signal D in the node M1. The transistor 240 preferably has extremely low off-state current. Since a transistor having an extremely low off-state current is used for the transistor 240, the electric charge in the node M1 is held and thus the data is held even when supply of the power supply voltage is stopped. By using a transistor having an extremely low off-state current for the transistor 240, the capacitor 241 can be small or omitted.

A transistor 244 is a p-channel transistor. A high power source potential VDD is supplied to one of a source and a drain of the transistor 244. The read control signal RD is input to the gate electrode of the transistor 244.

The transistor 243 is an n-channel transistor. One of a source and a drain of the transistor 243 and the other of the source and the drain of the transistor 244 are connected to a node M2. A gate of the transistor 243 is connected to a gate of the transistor 244 and the read control signal RD is input to the gate of the transistor 243.

A transistor 242 is an n-channel transistor. One of a source and a drain of the transistor 242 is connected to the other of the source and the drain of the transistor 243. A power source potential VSS is supplied to the other of the source and the drain of the transistor 242. Note that a high-level potential H which the flip-flop 248 outputs is a potential at which the transistor 242 is turned on, and a low-level potential L which the flip-flop 248 outputs is a potential at which the transistor 242 is turned off.

An input terminal of an inverter 246 is connected to the node M2. In addition, an output terminal of the inverter 246 is connected to an input terminal of the selector 245.

One of the electrodes of a capacitor 247 is connected to the node M2. A power source potential VSS is supplied to the other of the electrodes of the capacitor 247. The capacitor 247 has a function of holding electric charge based on data of a data signal input to the inverter 246.

In the register 1196 having the above-described structure in FIG. 18, when data is stored from the flip-flop 248 to the nonvolatile memory unit 233, the transistor 240 is turned on by inputting a signal for turning on the transistor 240 as the write control signal WE, so that electric charge corresponding to the data signal Q in the flip-flop 248 is supplied to the node M1. After that, by turning off the transistor 240 by inputting a signal for turning off the transistor 240 as the write control signal WE, electric charge supplied to the node M1 is held. While VSS is supplied as the potential of the read control signal RD, the transistor 243 is turned off and the transistor 244 is turned on, so that the potential of the node M2 becomes VDD.

When data is restored from the nonvolatile memory unit 233 to the flip-flop 248, VDD is applied as the read control signal RD. Accordingly, the transistor 244 is turned off and the transistor 243 is turned on, so that a potential based on the electric charge held in the node M1 is supplied to the node M2. In the case where electric charge corresponding to the high potential H of the data signal Q is held in the node M1, the transistor 242 is turned on, VSS is supplied to the node M2, and VDD output from the inverter 246 is input to the flip-flop 248 through the selector 245. Alternatively, in the case where electric charge corresponding to the low potential L of the data signal Q is held in the node M1, the transistor 242 is turned off, the potential (VDD) of the node M2 when the low potential L is supplied is held as the potential of the read control signal RD, and VSS output from the inverter 246 is input to the flip-flop 248 through the selector 245.

By provision of the volatile memory unit 232 and the nonvolatile memory unit 233 in the register 1196 as described above, data can be stored from the volatile memory unit 232 in the nonvolatile memory unit 233 before supply of power to the CPU 230 is stopped and data can be quickly restored from the nonvolatile memory unit 233 to the volatile memory unit 232 when the supply of power to the CPU 230 is resumed.

By storing and restoring data in such a manner, the CPU 230 does not need to be started up from a state where the volatile memory unit 232 is initialized every time the supply of power is stopped; thus, after the supply of power is resumed, the CPU 230 can start arithmetic processing relating to measurement immediately.

Note that in order to increase the speed of reading data, it is preferable to use a transistor that is similar to the transistor used for the volatile memory element as the transistor 242.

Note that in the register 1196, VSS is supplied to the other of the source and the drain of the transistor 242 and the other of the electrodes of the capacitor 241. However, the other of the source and the drain of the transistor 242 and the other of the electrodes of the capacitor 241 may have the same potential or different potentials. Further, the capacitor 241 is not needed to be provided. For example, in the case where the parasitic capacitance of the transistor 242 is high, the parasitic capacitance can be used instead of the capacitor 241.

The node M1 has the same effect as a floating gate of a floating-gate transistor that is used as a nonvolatile memory element. However, since data can be directly rewritten by turning on or off the transistor 240, injection of electric charge into a floating gate and extraction of electric charge from the floating gate with the use of high voltage are not necessary. In other words, in the nonvolatile memory unit 233, high voltage needed for writing or erasing data in a conventional floating gate transistor is not necessary. Thus, by using the nonvolatile memory unit 233 in this embodiment, power consumption needed for storage of data can be reduced.

For similar reasons, a decrease in operation speed due to data writing or data erasing can be reduced; thus, the nonvolatile memory unit 233 can operate at high speed. For the same reason, deterioration of a gate insulating layer (tunnel insulating layer), which is a problem of a conventional floating gate transistor, does not exist. In other words, unlike in a conventional floating gate transistor, the nonvolatile memory unit 233 described in this embodiment has no limitation on the number of writings in principle. From the above, the nonvolatile memory unit 233 can be adequately used as a memory device that needs many rewritings and high-speed operation, such as a register.

In the above, the structure of the nonvolatile memory unit 233 is not limited to the structures in FIG. 18. For example, a phase change memory (PCM), a resistance random access memory (ReRAM), a magnetoresistive random access memory (MRAM), a ferroelectric random access memory (FeRAM), or a flash memory can be used.

Volatile memory elements can be included in, for example, a register such as a buffer register or a general-purpose register. A cache memory including a static random access memory (SRAM) or the like can also be provided in the volatile memory unit. The register and cache memory can store data in the nonvolatile memory unit 233.

[7-1-3. Structural Example of Semiconductor Device Applicable to MCU]

An example of a structure of a semiconductor device which can be applied to an MCU using a nonvolatile memory unit is described with reference to a cross-sectional view of FIG. 19.

Figure 19:
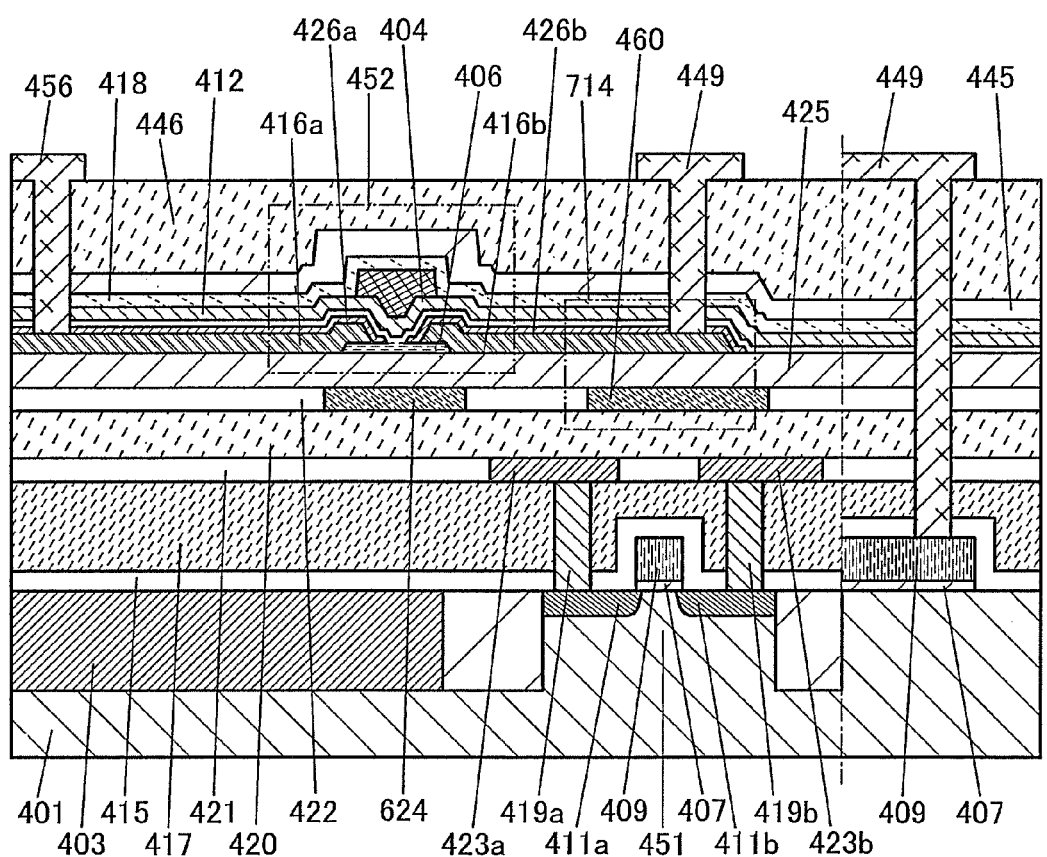
FIG. 19 illustrates an example of a semiconductor device.

A semiconductor device illustrated in FIG. 19 includes an element separation layer 403 and an n-channel transistor 451. The element separation layer 403 is formed in a p-type semiconductor substrate 401. The n-channel transistor 451 includes a gate insulating layer 407, a gate electrode 409, an n-type impurity region 411a, and an n-type impurity region 411b. An insulating layer 415 and an insulating layer 417 are provided over the transistor 451.

In the semiconductor substrate 401, the transistor 451 is separated from other semiconductor elements (not illustrated) by the element separation layer 403. The element separation layer 403 can be formed by a local oxidation of silicon (LOCOS) method, a shallow trench isolation (STI) method, or the like.

Note that in the transistor 451, sidewall insulating layers may be formed on side surfaces of the gate electrode 409, and a region whose impurity concentration is different from those of the n-type impurity region 411a and the n-type impurity region 411b may be provided in the n-type impurity region 411a and the n-type impurity region 411b.

In openings formed by selectively etching parts of the insulating layer 415 and the insulating layer 417, a contact plug 419a and a contact plug 419b are formed. An insulating layer 421 is provided over the insulating layer 417, the contact plug 419a, and the contact plug 419b. The insulating layer 421 includes a groove portion at least partly overlapping the contact plug 419a and a groove portion at least partly overlapping the contact plug 419b.

A wiring 423a is formed in the groove portion at least partly overlapping the contact plug 419a. A wiring 423b is formed in the groove portion at least partly overlapping the contact plug 419b. The wiring 423a is connected to the contact plug 419a. The wiring 423b is connected to the contact plug 419b.

An insulating layer 420 formed by a sputtering method, a CVD method, or the like is provided over the insulating layer 421, the wiring 423a, and the wiring 423b. Further, an insulating layer 422 is formed over the insulating layer 420. The insulating layer 422 includes a groove portion at least partly overlapping with a stack 406 including an oxide semiconductor layer and a groove portion at least partly overlapping with a first drain electrode 416b or a second drain electrode 426b.

An electrode 424 functioning as a back gate electrode of a transistor 452 is formed in the groove portion at least partly overlapping with the stack 406, which is included in the insulating layer 422. By providing the electrode 424, threshold voltage of the transistor 452 can be controlled.

An electrode 460 is formed in the groove portion at least partly overlapping the first drain electrode 416b or the second drain electrode 426b, which is included in the insulating layer 422.

An insulating layer 425 formed by a sputtering method, a CVD method, or the like is provided over the insulating layer 422, the electrode 424, and the electrode 460. The transistor 452 is provided over the insulating layer 425.

As the transistor 452, any of the transistors described in the above embodiments can be used. A change in the electric characteristics of any of the transistors described in the above embodiment is suppressed and thus the transistors are electrically stable. Accordingly, a semiconductor device with high reliability can be provided as the semiconductor device of this embodiment in FIG. 19.

Note that FIG. 19 illustrates the case where a transistor having a structure similar to that of the transistor 170 described in the above embodiment is used as the transistor 452.

The transistor 452 includes the stack 406 formed over the insulating layer 425; a first source electrode 416a and the first drain electrode 416b which are in contact with the stack 406; a second source electrode 426a which is in contact with the upper surface of the first source electrode 416a; the second drain electrode 426b which is in contact with the upper surface of the first drain electrode 416b; an oxide layer 413; a gate insulating layer 412; a gate electrode 404; and an insulating layer 418. In addition, an insulating layer 445 and an insulating layer 446 which cover the transistor 452 are provided. Over the insulating layer 446, a wiring 449 which is connected to the first drain electrode 416b and a wiring 456 which is connected to the first source electrode 416a are provided. The wiring 449 functions as a node at which the drain electrode of the transistor 452 is electrically connected to the gate electrode 409 of the n-channel transistor 451.

In this embodiment, the structure where the wiring 449 is connected to the first drain electrode 416b is described; however, the structure is not limited thereto. For example, the wiring 449 may be connected to the second drain electrode 426b. Further, the structure where the wiring 456 is connected to the first source electrode 416a is shown; however, the structure is not limited thereto. For example, the wiring 456 may be connected to the second source electrode 426a.

A part where the first drain electrode 416b and the electrode 460 overlap with the oxide insulating layer 425 laid therebetween or a part where the second drain electrode 426b and the electrode 460 overlap with the insulating layer 425 laid therebetween functions as a capacitor 453. For example, VSS is supplied to the electrode 460.

Note that the capacitor 453 is not necessarily provided. For example, in the case where parasitic capacitance of the n-channel transistor 451 or the like is sufficiently large, a structure without the capacitor 453 may be employed.

The transistor 452 corresponds to the transistor 240 illustrated in FIG. 18, for example. The transistor 451 corresponds to the transistor 242 illustrated in FIG. 18, for example. The capacitor 453 corresponds to the capacitor 241 illustrated in FIG. 18, for example. The wiring 449 corresponds to the node M1 illustrated in FIG. 18, for example.

Here, the transistor 451 is formed using a semiconductor other than an oxide semiconductor, such as single crystal silicon, so that the transistor can operate at a sufficiently high speed. Thus, when the transistor is used as a reading transistor, information can be read at a high speed.

As described in this embodiment, the transistor 452 is preferably a transistor showing an extremely low off-state current. In this embodiment, a transistor including an oxide semiconductor is described as an example of a transistor showing an extremely low off-state current. With such a structure, the potential of the node M1 can be held for a long time.

[7-2. Display Device]

The transistor described above can be used for a display device. Moreover, some or all of driver circuits which include the transistor described in the above embodiment can be formed over a substrate where a pixel portion is formed, whereby a system-on-panel can be obtained. Structural examples of a display device to which the above-described transistor can be used are described with reference to FIGS. 20A to 20C, FIGS. 21A and 21B, FIGS. 22A and 22B, FIGS. 23A to 23C, FIG. 24, FIG. 25, FIGS. 26A to 26C, FIGS. 27A and 27B, and FIGS. 28A and 28B.

As a display element provided in the display device, a liquid crystal element (also referred to as a liquid crystal display element), a light-emitting element (also referred to as a light-emitting display element) or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. A display device including a liquid crystal element and a display device including an EL element are described below as examples of the display device.

[7-1-1. Liquid Crystal Display Device and EL Display Device]

Figure 20A:
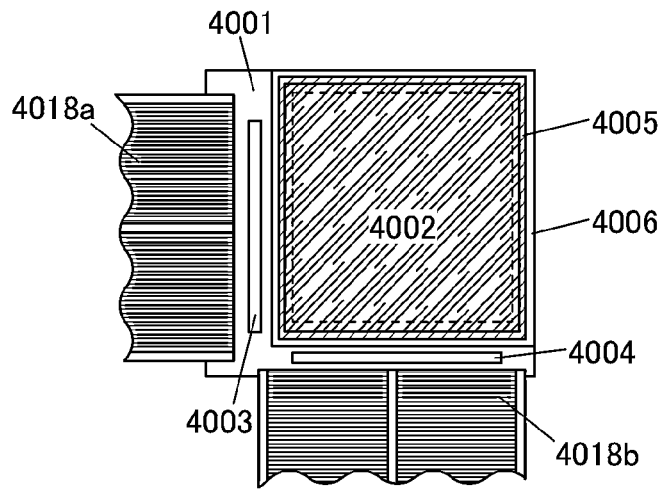
FIGS. 20A to 20C each illustrate an example of a display device.

In FIG. 20A, a sealant 4005 is provided so as to surround a pixel portion 4002 provided over a first substrate 4001, and the pixel portion 4002 is sealed with a second substrate 4006. In FIG. 20A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018a and 4018b.

Figure 20B:
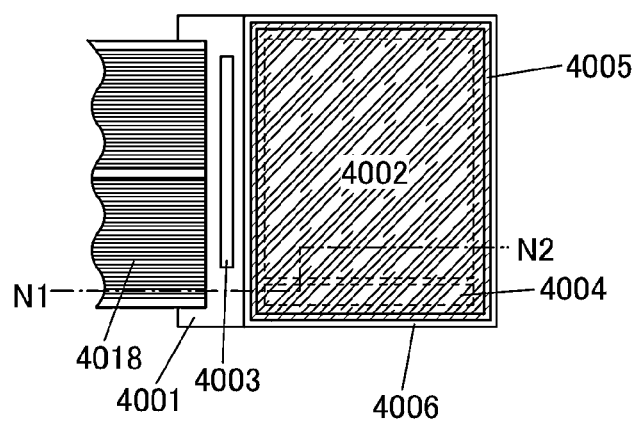
Figure 20C:
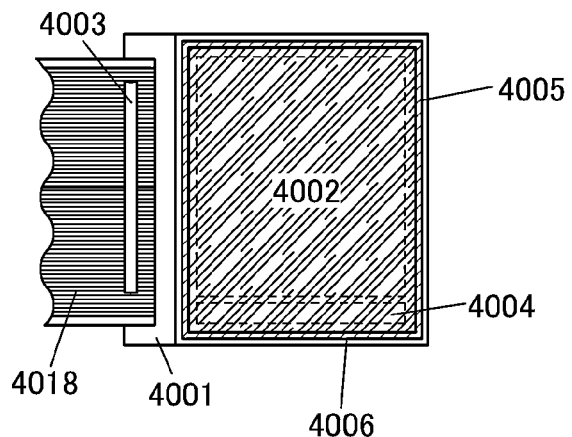

In FIGS. 20B and 20C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Hence, the pixel portion 4002 and the scan line driver circuit 4004 are sealed together with the display element, by the first substrate 4001, the sealant 4005, and the second substrate 4006. Further, in FIGS. 20B and 20C, the signal line driver circuit 4003 which is formed using a single crystal semiconductor or a polycrystalline semiconductor over another substrate is mounted in a region that is different from the region surrounded by the sealant 4005 over the first substrate 4001. In FIGS. 20B and 20C, various signals and potentials are supplied to the signal line driver circuit 4003, the scan line driver circuit 4004, and the pixel portion 4002 through an FPC 4018.

Although FIGS. 20B and 20C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or only part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 20A illustrates an example in which the signal line driver circuit 4003 and the scan line driver circuit 4004 are mounted by a COG; FIG. 20B illustrates an example in which the signal line driver circuit 4003 is mounted by a COG; FIG. 20C illustrates an example in which the signal line driver circuit 4003 is mounted by a TCP.

The display device encompasses a panel in which a liquid crystal display element is sealed, and a module in which an IC or the like including a controller is mounted on the panel.

The display device in this specification refers to an image display device or a light source (including a lighting device). Further, the display device also includes the following modules in its category: a module to which a connector such as an FPC or a TCP is attached; a module having a TCP or the like at the tip of which a printed wiring board is provided; and a module in which an integrated circuit (IC) is directly mounted on a display element by a COG.

The pixel portion and the scan line driver circuit provided over the first substrate include a plurality of transistors to which the transistor which is described in the above embodiment can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically encompasses an inorganic EL element, an organic EL element, and the like. Besides those, display medium whose contrast is changed by an electric effect, such as electronic ink, can also be used.

FIGS. 21A and 21B correspond to cross-sectional views taken along chain line N1-N2 in FIG. 20B. As shown in FIGS. 21A and 21B, the semiconductor device has an electrode 4015, and the electrode 4015 is electrically connected to a terminal included in the FPC 4018 through an anisotropic conductive layer 4019. The electrode 4015 is electrically connected to a wiring 4014 through an opening formed in an insulating layer 4020 and an insulating layer 4022.

The electrode 4015 is formed of the same conductive layer as a first electrode layer 4030, and the wiring 4014 is formed of the same conductive layer as a source and drain electrodes of transistors 4010 and 4011.

In FIG. 21A, the electrode 4015 and the wiring 4014 are connected to each other in the opening formed in the insulating layer 4020 and the insulating layer 4022, and in FIG. 21B, the electrode 4015 and the wiring 4014 are connected to each other in a plurality of openings formed in the insulating layer 4020 and the insulating layer 4022. Since the surface of the electrode 4015 is uneven due to the plurality of openings, the area of contact between the electrode 4015 to be formed later and the anisotropic conductive layer 4019 can be increased. Thus, favorable connection of the FPC 4018 and the electrode 4015 can be obtained.

The pixel portion 4002 and the scan line driver circuit 4004 provided over the first substrate 4001 include a plurality of transistors. In FIGS. 21A and 21B, the transistor 4010 included in the pixel portion 4002 and the transistor 4011 included in the scan line driver circuit 4004 are shown as an example. The insulating layer 4020 is provided over the transistors 4010 and 4011 in FIG. 21A, and a planarization layer 4021 is further provided over the insulating layer 4020 in FIG. 21B. An insulating layer 4023 is an insulating film which functions as a base layer and the insulating layer 4022 functions as a gate insulating layer.

In this embodiment, the transistor described in the above embodiment can be applied to the transistor 4010, 4011.

A change in the electric characteristics of the transistor described in the above embodiment is suppressed, and thus the transistor is electrically stable. Accordingly, the semiconductor device of this embodiment illustrated in FIGS. 21A and 21B can be a highly reliable semiconductor device.

FIG. 21A illustrates the case where a transistor having a structure similar to that of the transistor 100 described in the above embodiment is used as each of the transistors 4010 and 4011. FIG. 21B illustrates the case where a transistor having a structure similar to that of the transistor 100 described in the above embodiment is used as the transistor 4011. Further, FIG. 21B illustrates the case where a transistor having a structure similar to that of the transistor 190 described in the above embodiment is used as the transistor 4011.

FIG. 21B illustrates the structural example in which a conductive layer 4017 is provided so as to overlap with a channel formation region of the oxide semiconductor layer of the transistor 4011 for the driver circuit with the insulating layer 4023 positioned therebetween. The conductive layer 4017 can function as a back gate electrode.

The transistor 4010 included in the pixel portion 4002 is electrically connected to the display element to constitute part of a display panel. A variety of display elements can be used as the display element as long as display can be performed.

An example of a liquid crystal display device using a liquid crystal element as a display element is illustrated in FIG. 21A. In FIG. 21A, a liquid crystal element 4013 which is the display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031. A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is not involved may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 vol. % or more of a chiral material is mixed is used for the liquid crystal layer in order to widen the temperature range. The liquid crystal composition which includes the liquid crystal exhibiting a blue phase and a chiral material has a short response time of 1 msec or less, and has optical isotropy, which makes the alignment process unnecessary and the viewing angle dependence small. In addition, since an alignment film is not involved and thus rubbing treatment is unnecessary, electrostatic discharge damage caused by the rubbing treatment can be prevented, so that defects and damage of the liquid crystal display device in the manufacturing process can be reduced. Thus, productivity of the liquid crystal display device can be increased. A transistor using an oxide semiconductor layer has a possibility that the electric characteristics may change significantly by the influence of static electricity to deviate from the designed range. Therefore, it is more effective to use a liquid crystal material exhibiting a blue phase for the liquid crystal display device including the transistor using the oxide semiconductor layer.

The inherent resistance of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. The inherent resistance in this specification is measured at 20° C.

In the transistor used in this embodiment, which uses a highly-purified oxide semiconductor layer, the current in an off state (the off-state current) can be made small. Accordingly, an electrical signal such as an image signal can be held for a longer period in the pixel, and a writing interval can be set longer in an on state. Accordingly, frequency of refresh operation can be reduced, which leads to an effect of suppressing power consumption.

The magnitude of a storage capacitor provided in the liquid crystal display device is set considering the leakage current of the transistor in the pixel portion or the like so that electric charge can be held for a predetermined period. The magnitude of the storage capacitor may be set considering the off-state current of the transistor or the like. Since the transistor including a highly purified oxide semiconductor layer is used, it is enough to provide a storage capacitor having a capacitance that is less than or equal to ⅓, preferably less than or equal to ⅕ of the liquid crystal capacitance of each pixel.

In the transistor including the above oxide semiconductor, relatively high field-effect mobility can be obtained, whereby high-speed operation is possible. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Above all, a normally black liquid crystal panel such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be applied with a polarizing substrate and a retardation substrate. In addition, a backlight, a side light, or the like may be used as a light source.

As a display method in the pixel portion, a progressive method, an interlace method, or the like can be employed. Further, color elements controlled in each pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the size of the display region may be different between respective dots of color elements. One embodiment of the present invention can be applied not only to a display device for color display, but also to a display device for monochrome display.

Further, a light-emitting element utilizing electroluminescence can alternatively be used as the display element in the display device. Light-emitting elements utilizing electroluminescence are classified according to whether the light-emitting material is an organic compound or an inorganic compound; in general, the former is referred to as an organic EL element, and the latter is referred to as an inorganic EL element.

In an organic EL element, by application of voltage to the light-emitting element, electrons and holes are separately injected from a pair of electrodes into a layer containing the light-emitting organic compound, and current flows. Then, the carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. On the other hand, the thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes is transparent. The transistor and the light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the side opposite to the substrate and the substrate side.

FIG. 21B illustrates an example of an EL display device (also referred to as a "light-emitting device") using a light-emitting element as a display element. A light-emitting element 4513 which is the display element is electrically connected to the transistor 4010 in the pixel portion 4002. The structure of the light-emitting element 4513 is the stacked-layer structure including the first electrode layer 4030, an electroluminescent layer 4511, and the second electrode layer 4031; however, this embodiment is not limited to this structure. The structure of the light-emitting element 4513 can be changed as appropriate depending on the direction in which light is extracted from the light-emitting element 4513, or the like.

A bank 4510 can be formed using an organic insulating material or an inorganic insulating material. It is particularly preferable that the bank 4510 be formed using a photosensitive resin material to have an opening over the first electrode layer 4030 so that a sidewall of the opening slopes with continuous curvature.

The electroluminescent layer 4511 consists of either a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is confined by the first substrate 4001, the second substrate 4006, and the sealant 4005, a filler 4514 is provided for sealing. It is preferable that the panel be packaged (sealed) with a protective film (such as a laminate film or an ultraviolet curable resin film) or a cover member with high air-tightness and little degasification so that the panel is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, a polyimide resin, an epoxy resin, a silicone resin, polyvinyl butyral (PVB), ethylene vinyl acetate (EVA), or the like can be used. For example, nitrogen is used for the filler.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission surface of the light-emitting element. Further, the polarizing plate or the circularly polarizing plate may be provided with an anti-reflection film. For example, anti-glare treatment by which reflected light can be diffused by unevenness of the surface so as to reduce the glare can be performed.

The first electrode layer and the second electrode layer (each of which is also called a pixel electrode layer, a common electrode layer, a counter electrode layer, or the like) for applying voltage to the display element each have either a light-transmitting property or a light-reflecting property, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called a conductive polymer) can also be used for any of the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given Since the transistor is easily broken owing to static electricity or the like, a protective circuit for protecting the driver circuit is preferably provided. The protection circuit is preferably formed using a nonlinear element.

As described above, by applying the transistor described in the above embodiment, a highly reliable semiconductor device having a display function can be provided. With the use of any of the wiring structures described in the above embodiment, wiring resistance can be reduced without an increase in width or thickness of the wiring. Thus, a semiconductor device which has high integration, a large size, and a display function with high display quality can be provided. Further, a semiconductor device with low power consumption can be provided.

[7-1-2. Example of Pixel Circuit]

Figure 22A:
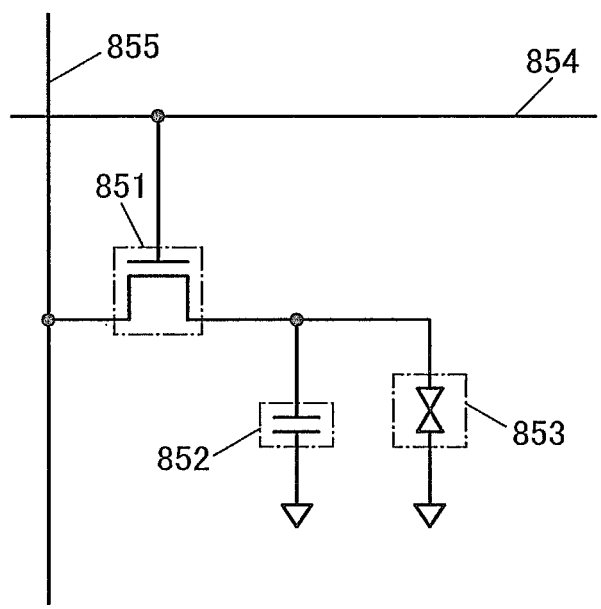
FIGS. 22A and 22B each illustrate an example of a pixel circuit applicable to a display device.
Figure 22B:
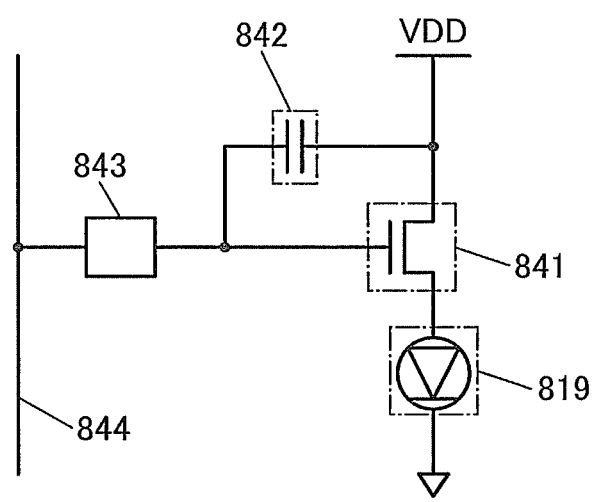

FIGS. 22A and 22B illustrate examples of a pixel circuit applicable to a display device. FIG. 22A is a circuit diagram of an example of a pixel circuit applicable to a liquid crystal display device. The pixel circuit illustrated in FIG. 22A includes a transistor 851, a capacitor 852, and a liquid crystal element 853 in which a space between a pair of electrodes is filled with a liquid crystal.

One of a source and a drain of the transistor 851 is electrically connected to a signal line 855, and a gate of the transistor 851 is electrically connected to a scan line 854.

One of electrodes of the capacitor 852 is electrically connected to the other of the source and the drain of the transistor 851, and the other of the electrodes of the capacitor 852 is electrically connected to a wiring for supplying a common potential.

One of electrodes of the liquid crystal element 853 is electrically connected to the other of the source and the drain of the transistor 851, and the other of the electrodes of the liquid crystal element 853 is electrically connected to a wiring for supplying a common potential. Note that the common potential supplied to the wiring electrically connected to the other of the electrodes of the capacitor 852 may be different from the common potential supplied to the wiring electrically connected to the other of the electrodes of the liquid crystal element 853.

FIG. 22B is a circuit diagram of an example of a pixel circuit applicable to an EL display device.

The pixel circuit in FIG. 22B includes a switching element 843, a transistor 841, a capacitor 842, and a light-emitting element 719.

A gate of the transistor 841 is electrically connected to one terminal of the switching element 843 and one terminal of the capacitor 842. A source of the transistor 841 is electrically connected to one terminal of the light-emitting element 719. A drain of the transistor 841 is electrically connected to the other terminal of the capacitor 842 and is supplied with a high power supply voltage VDD. The other terminal of the switching element 843 is electrically connected to a signal line 844. The other terminal of the light-emitting element 719 has a potential which is smaller than the high power supply potential VDD, e.g., a lower power supply voltage VSS or a ground potential GND.

Note that the high power supply voltage VDD refers to a power supply potential on the high voltage side. Note that the low power supply voltage VSS refers to a power supply potential on the low voltage side. Further, a ground potential GND can be used as the high power supply voltage or the low power supply voltage. For example, in the case where a ground potential is used as the high power supply voltage, the low power supply voltage is voltage lower than the ground potential, and in the case where a ground potential is used as the low power supply voltage, the high power supply voltage is voltage higher than the ground potential.

Note that as the transistor 841, the above-described transistor including the stack including the oxide semiconductor layer is used. The transistor has stable electrical characteristics. Thus, the EL display device can have high display quality.

As the switching element 843, a transistor is preferably used. When the transistor is used as the switching element, the area of a pixel can be reduced, so that the EL display device can have high resolution. Alternatively, the above-described transistor including the stack including the oxide semiconductor layer may be used as the switching element 843. When the transistor is used as the switching element 843, the switching element 843 can be formed in the same process as the transistor 841, so that the productivity of the EL display device can be improved.

[7-3. Electronic Appliances]

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, medical equipment such as dialyzers, detectors detecting fire, smoke, electric leakage, gas leakage, or the like, and various sensors such as proximity sensors, infrared sensors, vibration sensors, radiation sensors, and human sensors. Further, the examples include industrial equipment such as guide lights, traffic lights, belt conveyors, elevators, escalators, industrial robots, and power storage systems. In addition, moving objects driven by oil engines and electric motors using power from the non-aqueous secondary batteries, and the like are also included in the category of electric appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of the electronic appliances are illustrated in FIGS. 23A to 23C.

Figure 23A:
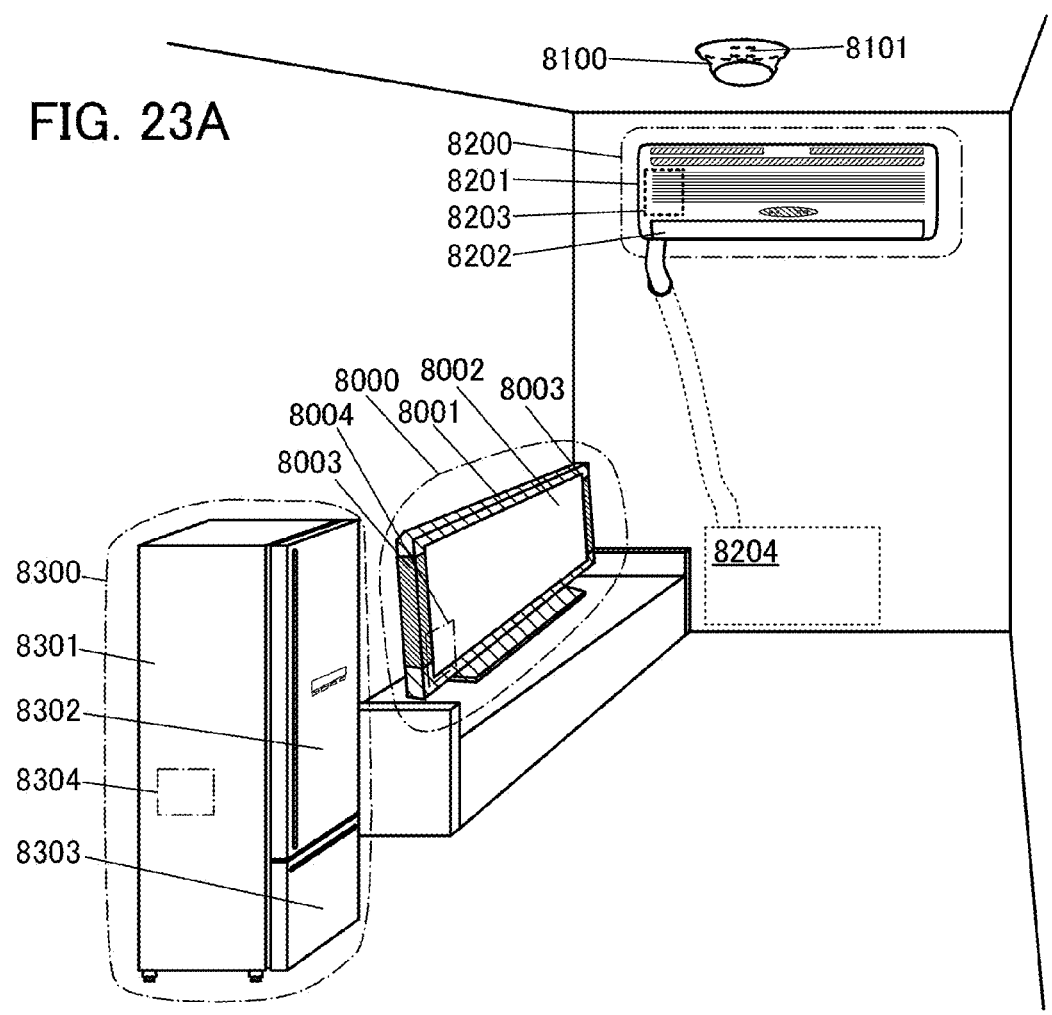
FIGS. 23A to 23C each illustrate an example of electronic appliance.
Figure 23B:
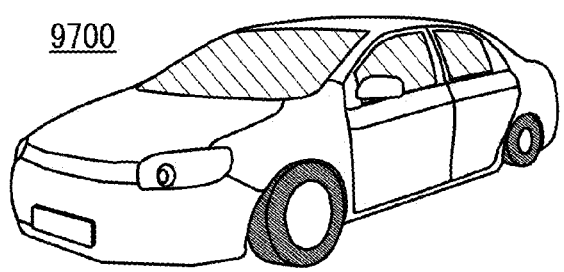
Figure 23C:
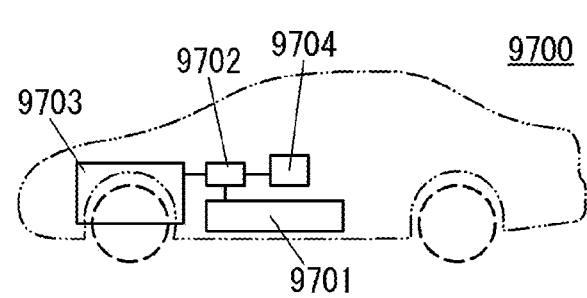

In FIG. 23A, an alarm system 8100 is a residential fire alarm, which includes a sensor portion and an MCU 8101. The above-described transistor can be used for the MCU 8101.

In FIG. 23A, a CPU that uses the above-described transistor is included in an air conditioner which includes an indoor unit 8200 and an outdoor unit 8204. Specifically, the indoor unit 8200 includes a housing 8201, an air outlet 8202, an MCU 8203, and the like. Although the MCU 8203 is provided in the indoor unit 8200 in FIG. 23A, the MCU 8203 may be provided in the outdoor unit 8204. Alternatively, the MCU 8203 may be provided in both the indoor unit 8200 and the outdoor unit 8204. When the MCU uses the above-described transistor, the power saving of the air conditioner can be achieved.

In FIG. 23A, an MCU that uses the above transistor is included in an electric refrigerator-freezer 8300. Specifically, the electric refrigerator-freezer 8300 includes a housing 8301, a refrigerator door 8302, a freezer door 8303, an MCU 8304, and the like. The MCU 8304 is provided in the housing 8301 in FIG. 23A. When the MCU 8304 uses the above-described transistor, the power saving of the electric refrigerator-freezer 8300 can be achieved.

FIG. 23B illustrates an example of an electric vehicle. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, an MCU, or the like which is not illustrated. When an MCU uses the above-described transistor, the power saving of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in appropriate combination with the structures described in the other embodiments.

(Embodiment 8)

In order to improve reliability of a transistor including an oxide semiconductor (OS) layer, it is important to clarify a factor that affects the reliability. Here, in order to improve reliability of the transistor including an oxide semiconductor layer, the deterioration mechanism model described below was made.

Note that an oxygen vacancy of the oxide semiconductor layer forms a deep level DOS in the oxide semiconductor layer. In order to reduce the deep level DOS, it is important to make a state in which the oxide semiconductor layer contains oxygen in excess of the stoichiometric composition and to provide the oxide semiconductor layer to supply oxygen for repairing the oxygen vacancy from outside.

When a positive gate BT (+GBT: positive gate bias temperature) test is performed on the transistor including the oxide semiconductor layer, the threshold voltage (Vth) shifts in the positive direction as compared to the initial Vg-Id characteristics. In addition, when a negative gate BT (−GBT: negative gate bias temperature) test is performed on the transistor on which a positive gate BT test has been performed, the Vg-Is characteristics shift in the negative direction. In this manner, the threshold voltage of the transistor becomes alternately positive and negative, which is associated with alternation of a positive gate BT test and a negative gate BT test (see FIG. 24).

Figure 24:
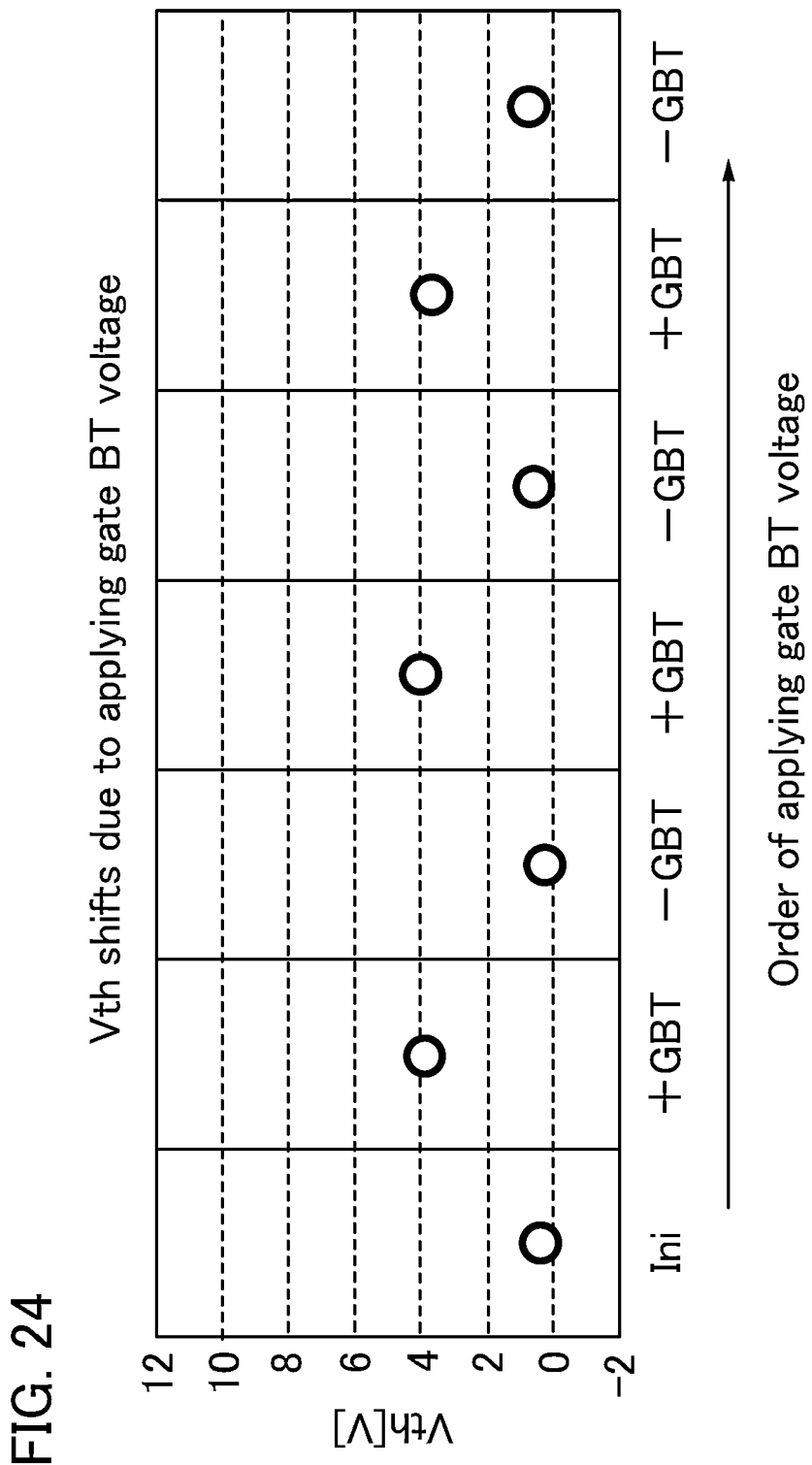
FIG. 24 shows electric characteristic variation of a transistor including an oxide semiconductor layer.

FIG. 24 suggests that the change of Vg-Id characteristics of the transistor including the oxide semiconductor layer relates to not a fixed charge but a level (trap level).

Figure 25:
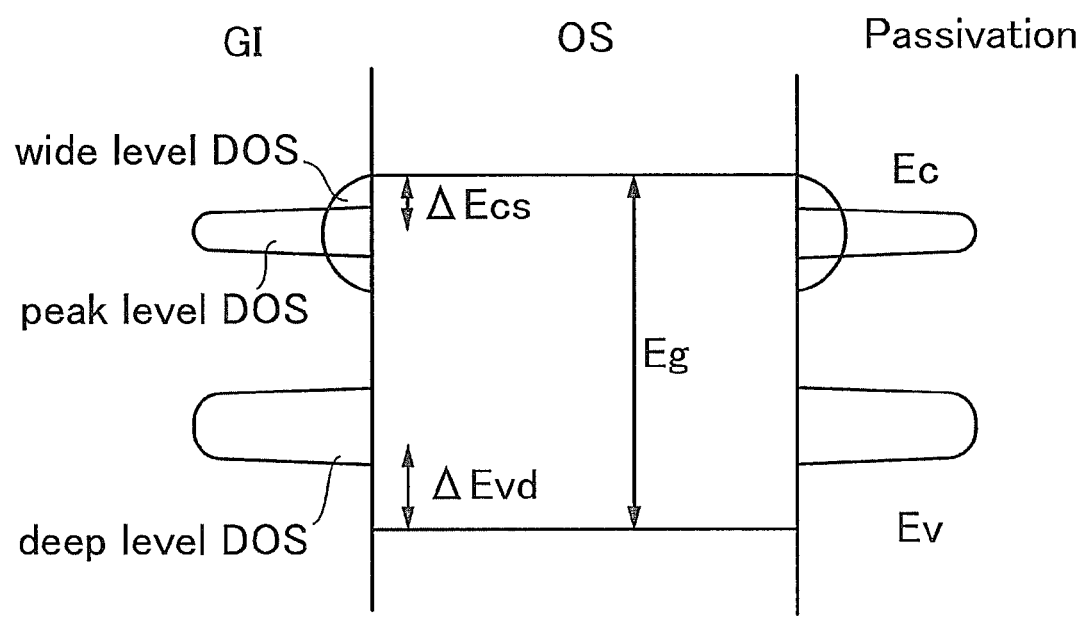
FIG. 25 is an energy band structure diagram of a transistor including an oxide semiconductor layer.

FIG. 25 is a model of an energy band structure diagram of the transistor including the oxide semiconductor layer. Note that FIG. 25 shows a state where a gate voltage is not applied. In FIG. 25, three kinds of defect states (DOS) were assumed in the oxide semiconductor layer, at the interface between the oxide semiconductor layer and a gate insulating layer ("GI"), and at the interface between the oxide semiconductor layer and a protective insulating layer ("Passivation"). As defect states, there are two kinds of shallow level DOS and one kind of deep level DOS. Note that each of the defect states has an energy distribution. Here, the first shallow level (wide level DOS) has a large energy distribution, and the second shallow level (peak level DOS) has a small energy distribution. In addition, a difference (ΔEvd) between energy at the top of the valence band and energy of the deep level DOS is larger than a difference (ΔEcs) between energy at the bottom of the conduction band and energy of the peak level DOS.

For example, the shallow level becomes neutral when its energy is higher than Fermi energy and is negatively charged when its energy is lower than Fermi energy. On the other hand, the deep level is positively charged when the energy is larger than Fermi energy and becomes neutral when the energy is smaller than Fermi energy.

Figure 26A:
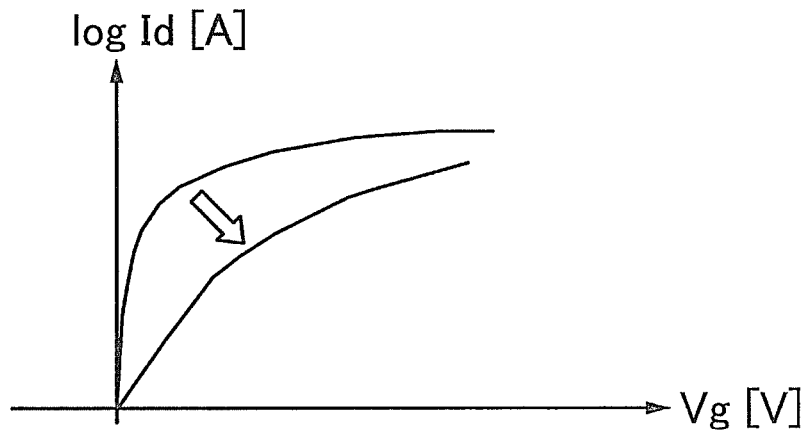
FIGS. 26A to 26C each show a deterioration mode of a transistor including an oxide semiconductor layer.
Figure 26B:
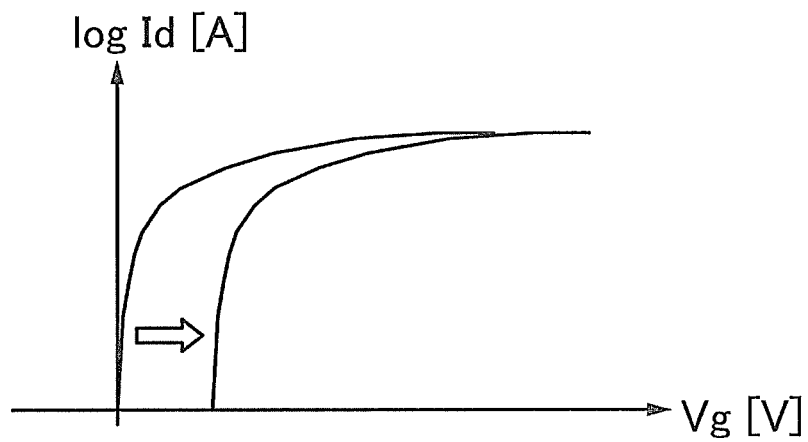
Figure 26C:
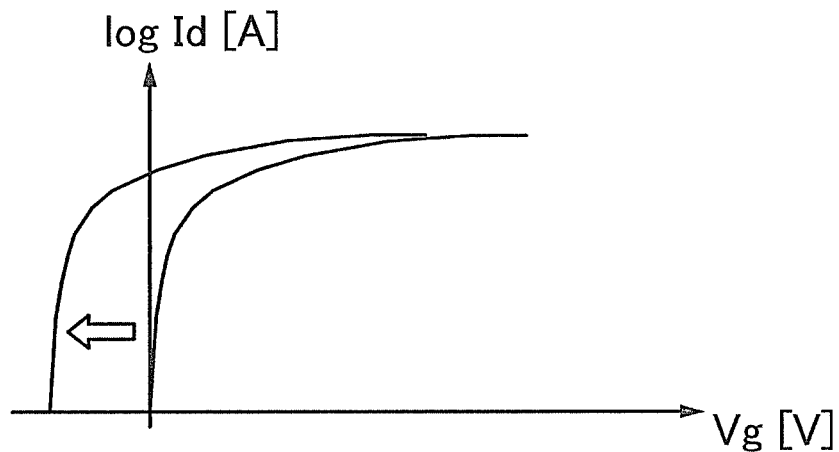
Figure 27A:
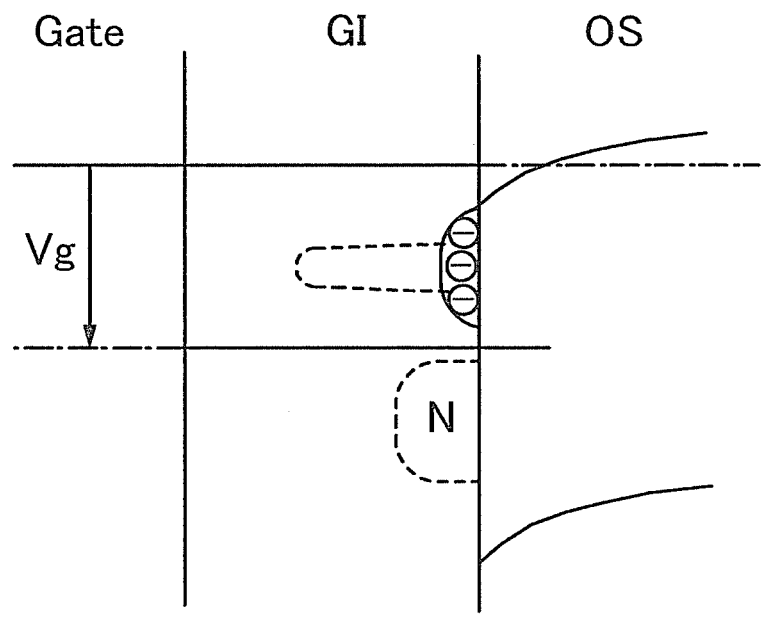
FIGS. 27A and 27B are an energy band structure diagram and a diagram showing the corresponding deterioration model of a transistor including an oxide semiconductor layer.
Figure 27B:
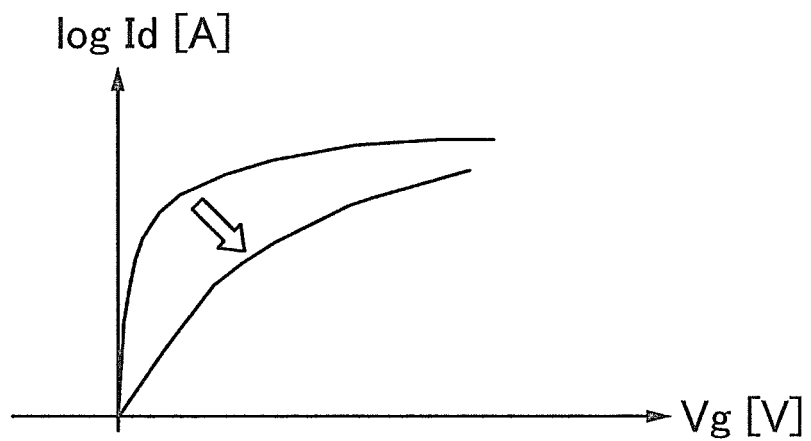

FIGS. 26A to 26C each show a deterioration mode of Vg-Id characteristics of the transistor including the oxide semiconductor layer. The transistor including the oxide semiconductor layer has three kinds of deterioration modes. Specifically, FIG. 26A shows a deterioration mode in which the on-state current is decreased, FIG. 26B shows a deterioration mode in which the threshold voltage shifts in the positive direction, and FIG. 26C shows a deterioration mode in which the threshold voltage shifts in the negative direction.

What types of defect states cause such deterioration modes of the transistor including the oxide semiconductor layer will be explained below.

Firstly, the decrease of on-state current shown in FIG. 26A is explained. When Vg-Id characteristics are measured, as a gate voltage increases, electrons are trapped by the wide level DOS (see FIG. 27A and FIG. 27B). At this time, the trapped electrons do not contribute to electric conduction, so that the on-state current of the transistor is decreased, i.e., the line is crushed. Therefore, the decrease of on-state current of the transistor, which is one of the deterioration modes, is probably caused due to the wide level DOS. Note that N in the figures means Neutral.

Next, the shift of the threshold voltage to the positive side when a positive gate BT test is performed is explained with reference to FIGS. 28A and 28B.

Figure 28A:
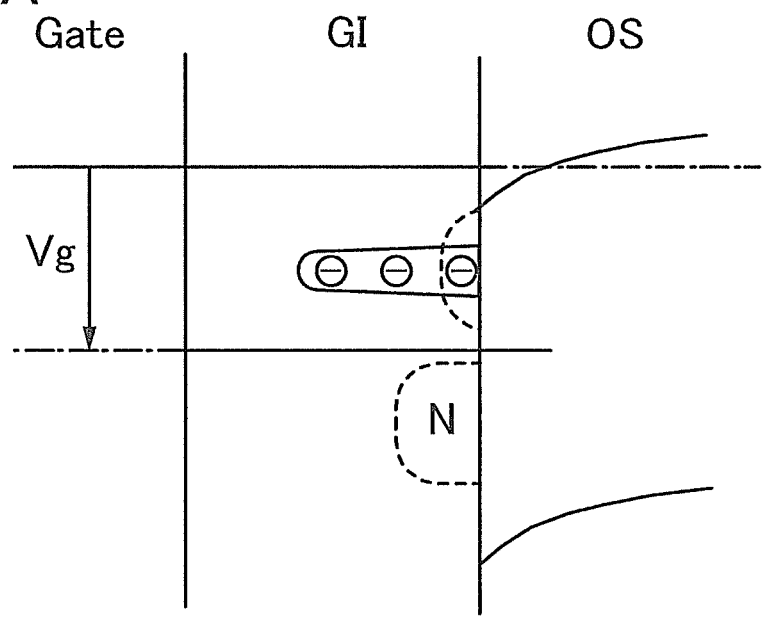
FIGS. 28A and 28B are an energy band structure diagram and a diagram showing the corresponding deterioration model of a transistor including an oxide semiconductor layer.
Figure 28B:
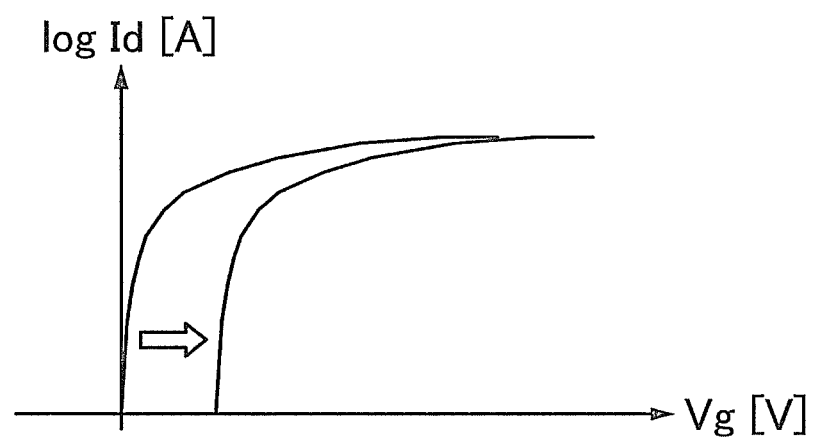

When a positive gate BT test is performed, electrons induced by a positive gate voltage are trapped by the peak level DOS (see FIGS. 28A and 28B). The electrons trapped at the time of the positive gate BT test, i.e., negative charges, have a long relaxation time and thus behave like fixed charges. Due to the negative charges, even after the gate voltage (bias) is off, a state equal to a state in which a negative voltage is effectively applied occurs. Therefore, when the electric characteristics of the transistor are measured after the positive gate BT test, the threshold voltage of the transistor characteristics (Vg-Id characteristics) shifts in the positive direction.

Figure 29A:
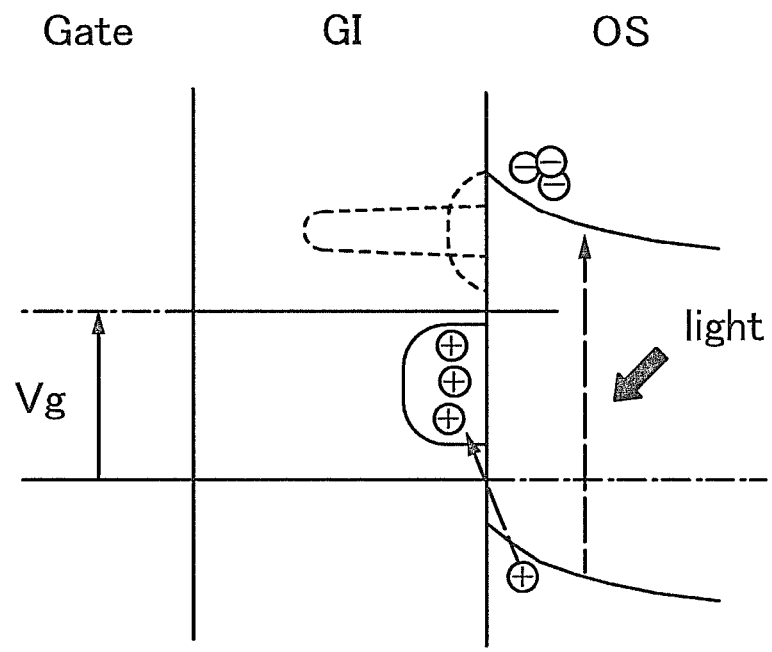
FIGS. 29A and 29B are an energy band diagram and a diagram showing the corresponding deterioration model of a transistor including an oxide semiconductor layer.
Figure 29B:
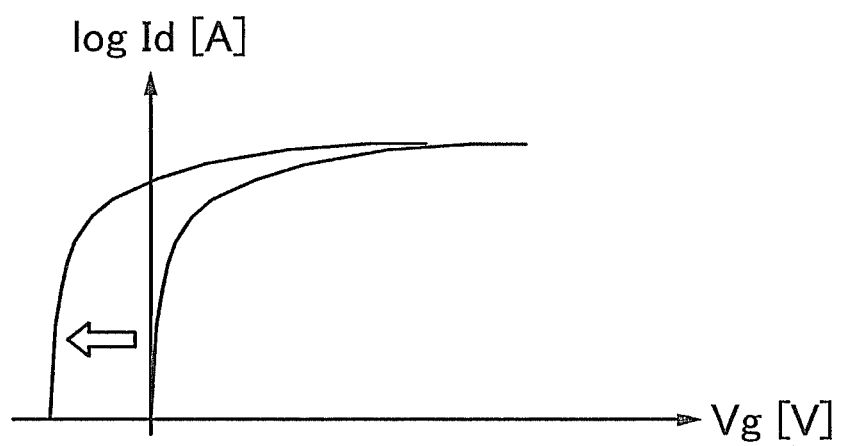

Next, the shift of the threshold voltage to the negative side when a negative gate BT test is performed is explained with reference to FIGS. 29A and 29B.

When a negative gate voltage Vg is applied to the transistor and the transistor is irradiated with light in a negative gate BT test, holes, that is, positive charges are trapped by the deep level DOS. Since a difference between energy at the bottom of the conduction band (Ec) and energy of the deep level DOS is large and a difference between energy at the top of the valence band (Ev) and energy of the deep level DOS is large, it takes a long time before holes are induced. In addition, holes in the oxide semiconductor layer have a large effective mass, and holes are hardly injected even from a drain electrode. The positive charges have a long relaxation time and thus behave like a fixed charge. Due to the positive charges, even after the gate voltage (bias) is off, a state equal to a state in which a positive voltage is effectively applied occurs. Therefore, when the electric characteristics of the transistor are measured after the negative gate BT test, the threshold voltage of the transistor characteristics (Vg-Id characteristics) shifts in the negative direction.

Note that when the oxide semiconductor layer is an In—Ga—Zn oxide, oxygen that is bonded to indium whose bond energy with oxygen is low is easily released (i.e., In-Vo is easily formed). Note that the peak level DOS is probably related to In-VoH and may form an n-type region. The wide level DOS and the deep level DOS are thought to be related to In-Vo-HO—Si and In-Vo-In, respectively.

In order to reduce the density of defect states in an oxide semiconductor layer, it is important to reduce oxygen vacancies (Vo). Specifically, oxygen vacancies can be reduced by preventing entry of Si into the oxide semiconductor layer or by being repaired by excess oxygen. In addition, since VoH is contributed to formation of a shallow level which is a defect state, it is preferable to reduce hydrogen in the oxide semiconductor layer.

This application is based on Japanese Patent Application serial no. 2012-252625 filed with Japan Patent Office on Nov. 16, 2012, the entire contents of which are hereby incorporated by reference.

What is claimed is:

1. A semiconductor device comprising:
a first oxide layer over a substrate;
an oxide semiconductor layer over the first oxide layer;
a second oxide layer over the oxide semiconductor layer;
a source electrode and a drain electrode over the second oxide layer; and
a third oxide layer in contact with the source electrode and the drain electrode,
wherein energy at a bottom of a conduction band of each of the first oxide layer and the second oxide layer is smaller than energy at a bottom of a conduction band of the oxide semiconductor layer.

2. The semiconductor device according to claim 1,
wherein the third oxide layer is provided over the second oxide layer, the source electrode, and the drain electrode, and
wherein the third oxide layer is in contact with the second oxide layer.

3. The semiconductor device according to claim 1, wherein the energy at the bottom of the conduction band of the first oxide layer is smaller than that of the second oxide layer.

4. The semiconductor device according to claim 1, wherein energy at a bottom of a conduction band of the third oxide layer is smaller than that of the second oxide layer.

5. The semiconductor device according to claim 1, wherein energy at a bottom of a conduction band of the third oxide layer is equal to that of the second oxide layer.

6. The semiconductor device according to claim 1, wherein the oxide semiconductor layer comprises indium, gallium, and zinc.

7. The semiconductor device according to claim 1, wherein the first oxide layer, the second oxide layer, and the third oxide layer each comprises at least one metal element contained in the oxide semiconductor layer.

8. A semiconductor device comprising:
a first oxide layer over a substrate;
an oxide semiconductor layer over the first oxide layer;
a second oxide layer over the oxide semiconductor layer;
a source electrode and a drain electrode over the second oxide layer;
a third oxide layer in contact with the source electrode and the drain electrode;
a gate insulating layer over the third oxide layer; and
a gate electrode over the gate insulating layer,
wherein energy at a bottom of a conduction band of each of the first oxide layer and the second oxide layer is smaller than energy at a bottom of a conduction band of the oxide semiconductor layer.

9. The semiconductor device according to claim 8,
wherein the third oxide layer is provided over the second oxide layer, the source electrode, and the drain electrode, and
wherein the third oxide layer is in contact with the second oxide layer.

10. The semiconductor device according to claim 8, wherein the energy at the bottom of the conduction band of the first oxide layer is smaller than that of the second oxide layer.

11. The semiconductor device according to claim 8, wherein energy at a bottom of a conduction band of the third oxide layer is smaller than that of the second oxide layer.

12. The semiconductor device according to claim 8, wherein energy at a bottom of a conduction band of the third oxide layer is equal to that of the second oxide layer.

13. The semiconductor device according to claim 8, wherein the oxide semiconductor layer comprises indium, gallium, and zinc.

14. The semiconductor device according to claim 8, wherein the first oxide layer, the second oxide layer, and the third oxide layer each comprises at least one metal element contained in the oxide semiconductor layer.

15. A semiconductor device comprising:
a first gate electrode over a substrate;
a first gate insulating layer over the first gate electrode;
a first oxide layer over the first gate insulating layer;
an oxide semiconductor layer over the first oxide layer;
a second oxide layer over the oxide semiconductor layer;
a source electrode and a drain electrode over the second oxide layer;
a third oxide layer in contact with the source electrode and the drain electrode;
a second gate insulating layer over the third oxide layer; and
a second gate electrode over the second gate insulating layer, wherein energy at a bottom of a conduction band of each of the first oxide layer and the second oxide layer is smaller than energy at a bottom of a conduction band of the oxide semiconductor layer.

16. The semiconductor device according to claims 15,
wherein the third oxide layer is provided over the second oxide layer, the source electrode, and the drain electrode, and
wherein the third oxide layer is in contact with the second oxide layer.

17. The semiconductor device according to claim 15, wherein the energy at the bottom of the conduction band of the first oxide layer is smaller than that of the second oxide layer.

18. The semiconductor device according to claim 15, wherein energy at a bottom of a conduction band of the third oxide layer is smaller than that of the second oxide layer.

19. The semiconductor device according to claim 15, wherein energy at a bottom of a conduction band of the third oxide layer is equal to that of the second oxide layer.

20. The semiconductor device according to claim 15, wherein the oxide semiconductor layer comprises indium, gallium, and zinc.

21. The semiconductor device according to claim 15, wherein the first oxide layer, the second oxide layer, and the third oxide layer each comprises at least one metal element contained in the oxide semiconductor layer.

22. The semiconductor device according to claim 1, wherein the oxide semiconductor layer comprises crystals which are aligned in a direction substantially perpendicular to a top surface of the oxide semiconductor layer.

23. The semiconductor device according to claim 8, wherein the oxide semiconductor layer comprises crystals which are aligned in a direction substantially perpendicular to a top surface of the oxide semiconductor layer.

24. The semiconductor device according to claim 15, wherein the oxide semiconductor layer comprises crystals which are aligned in a direction substantially perpendicular to a top surface of the oxide semiconductor layer.

* * * * *